United States Patent
Bruxvoort et al.

[11] Patent Number: 5,958,794
[45] Date of Patent: Sep. 28, 1999

[54] METHOD OF MODIFYING AN EXPOSED SURFACE OF A SEMICONDUCTOR WAFER

[75] Inventors: Wesley J. Bruxvoort, Woodbury; Scott R. Culler, Burnsville; Kwok-Lun Ho, Woodbury; David A. Kaisaki; Carl R. Kessel, both of St. Paul; Thomas P. Klun, Lakeland; Heather K. Kranz, Blaine; Robert P. Messner, St. Paul; Richard J. Webb, Inver Grove Heights; Julia P. Williams, St. Paul, all of Minn.

[73] Assignee: Minnesota Mining and Manufacturing Company, St. Paul, Minn.

[21] Appl. No.: 08/694,014

[22] Filed: Aug. 8, 1996

Related U.S. Application Data

[63] Continuation-in-part of application No. 08/557,727, Nov. 13, 1995, abandoned
[60] Provisional application No. 60/004,161, Sep. 22, 1995.

[51] Int. Cl.⁶ .................................................. H01L 21/302
[52] U.S. Cl. ............................ 438/692; 216/88; 451/539; 156/345 LP
[58] Field of Search ..................................... 438/692, 633, 438/747, 754, 756; 216/88, 90; 451/41, 532, 921, 539; 156/345 LP

[56] References Cited

U.S. PATENT DOCUMENTS

| | | | |
|---|---|---|---|
| D. 366,365 | 1/1996 | Hoopman | D5/4 |
| 1,910,444 | 5/1933 | Nicholson et al. | |
| 2,115,897 | 5/1938 | Wooddell et al. | 51/188 |
| 2,286,208 | 6/1942 | Kirchner | 51/197 |
| 2,485,295 | 10/1949 | Larson | 206/56 |
| 2,667,435 | 1/1954 | Goepfert et al. | 154/53.5 |
| 2,755,607 | 7/1956 | Haywood | 51/185 |
| 2,888,785 | 6/1959 | Kellican et al. | 51/185 |
| 2,952,951 | 9/1960 | Simpson | 51/193 |
| 3,041,156 | 6/1962 | Rowse et al. | 51/293 |
| 3,188,265 | 6/1965 | Charbonneau et al. | 161/188 |
| 3,324,608 | 6/1967 | Hoenig | 51/395 |

(List continued on next page.)

FOREIGN PATENT DOCUMENTS

| | | | |
|---|---|---|---|
| 0 447 885 A2 | 9/1991 | European Pat. Off. | B24B 13/01 |
| 588055 A2 | 3/1994 | European Pat. Off. | H01L 21/304 |
| 650803 A1 | 5/1994 | European Pat. Off. | B24B 7/24 |
| 616362 A2 | 9/1994 | European Pat. Off. | H01L 21/461 |
| 627281 A2 | 12/1994 | European Pat. Off. | B24D 7/06 |
| 418039 B1 | 1/1995 | European Pat. Off. | B24D 3/20 |

(List continued on next page.)

OTHER PUBLICATIONS

Tomita et al., "A Study for Ultraprecision Processing of Silicon Wafers by Fixed Lapping Stone—A newly developed lapping stone to replace the free abrasive lapping process", *J. Precision Engineering*, 61, 1428–1432 (1995)–translation included.

Tonshoff et al., "Abrasive Machine of Silicon", *Annals of the CIRP*, 39, 621–635 (1990).

*Primary Examiner*—Bruce Breneman
*Assistant Examiner*—Anita Alanko
*Attorney, Agent, or Firm*—Daniel R. Pastirik

[57] ABSTRACT

A method of modifying an exposed surface of a semiconductor wafer that includes the steps of:

(a) contacting the surface with a fixed abrasive article having a three-dimensional textured abrasive surface that includes a plurality of abrasive particles and a binder in the form of a pre-determined pattern; and (b) relatively moving the wafer and the fixed abrasive article to modify said surface of the wafer.

60 Claims, 7 Drawing Sheets

U.S. PATENT DOCUMENTS

| | | | |
|---|---|---|---|
| 3,594,865 | 7/1971 | Erb | 18/5 |
| 3,605,349 | 9/1971 | Anthon | 51/402 |
| 3,849,949 | 11/1974 | Steinhauser et al. | 51/406 |
| 3,875,703 | 4/1975 | Clemente | 51/170 T |
| 3,911,562 | 10/1975 | Youmans | 29/590 |
| 3,916,584 | 11/1975 | Howard et al. | 51/308 |
| 4,138,228 | 2/1979 | Hartfelt et al. | 51/295 |
| 4,314,827 | 2/1982 | Leitheiser et al. | 51/298 |
| 4,509,581 | 4/1985 | McLane et al. | 164/479 |
| 4,563,388 | 1/1986 | Bonk et al. | 428/304.4 |
| 4,623,364 | 11/1986 | Cottringer et al. | 51/309 |
| 4,642,126 | 2/1987 | Zador et al. | 51/295 |
| 4,644,703 | 2/1987 | Kaczmarek et al. | 51/401 |
| 4,652,274 | 3/1987 | Boettcher et al. | 51/298 |
| 4,652,275 | 3/1987 | Bloecher et al. | 51/298 |
| 4,663,890 | 5/1987 | Brandt | 51/283 R |
| 4,671,851 | 6/1987 | Beyer et al. | 156/645 |
| 4,735,632 | 4/1988 | Oxman et al. | 51/295 |
| 4,744,802 | 5/1988 | Schwabel | 51/309 |
| 4,749,617 | 6/1988 | Canty | 428/332 |
| 4,751,138 | 6/1988 | Tumey et al. | 428/323 |
| 4,770,671 | 9/1988 | Monroe et al. | 51/293 |
| 4,773,920 | 9/1988 | Chasman et al. | 51/295 |
| 4,799,939 | 1/1989 | Bloecher et al. | 51/293 |
| 4,879,258 | 11/1989 | Fisher | 437/225 |
| 4,881,951 | 11/1989 | Wood et al. | 51/309 |
| 4,885,332 | 12/1989 | Bilkadi | 524/714 |
| 4,903,440 | 2/1990 | Larson et al. | 51/298 |
| 4,906,523 | 3/1990 | Bilkadi et al. | 428/327 |
| 4,927,432 | 5/1990 | Budinger et al. | 51/298 |
| 4,930,266 | 6/1990 | Calhoun et al. | 51/293 |
| 4,933,234 | 6/1990 | Kobe et al. | 428/336 |
| 4,944,836 | 7/1990 | Beyer et al. | 156/645 |
| 4,959,265 | 9/1990 | Wood et al. | 428/324 |
| 4,974,373 | 12/1990 | Kawashima et al. | 51/295 |
| 4,997,461 | 3/1991 | Markhoff-Matheny et al. | 51/295 |
| 5,009,675 | 4/1991 | Kunz et al. | 51/295 |
| 5,011,508 | 4/1991 | Wald et al. | 51/293 |
| 5,011,513 | 4/1991 | Zador et al. | 51/295 |
| 5,014,468 | 5/1991 | Ravipati et al. | 51/295 |
| 5,015,266 | 5/1991 | Yamamoto | 51/293 |
| 5,020,283 | 6/1991 | Tuttle | 51/209 DL |
| 5,061,294 | 10/1991 | Harmer et al. | 51/295 |
| 5,077,870 | 1/1992 | Melbye et al. | 24/452 |
| 5,085,671 | 2/1992 | Martin et al. | 51/293 |
| 5,104,421 | 4/1992 | Takizawa et al. | 51/295 |
| 5,104,929 | 4/1992 | Bilkadi | 524/847 |
| 5,107,626 | 4/1992 | Mucci | 51/298 R |
| 5,137,542 | 8/1992 | Buchanan et al. | 51/295 |
| 5,141,790 | 8/1992 | Calhoun et al. | 428/40 |
| 5,152,917 | 10/1992 | Pieper et al. | 51/295 |
| 5,174,795 | 12/1992 | Wiand | 51/295 |
| 5,177,908 | 1/1993 | Tuttle | 51/283 |
| 5,197,999 | 3/1993 | Thomas | 51/298 |
| 5,199,227 | 4/1993 | Ohishi | 51/395 |
| 5,203,884 | 4/1993 | Buchanan et al. | 51/295 |
| 5,213,591 | 5/1993 | Celikkaya et al. | 51/293 |
| 5,219,462 | 6/1993 | Bruxvoort et al. | 51/293 |
| 5,232,875 | 8/1993 | Tuttle et al. | 437/225 |
| 5,236,472 | 8/1993 | Kirk et al. | 51/298 |
| 5,254,194 | 10/1993 | Ott et al. | 156/176 |
| 5,256,170 | 10/1993 | Harmer et al. | 51/293 |
| 5,304,223 | 4/1994 | Pieper et al. | 51/293 |
| 5,307,593 | 5/1994 | Lucker et al. | 51/281 SF |
| 5,320,706 | 6/1994 | Blackwell | 156/636 |
| 5,335,453 | 8/1994 | Baldy et al. | 51/67 |
| 5,342,419 | 8/1994 | Hibbard | 51/308 |
| 5,368,618 | 11/1994 | Masmar et al. | 51/295 |
| 5,368,619 | 11/1994 | Culler | 51/308 |
| 5,370,718 | 12/1994 | Terazawa et al. | 51/295 |
| 5,378,251 | 1/1995 | Culler et al. | 51/295 |
| 5,378,252 | 1/1995 | Follensbee | 51/298 |
| 5,391,210 | 2/1995 | Bilkadi et al. | 51/298 |
| 5,417,725 | 5/1995 | Graves | 44/388 |
| 5,421,768 | 6/1995 | Fujiwara et al. | 451/283 |
| 5,422,316 | 6/1995 | Desai et al. | 437/228 |
| 5,424,224 | 6/1995 | Allen et al. | 437/10 |
| 5,435,816 | 7/1995 | Spurgeon et al. | 51/295 |
| 5,437,754 | 8/1995 | Calhoun | 156/231 |
| 5,441,598 | 8/1995 | Yu et al. | 156/645.1 |
| 5,445,996 | 8/1995 | Kodera et al. | 437/225 |
| 5,453,312 | 9/1995 | Haas et al. | 428/143 |
| 5,454,844 | 10/1995 | Hibbard et al. | 51/295 |
| 5,470,368 | 11/1995 | Culler | 51/298 |
| 5,476,416 | 12/1995 | Hasegawa et al. | 451/168 |
| 5,489,235 | 2/1996 | Gagliardi et al. | 451/527 |
| 5,490,808 | 2/1996 | Jantschek et al. | 451/59 |
| 5,500,273 | 3/1996 | Holmes et al. | 428/147 |
| 5,525,100 | 6/1996 | Kelly et al. | 451/527 |
| 5,527,368 | 6/1996 | Supkis et al. | 51/298 |
| 5,607,341 | 3/1997 | Leach | 451/41 |
| 5,607,346 | 3/1997 | Wilson et al. | 451/540 |
| 5,607,488 | 3/1997 | Wiand | 51/295 |
| 5,609,517 | 3/1997 | Lofaro | 451/529 |
| 5,624,303 | 4/1997 | Robinson | 451/285 |
| 5,643,044 | 7/1997 | Lund | 451/5 |
| 5,645,682 | 7/1997 | Skrovan | 156/636.1 |
| 5,645,736 | 7/1997 | Allman | 216/89 |
| 5,649,855 | 7/1997 | Chikaki | 451/290 |
| 5,782,675 | 7/1998 | Southwick | 451/56 |
| B1 4,773,920 | 5/1995 | Chasman et al. | 51/295 |

FOREIGN PATENT DOCUMENTS

| | | | |
|---|---|---|---|
| 646436 A1 | 4/1995 | European Pat. Off. | B24B 9/06 |
| 650807 A1 | 5/1995 | European Pat. Off. | B24D 3/28 |
| 654323 A1 | 5/1995 | European Pat. Off. | B24D 3/34 |
| 658400 A1 | 6/1995 | European Pat. Off. | B24B 37/04 |
| 685299 A1 | 12/1995 | European Pat. Off. | B24B 37/04 |
| 0 737 549 | 10/1996 | European Pat. Off. | B24D 3/00 |
| 0 745 456 A1 | 12/1996 | European Pat. Off. | B24B 9/06 |
| 63-235942 | 9/1988 | Japan | G03D 9/00 |
| 4-159084 | 6/1992 | Japan | B24D 1/00 |
| 7-124861 | 5/1995 | Japan | B24B 37/04 |
| 8-64562 | 3/1996 | Japan . | |
| WO 93/12911 | 7/1993 | WIPO | B24D 11/00 |
| WO 94/04599 | 3/1994 | WIPO | C08J 5/14 |
| WO 94/20264 | 9/1994 | WIPO | B24D 3/28 |
| WO 94/27780 | 12/1994 | WIPO | B24B 1/04 |
| WO95/01241 | 1/1995 | WIPO | B24D 3/28 |
| WO 95/07797 | 3/1995 | WIPO | B24D 11/00 |
| WO 95/11773 | 5/1995 | WIPO | B24D 3/28 |
| WO 95/22436 | 8/1995 | WIPO | B24D 11/00 |

METHOD OF MODIFYING AN EXPOSED SURFACE OF A SEMICONDUCTOR WAFER

CROSS-REFERENCE TO RELATED APPLICATION

This application is a continuation in part of U.S. Ser. No. 08/557,727, filed Nov. 13, 1995, now abandoned, which claims priority to U.S. Provisional Patent Application No. 60/004,161, filed Sep. 22, 1995, both of which are hereby incorporated by reference in its entirety.

BACKGROUND OF THE INVENTION

1. Field of the Invention

This invention relates to modifying an exposed surface of a semiconductor wafer.

2. Description of the Related Art

In the course of integrated circuit manufacture, a semiconductor wafer typically undergoes numerous processing steps, including deposition, patterning, and etching steps. Additional details on how semiconductor wafers are manufactured can be found in the article "Abrasive Machining of Silicon" by Tonshoff, H. K.; Scheiden, W. V.; Inasaki, I.; Koning. W.; Spur, G. published in the *Annals of the International Institution for Production Engineering Research* Volume 39/2/1990, pages 621 to 635. At each step in the process, it is often desirable to achieve a pre-determined level of surface "planarity," "uniformity," and/or "roughness." It is also desirable to minimize surface defects such as pits and scratches. Such surface irregularities may affect the performance of the final semiconductor device and/or create problems during subsequent processing steps.

One accepted method of reducing surface irregularities is to treat the wafer surface with a slurry containing a plurality of loose abrasive particles dispersed in a liquid and a polishing pad. One problem with such slurries, however, is that the process must be carefully monitored in order to achieve the desired wafer topography. Another problem is that the slurries generate a large number of particles which must be removed and disposed following wafer treatment.

SUMMARY OF THE INVENTION

In a first aspect, the invention features a method of modifying an exposed surface of a semiconductor wafer that includes the steps of:

(a) contacting the surface with a three-dimensional, textured, fixed abrasive article that includes a plurality of abrasive particles and a binder in the form of a pre-determined pattern; and (b) relatively moving the wafer and the fixed abrasive article to modify said surface of the wafer.

The three-dimensional, textured, fixed abrasive article may be "conditioned" either before but preferably simultaneously with step (b) or after one or more uses to remove any surface debris and/or the outermost portion of its surface.

In preferred embodiments, the fixed abrasive article is secured to a sub pad. The contact pressure between the wafer surface and the abrasive article (i.e., the total wafer backside pressure) depends at least in part on the particular abrasive article. In general, however, the contact pressure does not preferably exceed about 10 psi. The contacting step preferably takes place in the presence of a liquid. Suitable liquids have a pH of at least about 5 (e.g., from about 5 to about 8 or from about 8 to about 13). A preferred liquid includes water.

The semiconductor wafer may be in the form of a blank wafer (i.e., a wafer prior to processing for the purpose of adding topographical features such as metallized and insulating areas) or a processed wafer (i.e., a wafer after it has been subjected to one or more processing steps to add topographical features to the wafer surface). The term "processed wafer" includes, but it is not limited to, "blanket" wafers in which the entire exposed surface of the wafer is made of the same material (e.g., silicon dioxide). One area in which the method according to the invention is useful is where the exposed surface of the semiconductor wafer includes one or more metal oxide-containing areas, e.g., silicon dioxide-containing areas.

It is generally desired to modify the semiconductor wafer surface to achieve a surface that is more "planar" and/or more "uniform" and/or less "rough" than the wafer surface prior to treatment. The particular degree of "planarity," "roughness," and/or "uniformity" desired will vary depending upon the individual wafer and the application for which it is intended, as well as the nature of any subsequent processing steps to which the wafer may be subjected. In general, however, there are several preferred methods of measuring the degree of "planarity," "roughness," and/or "uniformity."

One preferred method is to measure the Ra value of the wafer surface (which provides a measure of "roughness"). The wafer surface is preferably modified to yield an Ra value of no greater than about 20 Angstroms, more preferably no greater than about 15 Angstroms, and even more preferably no greater than about 10 Angstroms.

The average cut rate depends upon the composition and topography of the particular wafer surface being treated with the abrasive article. In the case of metal oxide-containing surfaces (e.g., silicon dioxide-containing surfaces), average cut rates of at least about 500, 1,000, 1,500, or 2,000 Angstroms/minute may successfully be achieved.

The size of the abrasive particles depends in part upon the particular composition of the abrasive article and any liquid used during the process. In general, however, abrasive articles in which the abrasive particles have an average particle size no greater than about 5 micrometers are preferred. Even more preferred are abrasive articles in which the average abrasive particle size is no greater than 1 micrometer, in particular no greater than about 0.5 micrometer.

To avoid harming the surface of the semiconductor wafer (particularly where the wafer surface is a metal oxide-containing surface such as a silicon dioxide-containing surface), the abrasive particles may have a Mohs hardness value no greater than about 8. Examples of preferred abrasive particles include metal oxide particles such as ceria. The abrasive particles may be used in combination with filler particles. Examples of preferred filler particles include carbonates (e.g., calcium carbonate), silicates (e.g., magnesium silicate, aluminum silicate, calcium silicate, and combinations thereof), and combinations thereof. Plastic filler particles may also be used.

Preferred abrasive articles for use in the method according to the invention include a binder in the form of a thermoset organic polymer resin. Examples of preferred resins include acrylate and methacrylate polymer resins. Another type of suitable binder is a ceramer binder that includes colloidal metal oxide particles in an organic polymer resin.

The binder preferably includes a plasticizer in an amount sufficient to increase the erodibility of the abrasive article relative to the same abrasive article in the absence of the plasticizer. Preferably, the binder includes at least about 25% by weight of the plasticizer (more preferably, between about 40% and about 75% by weight) based upon the combined weight of the plasticizer and the resin. Preferred plasticizers are phthalate esters, as well as derivatives thereof.

One example of a preferred abrasive article features a backing having a surface that includes the abrasive particles and the binder in the form of an abrasive coating. The backing preferably is a polymer film. The backing preferably is provided with a primer for enhancing adhesion between the abrasive coating and the backing.

Another example of a preferred abrasive article is one which is erodible.

Also preferred are abrasive articles that include a plurality of abrasive composites arranged in the form of a pre-determined pattern. At least some of the composites may be precisely shaped abrasive composites. All of the composites preferably have substantially the same height. The composite height preferably is no greater than about 250 microns. Moreover, the abrasive article preferably includes at least about 1,200 composites per square centimeter of surface area.

Preferably, substantially all of the abrasive composites have substantially the same shape. Examples of representative shapes include cubic, cylindrical, prismatic, rectangular, pyramidal, truncated pyramidal, conical, truncated conical, cross, post-like with a flat top surface, and hemispherical shapes, as well as combinations thereof.

The abrasive composites are preferably spaced apart from each other. For example, they may be provided in the form of elongated ridges spaced apart from each other (such that a channel forms between a pair of composites). Where the abrasive article features a backing having a surface that includes the abrasive composites in the form of a coating, each of the composites preferably has substantially the same orientation relative to the backing.

In a second aspect, the invention features a method of modifying an exposed surface of a semiconductor wafer that includes the steps of:

(a) contacting the surface with a three-dimensional, textured, fixed abrasive article that includes a plurality of precisely shaped abrasive composites and a binder; and (b) relatively moving the wafer and the fixed abrasive article to modify said surface of the wafer.

In a third aspect, the invention features a method of modifying an exposed surface of a semiconductor wafer that includes the steps of:

(a) contacting the surface with a three dimensional, textured, fixed abrasive article that includes a plurality of abrasive particles and a binder that includes a resin and a plasticizer in an amount sufficient to increase the erodibility of the abrasive surface relative to the same abrasive surface in the absence of the plasticizer; and (b) relatively moving the wafer and the fixed abrasive article to modify the surface of the wafer. The binder preferably includes at least 25% by weight of the plasticizer (more preferably between about 40% and about 75% by weight) based upon the combined weight of the plasticizer and the resin.

In a fourth aspect, the invention features a method of modifying an exposed surface of a semiconductor wafer comprising a metal oxide comprising the steps of:

(a) contacting the surface with a three-dimensional, textured, erodible, fixed abrasive article comprising a plurality of abrasive particles and a binder arranged in the form of a pre-determined pattern; and (b) relatively moving the wafer and the fixed abrasive article to modify the surface of the wafer.

Throughout this application, the following definitions apply:

A "fixed" abrasive article is an integral abrasive article that is substantially free of unattached abrasive particles except as may be generated during the planarization process.

A "three-dimensional" abrasive article is an abrasive article having numerous abrasive particles extending throughout at least a portion of its thickness such that removing some of the particles during planarization exposes additional abrasive particles capable of performing the planarization function.

A "textured" abrasive article is an abrasive article having raised portions and recessed portions in which at least the raised portions contain abrasive particles and binder.

An "erodible" abrasive article is an abrasive article that breaks down under use conditions in a controlled manner.

An "abrasive agglomerate" refers to a plurality of abrasive particles bonded together in the form of a unitary particulate mass.

An "abrasive composite" refers to one of a plurality of shaped bodies which collectively provide a textured, three-dimensional abrasive article comprising abrasive particles and a binder. The abrasive particles may be in the form of abrasive agglomerates.

A "precisely shaped abrasive composite" refers to an abrasive composite having a molded shape that is the inverse of the mold cavity which is retained after the composite has been removed from the mold. Preferably, the composite is substantially free of abrasive particles protruding beyond the exposed surface of the shape before the abrasive article has been used, as described in U.S. Pat. No. 5,152,917 (Pieper, et al.), incorporated herein by reference.

The invention provides a relatively low cost, readily controllable method for improving the surface characteristics of a semiconductor wafer at various stages during fabrication. Because the abrasive article is designed to be relatively long-lasting, a single abrasive article may be used in a number of successive operations.

Other features, advantages, and constructs of the invention will be better understood from the following description of figures and the preferred embodiments of the present invention.

DETAILED DESCRIPTION OF THE INVENTION

Semiconductor Wafer Structure

Figure 1:
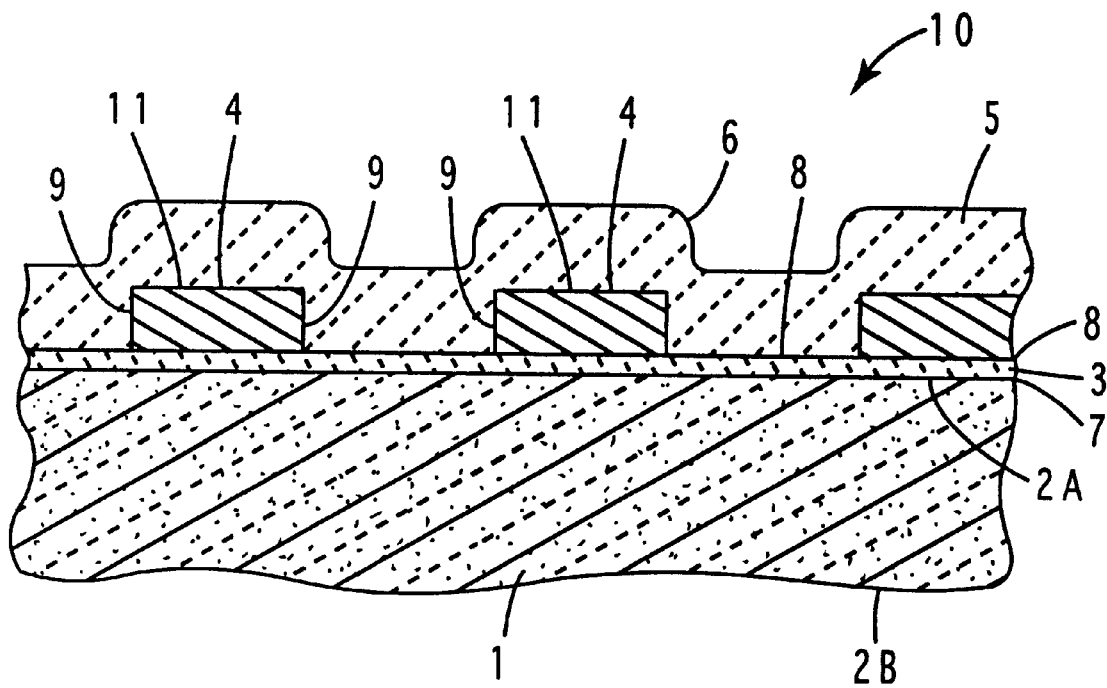
FIG. 1 is an enlarged schematic cross sectional view of a portion of a semiconductor wafer prior to surface modification.

FIG. 1 is a simplified view of a representative semiconductor wafer 10 suitable for use in the process according to the invention. For the sake of clarity, well-known features such as doped regions, active devices, epitaxial layers, carrier and field oxide layers have been omitted. Wafer 10 has a semiconductor base 1, which has a front surface 2A and a back surface 2B. The semiconductor base can be made from any appropriate material such as single crystal silicon, gallium arsenide, and other semiconductor materials known in the art. Over front surface 2A is dielectric layer 3; this dielectric layer 3 typically contains silicon dioxide. Other suitable dielectric layers are also contemplated.

Dielectric layer 3 has a front surface 8 and a back surface 7. Over the front surface of dielectric layer 3 are numerous discrete first metal interconnects 4 (e.g., metal conductor blocks). Each of these first metal interconnects 4 has side walls 9 and top wall 11. Each first metal interconnect 4 can be made, for example, from aluminum, copper, aluminum copper alloy, tungsten, and the like. These metal interconnects are typically made by first depositing a continuous layer of the metal on dielectric layer 3. The metal is then etched and the excess metal removed to form the desired pattern of metal interconnects. Afterwards, a first insulating layer 5 is applied over top wall 11 of each first metal interconnect 4, between first metal interconnects 4 and over the front surface 8 of dielectric layer 3. First insulating layer 5 is typically a metal oxide such as silicon dioxide, BPSG (borophosphosilicate glass), PSG (phosphosilicate glass), or combinations thereof. The resulting insulating layer 5 often has a front surface 6 that may not be as "planar" and/or "uniform" as desired.

Figure 2:
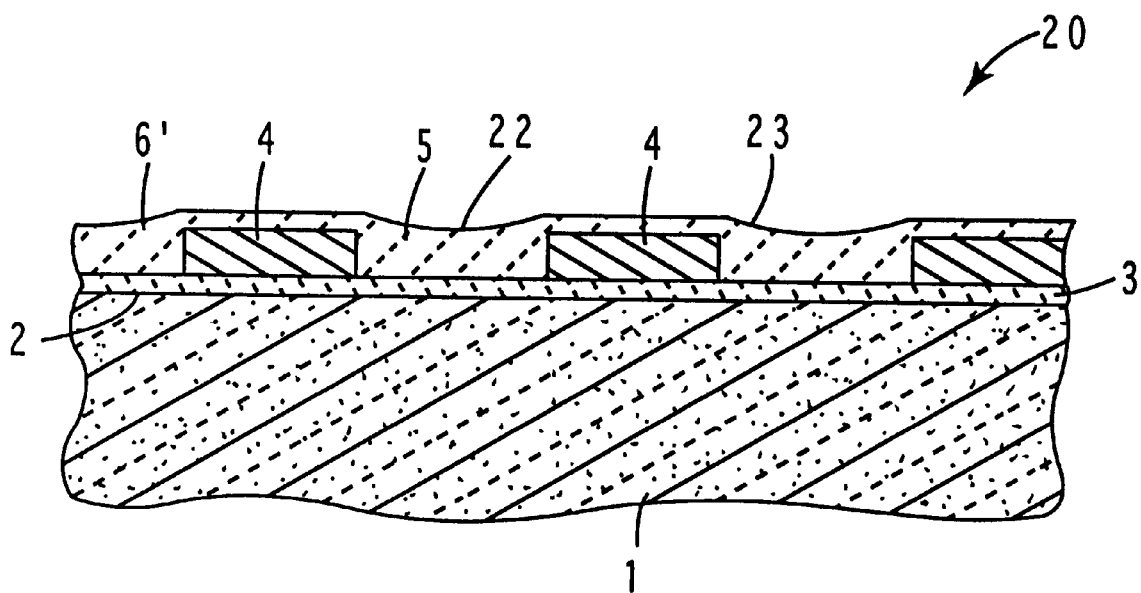
FIG. 2 is an enlarged schematic cross sectional view of a portion of a semiconductor wafer after surface modification.

Before an additional layer of circuitry can be applied via a photolithography process, it is desired to treat surface 6 of the first insulating layer to achieve the desired degree of "planarity" and/or "uniformity;" the particular degree will depend on many factors, including the individual wafer and the application for which it is intended, as well as the nature of any subsequent processing steps to which the wafer may be subjected. For the sake of simplicity, throughout the remainder of this application this process will be referred to as "planarization". FIG. 2 illustrates the wafer shown in FIG. 1 after planarization (depicted in FIG. 2 as semiconductor wafer 20). As a result of planarization, the front surface 22 of insulating layer 5 should be sufficiently planar such that when the subsequent photolithography process is used to create a new circuit design, the critical dimension features can be resolved. These critical dimension features form the circuitry design.

With respect to the wafer shown in FIG. 1, planarization occurs on first insulating layer 5; however, other layers may be planarized in the course of the wafer fabrication process. In fact, after each additional layer of insulating material is applied over the metal interconnects, planarization may be needed. In fact, there may be anywhere from one to ten, or even greater than ten layers of circuitry, metal interconnects and metal oxide insulating layers. In addition, the blank wafer may need to be planarized as well.

Semiconductor Wafer Parameters

There are several well-known properties that can be evaluated using art-recognized techniques to determine if the semiconductor wafer has been sufficiently planarized. These properties include flatness (measured in terms of the Total Indicated Runout (TIR)), surface finish (measured in terms of the average roughness (Ra)), and dishing (measured in terms of the planarization ratio). The number and type of defects on the wafer surface can also be evaluated.

Total Indicated Runout (TIR)

The TIR is a measure of the "flatness" of the wafer within a specified region of the wafer. Since photolithography is used to create the circuitry pattern on the front face of the wafer, it is critical that the flatness of the wafer surface be less than the depth of focus of the machine generating the electromagnetic radiation used to create the circuitry pattern. A specified region or area in the semiconductor is exposed in a single exposure step. Thus, one region of the semiconductor wafer may have a different flatness relative to another region of the semiconductor wafer because these two different regions correspond to two different exposure steps. Thus in measuring the flatness of the semiconductor wafer, this measurement is taken over a specified region.

Figure 13:
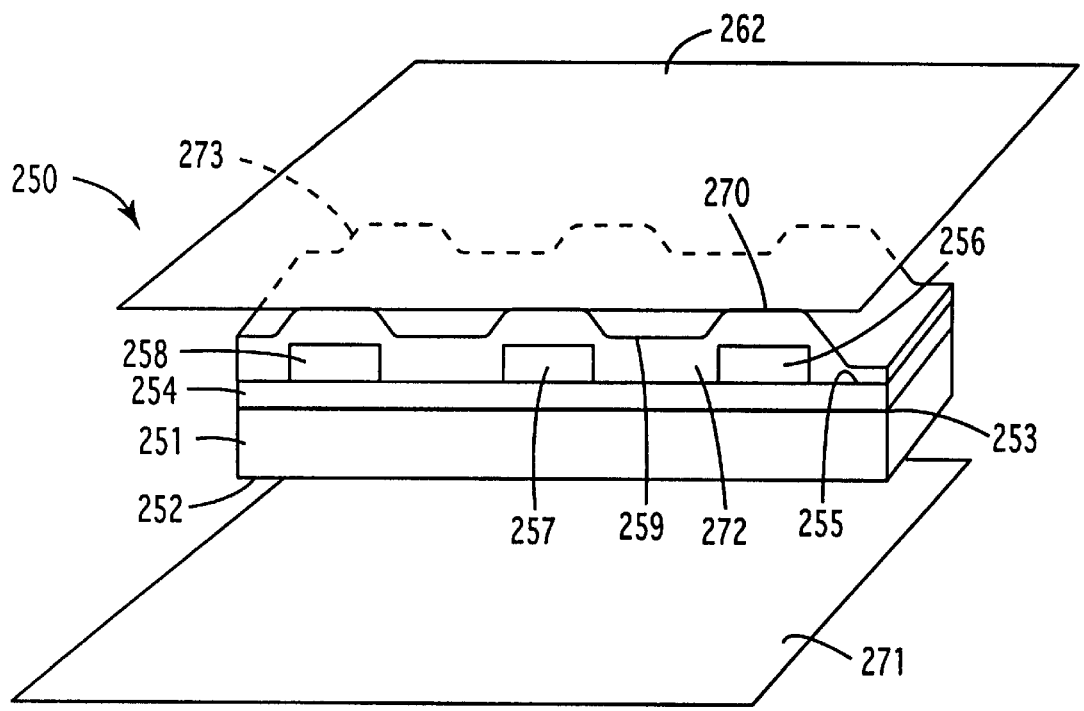
FIG. 13 is an enlarged isometric view of a semiconductor wafer showing reference planes.

FIG. 13 illustrates a region of a semiconductor wafer 250 prior to planarization. The structure of wafer 250 is similar to that of wafer 10 shown in FIG. 1. Specifically, semiconductor wafer 250 comprises semiconductor base 251 having front surface 253 and back surface 252. Over front surface 253 of semiconductor base 251 is dielectric layer 254 having front surface 255. Over front surface 255 of dielectric layer 254 there are plurality of metal interconnects 256, 257 and 258. Insulating layer 272 is applied over and in between metal interconnects 256, 257 and 258. As a result of the application of insulating layer 272, the outermost surface of semiconductor wafer 250 may not be as "planar" and/or "uniform" as desired.

Figure 14:
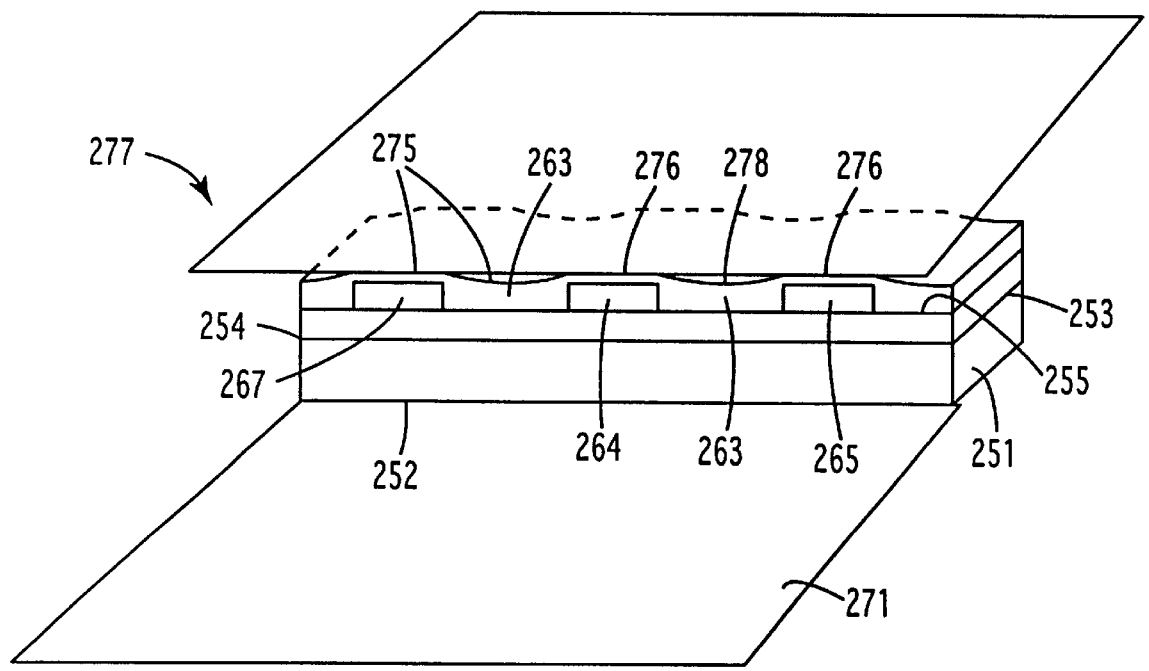
FIG. 14 is an enlarged isometric view of a semiconductor wafer showing reference planes.

One useful way of envisioning the degree of "planarity" and/or "uniformity," as manifested in the TIR, is through a series of imaginary reference planes, as shown in FIGS. 13 and 14. Referring to FIG. 13, there is shown a first reference plane 271 that is formed from back surface 252 of semiconductor base 251. There is first imaginary plane 262 that intersects or touches the outermost portion or highest point 270 of outermost surface 273 of semiconductor wafer 250. Lowest point 259 is the bottommost area on outermost portion 273 of semiconductor wafer. Prior to planarization, the distance between first imaginary plane 262 and lowest point 259 is typically greater than about 0.5 micrometers. In some instances, the distance between first imaginary plane 262 and lowest point 259 (i.e., the TIR) is greater than 0.5 micrometer, sometimes greater than about 0.8 micrometer or even greater than about 1 to 2 micrometers. The actual value of this distance depends in part upon the design and fabrication of the semiconductor wafer.

FIG. 14 illustrates the wafer shown in FIG. 13 following planarization (and thus is similar to the wafer shown in FIG. 2). Planarized semiconductor wafer 277 comprises semiconductor base 251 having front surface 253 and back surface 252. Over front surface 253 of semiconductor base 251 is dielectric layer 254 having front surface 255. Over front surface 255 of dielectric layer 254 there are plurality of metal interconnects 265, 264 and 267. Between these metal interconnects is insulating layer 263. As a result of planarization, outermost surface 275 (which includes high points 276 and low points 278) of semiconductor wafer 277 has become more level and uniform.

The extent of planarization can be envisioned through the use of reference planes shown in FIG. 14. There is first reference plane 271 that is formed from back surface 252 of semiconductor base 251. There is second imaginary plane 268 that intersects or touches the outermost portion or highest point 276 of outermost surface 275 of semiconductor wafer 277. Lowest point 278 is the bottommost area on outermost portion 275 of semiconductor wafer 277. As a result of planarization, it is preferred that for a specific region of the wafer, the distance between second imaginary plane 268 and lowest point 278 (i.e., the TIR) over this region is less than about 5000 Angstroms, preferably no more than about 1500 Angstroms. The particular TIR value will depend upon the individual wafer and the application for which it is intended, as well as the nature of any subsequent processing steps to which the wafer may be subjected. In general, prior to planarization, the average TIR of a metal oxide-containing wafer surface is greater than about 2500 Angstroms, usually in the range of about 1.0 to 1.2 micrometers. After planarization, the average TIR is preferably less than about 2500 Angstroms, more preferably less than about 2000 Angstroms, and even more preferably less than about 1500 Angstroms. The term "average TIR" means that there are ten TIR readings taken over the specified area which are added together and divided by 10 to calculate the average TIR.

It is preferred that the region over which the TIR is evaluated be 3 mm by 3 mm square, preferably 5 mm by 5 mm square, more preferably 15 mm by 15 mm square, and even more preferably 30 mm by 30 mm square. The TIR value is readily measured using a profilometer, e.g., a "Model P-2 Profilometer" commercially available from Tencor.

Surface Finish

The surface finish of the wafer may also be evaluated. A well-known quantity, Ra, provides a measure of the surface finish.

Ra is typically measured using an interferometer such as a Wyko TOPO-3D Interferometer, purchased from Wyko Corp. Tucson, Ariz. or a TENCOR profilometer. After planarization, the planarized surface preferably has an Ra value less than about 20 Angstroms, more preferably less than about 15 Angstroms and most preferably less than about 10 Angstroms. The term average means that there are at least ten Ra readings taken and these ten Ra values are averaged together to calculate the average Ra value.

Dishing

Another critical parameter pertains to dishing. Referring to FIG. 2, dishing refers to the phenomenon where some of first insulating layer 5 is removed in the area between the first metal interconnects 4, resulting in the overall height 23 of first insulating layer 5 being reduced. As is well-known in the art, the amount of dishing is indicated by the planarization ratio, which compares the amount of material removed from desired regions to the amount of material from regions where it is not desired.

Two instruments are used to measure the planarization ratio. A profilometer is used to measure TIR before and after planarization. An optical interference/absorption instrument is used to measure the thickness of the oxide layer in areas between the metal interconnects before and after planarization. The amount removed from each area is determined and the ratio calculated.

The particular value for the planarization ratio will depend upon the individual wafer and the application for which it is intended, as well as the nature of any subsequent processing steps to which the wafer may be subjected. In general, the planarization ratio should be less than 2. Typically, suitable ratios range between about 1.0 to about 2.0, preferably between about 1.0 to about 1.6, more preferably about 1.0 to about 1.4, and most preferably between about 1.0 to about 1.2. A planarization ratio of one is typically preferred because this indicates that there is effectively no dishing.

Defects

Another important parameter to determine if a semiconductor wafer has been sufficiently planarized is the number of defects remaining in the treated wafer surface following planarization. One type of defect is known in the industry as a "pit" or an undesirable depression in the wafer surface. Another defect is known in the industry as a "dig" or "skid," and represents a series of undesirable coarse scratches that are close together.

The number and type of defects can be determined using art-recognized techniques, including laser light scattering. In general, it is desired to minimize the number of defects.

Apparatus

Figure 3:
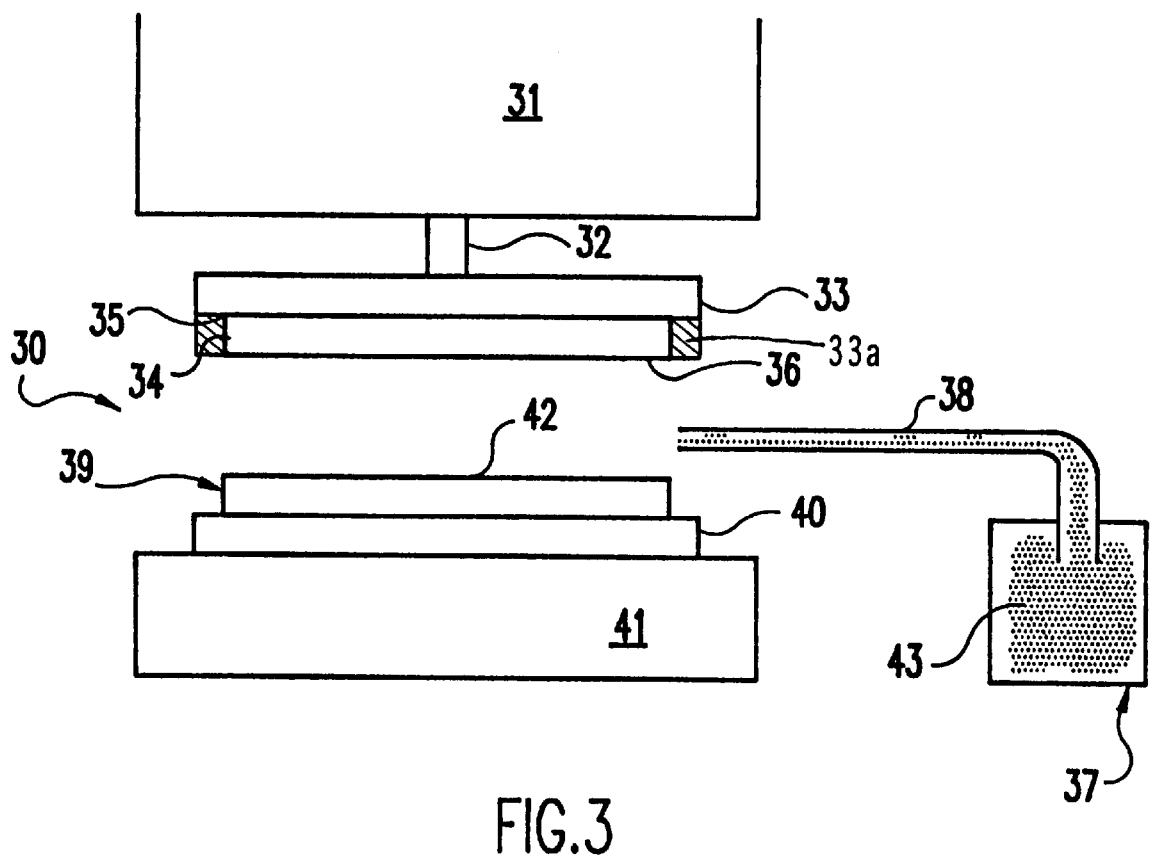
FIG. 3 is a partial side schematic view of one apparatus for modifying the surface of a semiconductor wafer.

FIG. 3 illustrates a very simplified apparatus for planarizing semiconductor wafers useful in the process according to the invention. This type of apparatus and numerous variations and other types of apparatus are well known in the art for use with polishing pads and loose abrasive slurries. An example of a suitable commercially available apparatus is a CMP machine available from IPEC/WESTECH of Phoenix, Ariz.

As shown in FIG. 3, apparatus 30 comprises head unit 31 that is connected to a motor (not shown). Chuck 32 extends from head unit 31; an example of such a chuck is a gimbal chuck. Chuck 32 preferably is designed to accommodate different forces and pivot so that the abrasive article can still provide the desired surface finish and flatness on the wafer. However, the chuck may or may not allow the wafer to pivot during planarization.

At the end of chuck 31 is wafer holder 33. The purpose of wafer holder 33 is to help secure semiconductor wafer 34 to head unit 31 and also prevent the semiconductor wafer from becoming dislodged during planarization. The wafer holder is designed to accommodate the semiconductor wafer, and may be circular, oval, rectangular, square, octagonal, hexagonal, pentagonal or the like.

In some instances, the wafer holder consists of two parts, a retaining ring and a wafer support pad. The retaining ring (which is optional) may be a generally circular device that fits around the periphery of the semiconductor wafer. The wafer support pad may be fabricated from one or more elements, e.g., polyurethane foam.

In the embodiment shown in FIG. 3, wafer holder 33 extends alongside of semiconductor wafer 34 at ring portion 33a. Ring portion 33a (which is optional) may be a separate piece or may be integral with holder 33. In some instances, wafer holder 33 will not extend beyond semiconductor wafer 34 such that wafer holder 33 does not touch or contact abrasive coating 42. In other instances, wafer holder 33 does extend beyond semiconductor wafer 34 such that the wafer holder does touch or contact the abrasive coating, in which case the wafer holder may influence the characteristics of the abrasive coating. For example, wafer holder 33 may "condition" the abrasive coating and remove the outermost portion of the abrasive coating during planarization.

The wafer holder or retaining ring can be made out of any material that will allow the fixed abrasive article to impart the desired degree of planarization to the wafer. Examples of suitable materials include polymeric materials. For example, the wafer holder or retaining ring may be made from a composite material such as a particulate-filled solidified thermoset resin or a substrate impregnated with a solidified thermoset resin. If the particulate fillers contact the wafer surface, they should be softer than the material forming the surface being treated. In the case of metal oxide surfaces (e.g., silicon dioxide surface), the particulate fillers preferably should have a Mohs hardness less than about six. Examples of suitable fillers for this purpose include materials such as talc, gypsum, calcium carbonate, fluorite apatite and the like. Also suitable in the case of metal oxide-containing surfaces are polymeric filler particles, e.g., particles made from polyester, polycarbonate, polyamide, polyolefin, phenolic resin, and the like.

Examples of suitable thermosetting resins for use in the particulate-filled composite include phenolic resins, epoxy resins, acrylate resins, urea-formaldehyde resins, melamine formaldehyde resins and the like. It is also feasible to impregnate a cloth or a nonwoven substrate with the thermosetting resin and solidify the thermosetting resin to form a substrate impregnated with a solidified thermoset resin. Examples of such cloth include cotton cloth, nylon cloth, and polyester cloth. The substrate may also be a nonwoven substrate such as a paper substrate.

Examples of suitable commercially available wafer holders include those sold under the designations "G-10", "NTA" and "0500-RB" by Rodel.

Referring to FIG. 3, wafer holder 33 will typically have a diameter between about 10 to about 500 mm, preferably between about 15 to about 250 mm, more preferably between about 20 to about 300 mm. Wafer holder 33 may contain one or more semiconductor wafers. In some instances there may be between 1 and 40 semiconductor wafers per wafer holder.

The speed at which wafer holder 33 rotates will depend on the particular apparatus, planarization conditions, abrasive article, and the desired planarization criteria. In general, however, wafer holder 33 rotates between about 2 to about 1,000 rpm, typically between about 5 to about 500 rpm, preferably between about 10 to about 300 rpm and more preferably between about 30 to about 150 rpm. If the wafer holder rotates too slowly or too fast, then the desired cut rate may not be achieved.

Wafer holder 33 may rotate in a circular fashion, spiral fashion, a non-uniform manner, elliptical fashion as a figure eight, corkscrew, or a random motion fashion. The preferred mode is for the wafer holder to rotate in a circular fashion. Alternatively, as wafer holder 33 rotates, the wafer holder may oscillate or vibrate.

The abrasive article will typically have a diameter between about 10 to 200 cm, preferably between about 20 to 150 cm, more preferably between about 25 to 100 cm. The abrasive article may rotate between about 5 to 10,000 rpm, typically between about 10 to 1000 rpm and preferably between about 10 to 250 rpm. It is preferred that both the semiconductor wafer and the fixed abrasive article rotate in the same direction. However, the semiconductor wafer and the fixed abrasive article may also rotate in opposite directions.

Semiconductor wafer 34 having outer surface 36 that will be planarized is secured to wafer holder 33 such that the wafer is held substantially uniformly against the wafer holder using, e.g., mechanical means (e.g., clamping), vacuum, or an adhesive means (e.g. a pressure sensitive adhesive or wax). Interface 35 between semiconductor wafer 34 and wafer holder 33 preferably should be relatively flat and uniform to ensure that the desired degree of planarization is achieved.

Apparatus 30 also has base unit 41 which holds abrasive article 39 having abrasive 42. Base unit 41 is usually made from a rigid material such as metal. Sub pad 40 is connected to base unit 41 and is attached to abrasive article 39. In general, the sub pad should be resilient such that during planarization, the fixed abrasive article will planarize the entire semiconductor wafer surface. It is preferred that sub pad be made from a conformable material such as a polyurethane foam.

A preferred embodiment comprises: a fixed abrasive article comprising a backing on which is disposed a three-dimensional textured abrasive coating that includes a plurality of abrasive particles and a binder in the form of a pre-determined pattern and a subpad generally coextensive with the backing of the fixed abrasive article. The subpad comprises: at least one resilient element having a Young's Modulus of less than about 100 MPa and a remaining stress in compression of at least about 60%; and at least one rigid element generally coextensive with and interposed between the resilient element and the backing of the fixed abrasive article, wherein the rigid element has a Young's Modulus that is greater than that of the resilient element and is at least about 100 MPa. Suitable subpad constructions are disclosed in U.S. patent application Ser. No. 08/694,357 Attny Docket No. 52743USA8A, filed on even date herewith entitled "Abrasive Construction for Semiconductor Wafer Modification", now U.S. Pat. No. 5,692,950 which is incorporated herein by reference.

The means used to attach the abrasive article to the sub pad preferably holds the abrasive article flat and rigid during planarization. The preferred attachment means is a pressure sensitive adhesive (e.g., in the form of a film or tape). Representative examples of pressure sensitive adhesives suitable for this purpose include those based on latex crepe, rosin, acrylic polymers and copolymers (e.g., polybutylacrylate and other polyacrylate esters), vinyl ethers (e.g., polyvinyl n-butyl ether), alkyd adhesives, rubber adhesives (e.g., natural rubber, synthetic rubber, chlorinated rubber), and mixtures thereof. One preferred pressure sensitive adhesive is an isooctylacrylate:acrylic acid copolymer. The pressure sensitive adhesive is preferably laminated or coated onto the back side of the abrasive article using conventional techniques.

In one preferred embodiment, the abrasive article is a coated abrasive article having of a backing which supports an abrasive coating on one surface, a pressure sensitive adhesive coating on the opposite back surface, wherein the pressure sensitive adhesive coating comprises two layers:

i) a first layer that comprises a pressure sensitive adhesive coating, with the first layer having an inner surface in direct contact with the back surface of the coated abrasive backing and an opposite outer surface, and ii) a second layer over the outer surface of the first layer, comprising clumps of particles substantially uniformly distributed over and protruding from the first layer, at least the outermost area of these clumps of particles being free of the pressure sensitive adhesive. This type of pressure sensitive adhesive coating is further illustrated in U.S. Pat. No. 5,141,790 incorporated herein by reference.

In many instances, the abrasive article is in the form of a disc having a diameter typically greater than 25 cm, often greater than 36 cm and sometimes greater than 50 cm in diameter. With these large diameter discs, it is often difficult to accurately place the abrasive disc on the sub pad. This layered pressure sensitive adhesive construction provides a means to allow the disc to "slide" around until the proper position is found, whereupon additional pressure is applied and the abrasive disc is secured to the sub pad.

The abrasive article may also be secured to the sub pad using a hook and loop type attachment system. The loop fabric may be on the back side of the abrasive article and the hooks on the sub pad. Alternatively, the hooks may be on the back side of the abrasive article and the loops on the sub pad. The hook and loop type attachment system is further described in U.S. Pat. Nos. 4,609,581 and 5,254,194 and PCT WO 95/19242 and U.S. Pat. No. 5,505,747, all incorporated herein by reference.

Referring to FIG. 3, reservoir 37 holds liquid medium 43 (described in more detail, below) which is pumped through tubing 38 into the interface between semiconductor wafer and abrasive coating 42. It is preferred that during planarization there be a consistent flow of the liquid medium to the interface between the abrasive article and the semiconductor wafer. The liquid medium flow rate typically ranges from about 10 to 500 milliliters/minute, preferably between about 25 to 250 milliliters/minute.

Operating Conditions

The planarization operation is preferably conducted in a clean room to minimize the presence of contaminants which might form defects in the wafer surface. For example, the planarization may be conducted in a class 10,000, class 1,000 clean room or a class 100 clean room.

Variables which affect the planarization process include the selection of the appropriate contact pressure between the wafer surface and fixed abrasive article, type of liquid medium, relative speed and relative motion between the wafer surface and the fixed abrasive article, and the flow rate of the liquid medium. These variables are interdependent, and are selected based upon the individual wafer surface being planarized.

In general, since there can be numerous planarization steps for a single semiconductor wafer, the semiconductor wafer industry expects that the planarization process will result in a relatively high removal rate of the insulating layers. If the insulating layer is a metal oxide such as silicon dioxide, the cut rate should be at least 100 Angstroms per minute, preferably at least 500 Angstroms per minute, more preferably at least 1000 Angstroms per minute, and most preferably at least 1500 Angstroms per minute. In some instances, it may be desirable for the cut rate to be as high as at least 2000 Angstroms per minute, and even 3000 or 4000 Angstroms per minute. If the material being removed during planarization is harder and/or more chemically durable than silica, then the cut rates may tend to be lower. Conversely, if the material being removed during planarization is softer than silica, then the cut rates may tend to be higher. However, although it is generally desirable to have a high cut rate, the cut rate must be selected such that it does not compromise the desired topography of the wafer surface.

During planarization, it is generally preferred that the abrasive article provide a consistent cut rate across the entire wafer surface. In addition, it is also generally preferred the abrasive article provide a consistent cut rate between consecutive planarization steps to achieve good process control.

The interface pressure between the abrasive article and semiconductor wafer (i.e., the contact pressure) is preferably less than about 20 psi, more preferably less than about 10 psi, even more preferably less than about 8 psi, and most preferably less than 5 psi and even as low as 3 psi. It has been discovered that the fixed abrasive article used in the method according to the invention can still provide a good cut rate at a low interface pressure. The lower pressure is desired because it improves planarization, minimizes dishing, and permits the use of a lighter weight planarization apparatus. Also, two or more processing conditions within a planarization process may be used. For example, a first processing segment may comprise a higher interface pressure than a second processing segment. Rotation speeds of the wafer and/or the abrasive article also may be varied during the planarization process.

The planarization process is preferably conducted in the presence of a liquid medium, which is chosen based upon the composition of the wafer surface being planarized to provide the desired planarization without adversely affecting or damaging the wafer.

In some cases, the liquid medium contributes to planarization in combination with the fixed abrasive article through a chemical mechanical polishing process. As an example, the chemical polishing of $SiO_2$ occurs when a basic compound in the liquid medium reacts with the $SiO_2$ to form a surface layer of silicon hydroxides. The mechanical process occurs when an abrasive article removes the metal hydroxide from the surface.

Chemical mechanical polishing process is preferred for numerous reasons. If the material removal is solely a mechanical process, the abrasive article tends to impart coarse scratches into the surface of the semiconductor wafer. If the material removal is solely a chemical process, the removal of material will be isotropic and planarization will not occur.

The pH of the liquid medium may affect performance, and is selected based upon the nature of the wafer surface being planarized, including the chemical composition and topography of the wafer surface. In some cases, e.g., where the wafer surface contains metal oxide (e.g., silicon dioxide), the liquid medium may be an aqueous medium having a pH greater than 5, preferably greater than 6, more preferably greater than 10. In some instances, the pH ranges between 10.5 and 14.0, preferably between about 10.5 to 12.5. Examples of suitable liquid media for metal oxide-containing wafer surfaces include aqueous solutions containing hydroxide compounds such as potassium hydroxide, sodium hydroxide, ammonium hydroxide, lithium hydroxide, magnesium hydroxide, calcium hydroxide, barium hydroxide, and basic compounds such as amines and the like. The basic liquid medium may also contain more than one basic material, e.g., a mixture of potassium hydroxide and lithium hydroxide. An example of a metal hydroxide-containing liquid medium is a solution of potassium hydroxide in deionized or distilled water in which the potassium hydroxide concentration ranges from about 0.1 to 0.5% (e.g., about 0.25%).

In other cases, also useful, e.g., for metal oxide-containing wafer surfaces, the pH is at least about 4.5, typically at least about 5 and preferably at least about 6. For example, the liquid medium may be distilled or deionized water, which typically has a pH ranging from about 6 to about 8.

The liquid medium may also include a chemical etchant. Although not wishing to be bound by any theory, it is theorized that the chemical etchant may "attack" and possibly react with the outermost surface of the semiconductor wafer. The abrasive article of the invention then removes the resulting material formed on the outermost surface of the semiconductor wafer. Examples of chemical etchants include strong acids (e.g., sulfuric acid, hydrofluoric acid, and the like) and oxidizing agents (e.g., peroxides).

The liquid medium may also help break down the surface of the fixed abrasive article, thereby increasing the erodibility of the article during planarization. For example, where the abrasive article includes an abrasive coating containing a water-soluble binder or a water-sensitive filler such as wood pulp, a water-containing liquid medium will result in water dissolving or being absorbed into the abrasive coating, thereby enhancing erodibility.

The liquid medium may also contain additives such as surfactants, wetting agents, buffers, rust inhibitors, lubricants, soaps, and the like. These additives are chosen to provide the desired benefit without damaging the underlying semiconductor wafer surface. A lubricant, for example, may be included in the liquid medium for the purpose of reducing friction between the fixed abrasive article and the semiconductor wafer surface during planarization. It may be added to the liquid medium prior to planarization, or may be supplied in the form of a second stream during planarization. Examples of suitable lubricants include metal salts of fatty acids (e.g., zinc stearate, calcium stearate and lithium stearate), graphite, mica, molybdenum disulfide, talc, polyamides, boron nitride, sulfides, waxes, glycol ethers, glycerine, silicone compounds, polyvinyl acetate, polyvinyl alcohols, ethylene oxide polymers (e.g., polymers commercially available under the trade designation "Polyox" from Union Carbide Corp.), combinations thereof and the like.

Inorganic particulates may also be included in the liquid medium. These inorganic particulates may aid in the cut rate. Examples of such inorganic particulates include: silica, zirconia, calcium carbonate, chromia, ceria, cerium salts (e.g., cerium nitrate), garnet, silicates and titanium dioxide. The average particle size of these inorganic particulates should be less than about 1,000 Angstroms, preferably less than about 500 Angstroms and more preferably less than about 250 Angstroms.

Examples of particulate-containing liquid media include media containing (a) colloidal ceria particles in water, preferably either distilled or deionized water, in which the average particle size less than about 0.1 micrometer; (b) distilled water, ceria particles and potassium hydroxide; and (c) distilled water, ceria particles and ammonium hydroxide.

Although particulates may be added to the liquid medium, the preferred liquid medium is substantially free of inorganic particulates, e.g., loose abrasive particles. Preferably, the liquid medium contains less than 1% by weight, preferably less than 0.1% by weight and more preferably 0% by weight inorganic particulates.

The amount of the liquid medium is preferably sufficient to aid in the removal of metal hydroxide deposits from the surface. In many instances, there is sufficient liquid from the basic liquid medium and/or the chemical etchant. However, in some instances it is preferred to have another liquid present at the planarization interface in addition to the basic liquid medium. This second liquid may be the same as the liquid from the basic liquid medium, or it may be different.

After the planarization process is complete, the semiconductor wafer is typically cleaned using procedures known in the art. For example, the abrasive article may be replaced with a foam pad that is free of abrasive particles, and the wafer and pad moved relative to each other in the presence of a cleaning medium to remove any undesirable surface debris. The cleaning medium is selected such that it removes the debris without substantially damaging the wafer surface.

Examples of suitable cleaning media include tap water, distilled water, deionized water, organic solvents, and the like. They may be used alone or in combination with each other. If desired, they may also include soap or other additives to aid the cleaning process.

In many instances, e.g., with polishing pad and loose abrasive slurries used in prior art planarization processes, it is necessary to "condition" the polishing pad in order to remove glazing and to maintain consistent performance when planarizing subsequent wafers. By using a fixed abrasive article, however, the separate conditioning step can be omitted, saving both time and money.

Nevertheless, there are circumstances under which it may be desirable to condition the surface of the fixed abrasive article following a planarization step to remove "worn abrasive particles" and/or to remove any undesirable debris, and thereby enhance the cutting ability of the fixed abrasive article, as well as the quality of the planarized surface. In such circumstances, the surface of the fixed abrasive article may be conditioned according to well-known, conventional techniques, including contacting the abrasive surface with a diamond conditioning tool, brush, bonded abrasive, coated abrasive, metal rod, water jet, or the like. Other techniques include exposure to a laser or to corona energy (e.g., using a Sherman corona treating unit available from Sherman Treaters, Ltd., United Kingdom).

The conditioning operation can occur while the abrasive article remains on the planarization apparatus. Alternatively, the abrasive article can be removed, conditioned, and then returned to the apparatus. In some instances, the semiconductor wafer may be removed from the wafer holder after planarization and the wafer holder used to condition the abrasive article. A conditioning tool may also be placed over the wafer holder or installed in place of the wafer holder to condition the abrasive article.

The abrasive article may also be conditioned during the planarization process itself, e.g., by fitting the planarization apparatus with a conditioning tool such that when the abrasive article is exposed it will come into contact with the conditioning tool, or by arranging the wafer holder such that it contacts and conditions the abrasive article during planarization such that the wafer holder in essence continually conditions the abrasive article during planarization.

Abrasive Article

A. General Structure

The process of this invention involves modifying the surface of a semiconductor wafer with a three-dimensional, textured fixed abrasive article. The abrasive article is preferably long lasting, e.g., the abrasive article should be able to complete at least two, preferably at least 5, more preferably at least 20 and most preferably at least 30 planarization processes. The abrasive article should preferably provide a good cut rate. Additionally, the abrasive article is preferably capable of yielding a semiconductor wafer having an acceptable flatness, surface finish and minimal dishing. The materials, desired texture, and process used to make the abrasive article all influence whether or not these criteria are met. One means to determine whether or not the abrasive article construction will be useful in semiconductor wafer planarization is to test the abrasive article construction according to Semiconductor Test Procedure outlined below.

Figure 4:
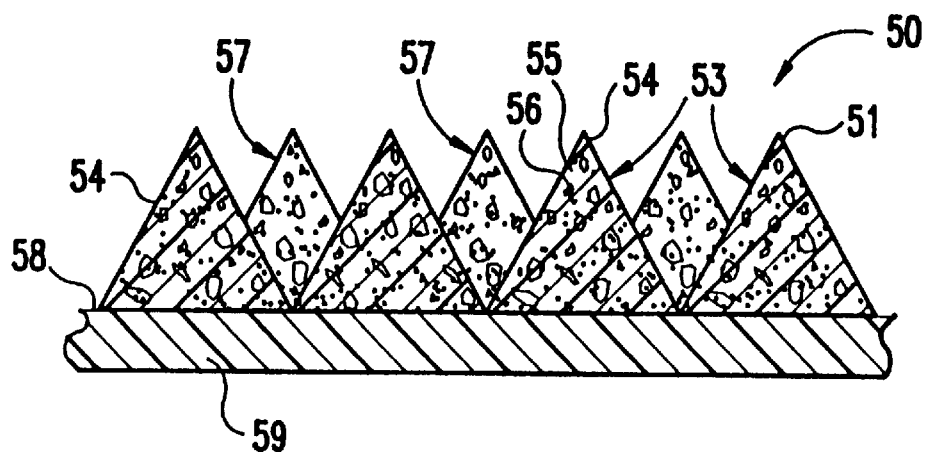
FIG. 4 is an enlarged cross sectional view of a portion of a three-dimensional, textured, fixed abrasive article useful in the process of the present invention.

The fixed abrasive article may contain a backing. One example of such an article is illustrated in FIG. 4. In general, the abrasive particles are dispersed in a binder to form an abrasive coating and/or abrasive composites bonded to a backing. Abrasive article 50 comprises backing 59 having front surface 58. Abrasive coating 57 is bonded on front surface 58 of backing 59. Abrasive coating 57 is three-dimensional and comprises a plurality of abrasive composites 54. In this particular embodiment, abrasive composites 54 are pyramids. There are recesses or valleys 53 between adjacent abrasive composites. There is also more than one row of pyramidal abrasive composites shown in which the second row of abrasive composites is offset from the first row. Abrasive composites 54 comprise a plurality of abrasive particles 56 dispersed in binder 55. Outermost point 51 of abrasive composites 54 contacts the semiconductor wafer during planarization.

Figure 17:
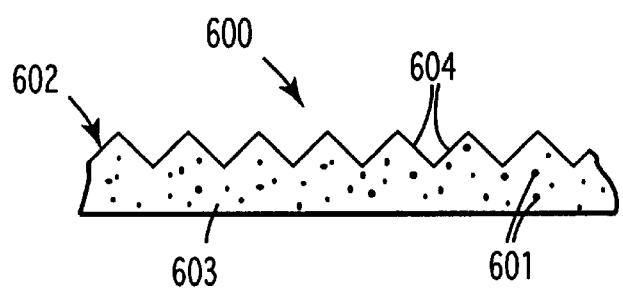
FIG. 17 is an enlarged cross sectional view of a portion of a three-dimensional, textured, fixed abrasive article useful in the process of the present invention.

Optionally, the fixed abrasive article does not have to have a separate backing, as illustrated in FIG. 17, which shows shaped abrasive article 600 which comprises a textured, three-dimensional abrasive body having a textured abrasive surface 602 provided by an integral structure composed of a plurality of pyramidal-shaped abrasive composites 604 in which abrasive particles 601 are dispersed in a binder 603.

In the abrasive articles used in the inventive methods described herein, the abrasive article is "three-dimensional" such that there are numerous abrasive particles throughout at least a portion of the thickness of the abrasive article. The three-dimensional nature provides a long-lasting abrasive article, since there are plentiful abrasive particles to accomplish the mechanical polishing aspect of the planarization process. It is theorized that during planarization, the worn or used abrasive particles are expelled from the abrasive article, thereby exposing new abrasive particles. The expelled abrasive particles may then become dispersed in the liquid medium, depending on machine type and operating conditions and the choice of abrasive article and its degree of erodibility.

The abrasive article also has a "texture" associated with it; i.e. it is a "textured" abrasive article. This can be seen with reference to the abrasive articles illustrated in FIGS. 4 and 17 and described above, in which the pyramid-shaped composites are the raised portions and in which the valleys between the pyramids are the recessed portions. Although not wishing to be bound by any theory, it is theorized that this texture provides several functions and advantages as follows.

The first function is that the recesses will act as channels to help distribute the liquid medium over the entire semiconductor wafer surface when carrying out the inventive methods described herein. The second function of the recesses is to also act as channels to help remove the worn abrasive particles and other debris from the semiconductor wafer surface. This also helps to minimize the need to condition the abrasive article between the planarization of two semiconductor wafers.

The third function is to protect the abrasive article from the phenomenon known in the art as "stiction." If the abrasive coating is smooth rather than textured, then this smooth abrasive coating tends to stick or become lodged against the semiconductor wafer surface. Stiction results in the abrasive article being unable to mechanically planarize the semiconductor wafer. Stiction also inhibits chemical planarization, i.e., inhibits the liquid medium from interacting with the outermost surface of the semiconductor wafer. Due to the discontinuity of the abrasive coating imparted by the recessed portions of the textured surface, stiction is minimized.

The fourth function is the ability to apply a higher unit pressure on the raised abrasive coating portions, thus helping to expunge expelled abrasive particles from the abrasive surface and expose new abrasive particles.

It is also preferred that the abrasive article be erodible, i.e., able to wear away controllably with use. Erodibility is desired because it results in expelled abrasive particles being expunged from the abrasive article to expose new abrasive particles. Since it is preferred that the abrasive article be three-dimensional, a plentiful supply of new abrasive particles will thus be assured. If the abrasive coating is not erodible, the expelled abrasive particles may not properly be discharged from the abrasive article, in which case fresh abrasive particles will not be exposed. If the abrasive coating is too erodible, abrasive particles may be expelled too fast, which may result in an abrasive article with shorter than desired product life.

The degree of erodibility is also a function of the surface texture, the abrasive coating composition, the planarization conditions and the composition of the semiconductor wafer. There are many ways of endowing an abrasive product with erodibility, as will be described below.

The abrasive article of the invention is preferably circular in shape, e.g., in the form of an abrasive disc. The outer edges of the circular abrasive disc are preferably smooth or, alternatively, may be scalloped. The abrasive article may also be in the form of an oval or of any polygonal shape such as triangular, square, rectangular, and the like.

The abrasive article may in another embodiment be provided in the form of a roll, typically referred to in the abrasive art as abrasive tape rolls. The abrasive tape roll may range in size from about 10 mm to 1000 mm wide, typically about mm to 500 mm wide. Additionally, the abrasive tape roll can range in length from about 100 mm to 500,000 mm, typically from about 1,000 mm to 100,000 mm.

In general, the abrasive tape rolls will be indexed to achieve the desired planarization criteria. Indexing may occur between the planarization of two separate semiconductor wafers. Alternatively, indexing may occur during the planarization of one semiconductor wafer. If the latter occurs, the indexing speed will be set to achieve the desired planarization criteria. Indexing of conventional abrasive tapes is well known in the art.

The abrasive article may also be provided in the form of an endless abrasive belt. This endless abrasive belt may be spliceless or contain a splice. Typically, the endless abrasive belt will traverse over at least one idler roll and a contact roll or contact platen. The contact roll or contact platen supports the back side of the abrasive article as it contacts the semiconductor wafer during planarization.

One method of providing a three-dimensional, textured, fixed abrasive article is generally as follows. A slurry containing a mixture of a binder precursor and a plurality of abrasive grains is applied onto a production tool having cavities which are the negative of the desired shape of the textured surface. A backing is brought into contact with the exposed surface of the production tool such that the slurry wets the surface of the backing. Then, the binder can be at least partially solidified, cured, or gelled. The abrasive article is then removed from the production tool and fully cured if it was not fully cured in the previous step. Alternatively, the slurry can be applied onto the surface of the backing and then the production tool can be brought into contact with the slurry on the backing. The abrasive coating thus comprises a plurality of abrasive "composites" on a backing.

Another method of providing a three-dimensional, textured, fixed abrasive article is generally as follows. A backing having a contour generally corresponding to the desired shape of the textured surface is provided. A slurry of abrasive particles in a binder precursor is then coated onto the contoured surface of the backing and cured in such a manner that the cured abrasive coating will have a textured surface corresponding generally to the contour of the backing. In one aspect of this method, an embossed backing is provided to make the abrasive article.

Certain modifications may be made in the three-dimensional, textured, fixed abrasive article to improve or otherwise alter performance. For example, the abrasive article may be perforated to provide openings through the abrasive layer and/or the backing to permit the passage of fluids before, during or after use.

Specific components of the abrasive article will now be described.

1. Backing

The abrasive article may be in the form of a backing provided with an abrasive coating. Preferred backings of abrasive articles for semiconductor wafer planarization are very uniform in thickness. If the backing is not sufficiently uniform in thickness, a greater variability in the wafer surface and wafer thickness after planarization may result. Any of a variety of backing materials are suitable for this purpose, including both flexible backings and backings that are more rigid.

Examples of typical flexible abrasive backings include polymeric film, primed polymeric film, metal foil, cloth, paper, vulcanized fiber, nonwovens and treated versions thereof and combinations thereof. One preferred type of backing is a polymeric film. Examples of such films include polyester films, polyester and co-polyester films, micro-voided polyester films, polyimide films, polyamide films, polyvinyl alcohol films, polypropylene film, polyethylene film, and the like. The thickness of the polymeric film backing generally ranges between about 20 to 1000 micrometers, preferably between 50 to 500 micrometers and more preferably between 60 to 200 micrometers.

There should also be good adhesion between the polymeric film backing and the abrasive coating. In many instances, the coating surface of polymeric film backing is primed to improve adhesion. The primer can involve surface alteration or application of a chemical-type primer. Examples of surface alterations include corona treatment, UV treatment, electron beam treatment, flame treatment and scuffing to increase the surface area. Examples of chemical-type primers include ethylene acrylic acid copolymer as disclosed in U.S. Pat. No. 3,188,265, colloidal dispersion as taught in U.S. Pat. No. 4,906,523, incorporated herein by reference, aziridine-type materials as disclosed in U.S. Patent No. 4,749,617 and radiation grafted primers as taught in U.S. Pat. Nos. 4,563,388 and 4,933,234.

Examples of more rigid backings include metal plates, ceramic plates, and the like. Another example of a suitable backing is described in U.S. Pat. No. 5,417,726 (Stout et al.) incorporated herein by reference. The backing may also consist of two or more backings laminated together, as well as reinforcing fibers engulfed in a polymeric material as disclosed in PCT publication WO 93/12911 (Benedict et al.).

Also suitable are backings in the form of an embossed polymeric film (e.g., a polyester, polyurethane, polycarbonate, polyamide, polypropylene, or polyethylene film) or embossed cellulosic backing (e.g., paper or other nonwoven cellulosic material). The embossed material can also be laminated to a non-embossed material to form the backing. The embossed pattern can be any texture. For example, the pattern can be in the form of an hexagonal array, ridges, lattices, spheres, pyramids, truncated pyramids, cones, cubes, blocks, rods, and the like.

The backing may also contain a treatment to modify its physical properties. These treatment coats are well known in the abrasive art and include acrylate-based treatment coats, phenolic treatment coats and phenolic/latex treatment coats.

The backing may also be a foamed backing, e.g., a polymeric foam such as a polyurethane foam.

A pressure sensitive adhesive can be laminated to the nonabrasive side of the backing. Likewise, a foam substrate can be laminated to the backing.

In some instances, the back side or back surface of the backing may contain a friction coating. This friction coating may comprise a plurality of friction particles bonded to the backing by means of a friction coating binder. Friction particles may be any suitable material to create the desired coefficient of friction. Examples of suitable friction particles include both inorganic particles and organic particles, e.g., abrasive particles and/or filler particles. Alternatively, the friction coating may comprise a coating such as a urethane coating or a rough organic coating.

2. Abrasive Particles

The abrasive article comprises abrasive particles and a binder. The abrasive particles may be homogeneously dispersed in the binder or alternatively the abrasive particles may be non-homogeneously dispersed. It is generally preferred that the abrasive particles be homogeneously dispersed so that the resulting abrasive coating provides a more consistent cutting ability.

For semiconductor wafer planarization, fine abrasive particles are preferred. The average particle size of the abrasive particles can range from about 0.001 to 50 micrometers, typically between 0.01 to 10 micrometers. The particle size of the abrasive particle is typically measured by the longest dimension of the abrasive particle. In almost all cases there will be a range or distribution of particle sizes. In some instances it is preferred that the particle size distribution be tightly controlled such that the resulting abrasive article provides a very consistent surface finish on the wafer after planarization.

If the planarization occurs on a metal oxide-containing layer (e.g., a silicon dioxide-containing layer), it is preferred that the abrasive particles have a particle size less than about 1 micrometer, and more preferably less than about 0.5 micrometer. In some instances, it is preferred that the particle size distribution result in no or relatively few abrasive particles that have a particle size greater than 2 micrometers, preferably no greater than 1 micrometer. At these relatively small particle sizes, the abrasive particles may tend to aggregate by interparticle attraction forces. Thus these "aggregates" may have a particle size greater than about 1 or 2 micrometers and even as high as 5 or 10 micrometers. It is preferred to break up these aggregates, such that the average aggregate particle size is less than about 2 micrometers. However in some instances, it can be difficult to "break" up aggregates. In some instances, very small abrasive particles are present in a dispersion, i.e., the abrasive particles are dispersed in a liquid such as water, prior to being added to the binder precursor. The liquid may be either basic, neutral, or acidic, may include a surface treating material such as a surfactant.

The abrasive particles may also be in the form of an abrasive agglomerate which comprises a plurality of individual abrasive particles bonded together to form a unitary particulate mass. The abrasive agglomerates may be irregularly shaped or have a predetermined shape. The abrasive agglomerate may utilize an organic binder or an inorganic binder to bond the abrasive particles together.

Examples of abrasive agglomerates are further described in U.S. Pat. Nos. 4,652,275 (Bloecher et al.); 4,799,939 (Bloecher et al.); and U.S. Pat. No. 5,500,273 (Holmes et al.), incorporated herein by reference. Abrasive agglomerates preferably have a particle size less than about 100 micrometers, more preferably less than about 50 micrometers and even more preferably less than about 25 micrometers. The individual abrasive particles in the abrasive agglomerate will preferably have an average particle size less than about 10 micrometers.

The abrasive particles preferably are resistant to the liquid medium such that their physical properties do not substantially degrade upon exposure to the liquid medium. Suitable abrasive particles are typically inorganic abrasive particles. The inorganic abrasive particles can further be divided into "hard" inorganic abrasive particles (i.e., those having a Mohs hardness of 8 or greater) and "soft" inorganic abrasive particles (i.e., those having a Mohs hardness less than 8).

Examples of suitable abrasive particles include fused aluminum oxide, heat treated aluminum oxide, white fused aluminum oxide, black silicon carbide, green silicon carbide, titanium diboride, boron carbide, silicon nitride, tungsten carbide, titanium carbide, diamond, cubic boron nitride, hexagonal boron nitride, garnet, fused alumina zirconia, alumina-based sol gel derived abrasive particles and the like. The alumina abrasive particle may contain a metal oxide modifier. Examples of alumina-based sol gel derived abrasive particles can be found in U.S. Pat. Nos. 4,314,827; 4,623,364; 4,744,802; 4,770,671; and 4,881,951, all incorporated herein by reference. The diamond and cubic boron nitride abrasive particles may be mono crystalline or polycrystal line.

Other examples of suitable inorganic abrasive particles include silica, iron oxide, chromia, ceria, zirconia, titania, tin oxide, gamma alumina, and the like. For planarization of metal oxide-containing wafer surfaces (e.g., silicon dioxide-containing surfaces), it is preferred that the abrasive particles have a Mohs hardness less than 8. Such particles, when properly incorporated into an abrasive article, provide the desired rate of cut and the desired surface finish on the wafer during planarization. Some harder abrasive particles may impart an undesirably coarse surface finish on the oxide-containing wafer surface, so care should be exercised in selection of the appropriate abrasive material, such being within the ability of one skilled in the art.

In the case of metal oxide-containing wafer surfaces (e.g., silicon dioxide-containing surfaces), ceria abrasive particles are useful. Ceria abrasive particles may be purchased from Rhone Poulenc; Shelton, Conn.; Transelco, New York; Fujimi, Japan; Molycorp, Fairfield, N.J.; American Rar Ox, Chaveton City, Mass.; and Nanophase, Burr Ridge, Ill.

The ceria abrasive particles may be essentially free of modifiers or dopants (e.g., other metal oxides). Alternatively, the ceria abrasive particles may contain modifiers and/or dopants (e.g., other metal oxides). In some instances, these metal oxides may react with ceria. It is also feasible to use ceria with a combination of two or more metal oxide modifiers. These metal oxides may react with the ceria to form reaction products. Typically, if the ceria particles contain another metal oxide, it is generally preferred that the ceria phase be the predominant phase.

Zirconia abrasive particles can also be used in the abrasive products used in the invention. The zirconia abrasive particle may be made from a fusion or sintering process. Additionally, the zirconia may be present in a tetragonal form, monoclinic form or combination of tetragonal and monoclinic forms. As in the case of ceria particles, the zirconia particles may be essentially free of modifiers and dopants, or may contain such materials. Suitable metal oxides includes those described above in the case of ceria, as well as ceria itself. One preferred metal oxide modifier is yttria. Typically, if the zirconia particles contain another metal oxide, it is generally preferred that the zirconia phase be the predominant phase.

The abrasive article may also contain a mixture of two or more different types of abrasive particles. This mixture may comprise a mixture of "hard" inorganic abrasive particles and "soft" inorganic abrasive particles, or a mixture of two "soft" abrasive particles. In the mixture of two or more different abrasive particles, the individual abrasive particles may have the same average particle size, or may have a different average particle size.

The abrasive particle may also have a shape associated with it. Examples of such shapes include rods, triangles, pyramids, cones, solid spheres, hollow spheres and the like. Alternatively, the abrasive particle may be randomly shaped, e.g., like blocks or needles. In some instances it is preferred to include an additive that modifies the surface of the abrasive particles. These additives may improve the dispersibility of the abrasive particles in the binder precursor and/or improve the adhesion to the binder precursor and/or the binder. Surface treatment may also alter and improve the cutting characteristics of the resulting abrasive particles. Surface treatment may also substantially lower the viscosity of the slurry used to prepare the abrasive article, thereby providing an easier manufacturing process. The lower viscosity also permits higher percentages of abrasive particles to be incorporated into a slurry. Another potential advantage of a surface treatment is to minimize the agglomeration of the abrasive particles during the manufacture of the abrasive article.

The abrasive particles may be treated with a surface treatment in an amount up to about 25% by weight based solely upon the abrasive particle weight. The abrasive particles are treated with a surface treatment, this amount ranges from about 0.5 to 10% by weight based solely upon the abrasive particle weight.

Examples of suitable surface modification additives include wetting agents (also sometimes referred to as surfactants) and coupling agents. A coupling agent can provide an association bridge between the binder and the abrasive particles. The coupling agent may also provide an association bridge between the binder and the filler particles (to the extent present). Examples of suitable coupling agents include silanes, titanates, and zircoaluminates. Examples of commercially available coupling agents include "A174" and "A1230" from OSI. An example of a commercial dispersant is isopropyl triisosteroyl titanate commercially available from Kenrich Petrochemicals under the trade designation "KR-TTS".

There are various means to incorporate the coupling agent into a slurry to make the abrasive article. For example, the coupling agent may be added directly to the binder precursor. The abrasive particle may contain from about 0 to 30%, preferably between 0.1 to 25%, by weight coupling agent. In yet another mode, the coupling agent may be applied to the surface of the abrasive particles prior to being incorporated into the abrasive article. The abrasive particle may contain up to about 3% by weight coupling agent, based upon the total weight of the abrasive particle and the coupling agent.

It is also feasible to treat the abrasive particles with more than one coupling agent or use a first coupling agent for the abrasive particles and a second different, coupling agent for the filler particles (described below).

If ceria is utilized as the abrasive particle, the ceria may be treated with a coupling agent prior to being added into the binder precursor. An example of such a coupling agent is isopropyl triisosteroyl titanate.

Surfactants may also be used as an additive. Examples of surfactants include metal alkoxides, polyalkylene oxides, salts of long chain fatty acids and the like. The surfactants may be cationic, anionic, amphoteric, or nonionic as long as the surfactant is compatible with both the abrasive particle and the binder precursor. Examples of preferred surfactants include an anionic dispersing agent commercially available from Byk Chemie, Wallingford, Conn. under the trade designation "Disperbyk 111" and a polyethylene oxide-based dispersant commercially available from ICI Chemicals, of Wilmington, Del. under the trade designation "Hypermer KD2". In some instances, surface treatment is applied by the abrasive particle manufacturer during the manufacturing process of the abrasive particle. For example, a surface treatment may be applied during the crushing and/or screening/classifying process to make the abrasive particles.

The abrasive particles may contain a surface coating to alter the abrading characteristics of the resulting abrasive grain. Suitable examples of such surface coatings are described, for example, in U.S. Pat. Nos. 5,011,508 (Wald et al.); 1,910,444 (Nicholson); 3,041,156 (Rowse et al.); 5,009,675 (Kunz et al.); 4,997,461 (Markhoff-Matheny et al.); 5,213,591 (Celikkaya et al.); 5,085,671 (Martin et al.); and 5,042,991 (Kunz et al.), the disclosures of which are incorporated herein by reference. The abrasive particles may also contain multiple coatings.

3. Filler Particles

The abrasive article may optionally further comprise filler particles for various reasons. The filler may alter the erodibility of the abrasive article. In some instances with the appropriate filler and amount, the filler may decrease the erodibility of the abrasive article. Conversely, in some instances with the appropriate filler and amount, the filler may increase the erodibility of the abrasive article. Fillers may also be selected to reduce cost of the abrasive article, alter the rheology of the slurry, and/or to alter the abrading characteristics of the abrasive article. Fillers should be selected so as not to deleteriously affect the desired planarization criteria.

A filler is a particulate material which does not abrade the wafer surface to any significant extent; thus, whether a material qualifies as a "filler" will depend upon the particular wafer surface being treated. It is possible for a material to act as a filler in the context of one wafer surface and as an abrasive particle in the context of a different wafer surface.

Filler particles generally have an average particle size range between 0.1 to 50 micrometers, typically between 1 to 30 micrometers. In addition, the filler typically has a Mohs hardness less than 5, more preferably less than 4, and most preferably less than about 3, although fillers outside of this hardness range may also be useful. Examples of useful fillers for this invention include: metal carbonates (such as calcium carbonate (chalk, calcite, marl, travertine, marble and limestone)), calcium magnesium carbonate, sodium carbonate, magnesium carbonate), silica (such as quartz, glass beads, glass bubbles and glass fibers) silicates (such as talc, clays such as (montmorillonite), feldspar, mica, calcium silicate, calcium metasilicate, sodium aluminosilicate, sodium silicate) metal sulfates (such as calcium sulfate, barium sulfate, sodium sulfate, aluminum sodium sulfate, aluminum sulfate), gypsum, vermiculite, wood flour, aluminum trihydrate, carbon black, certain metal oxides (such as calcium oxide (lime)), alumina, tin oxide (e.g. stannic oxide), titanium dioxide, metal sulfites (such as calcium sulfite), thermoplastic particles (e.g., polycarbonate, polyetherimide, polyester, polyethylene, polysulfone, polystyrene, acrylonitrile-butadiene-styrene block copolymer, polypropylene, acetal polymers, polyurethanes, nylon particles) and thermosetting particles (such as phenolic bubbles, phenolic beads, polyurethane foam particles, phenolic resins, aminoplast resins, urethane resins, epoxy resins, melamine-formaldehyde, acrylate resins, acrylated isocyanurate resins, urea-formaldehyde resins, isocyanurate resins, acrylated urethane resins, acrylated epoxy resins, and the like). The filler may also be a salt such as a halide salt. Examples of halide salts include sodium chloride, potassium cryolite, sodium cryolite, ammonium cryolite, potassium tetrafluoroboate, sodium tetrafluoroborate, silicon fluorides, potassium chloride, magnesium chloride. Examples of metal fillers include tin, lead, bismuth, cobalt, antimony, cadmium, iron, titanium. Other miscellaneous fillers include sulfur, organic sulfur compounds, graphite, boron nitride, and metallic sulfides. The above mentioned examples of fillers are meant to be a representative showing of some useful fillers, and are not meant to encompass all useful fillers.

One useful filler is calcium carbonate. Other useful fillers include silicates such as magnesium silicate, aluminum silicate, and calcium silicate. The average particle size of the calcium carbonate particles may range between about 0.01 to about 15 micrometers, preferably between about 0.05 to 10 micrometers. In some instances, it is preferred to use a blend of two or more different particle sizes of the calcium carbonate filler to achieve a broader particle size distribution.

The fillers may be provided with a surface treatment as described above in the case of the abrasive particles. An example of a surfactant for calcium carbonate filler particles is "LP1" commercially available from ICI Chemical Inc.

Abrasive compositions which include ceria abrasive particles and one or more filler particles are useful for modifying metal oxide-containing (e.g., silicon dioxide-containing) wafer surfaces. The ceria abrasive particles preferably have an average particle size of about 0.02 to about 2 micrometers to provide the desired surface finish on the semiconductor wafer after planarization.

One abrasive composition useful for modifying metal oxide-containing (e.g., silicon dioxide-containing) wafer surfaces contains ceria abrasive particles having an average particle size of about 0.5 micrometer and calcium carbonate filler particles which have a size distribution between about 0.1 to about 10 micrometers and an average particle size being greater than 5 microns. The overall particle size distribution of ceria particles and calcium carbonate particles may result in a relatively broad distribution and a high density of particulates in the binder.

A second composition, also useful for modifying metal oxide-containing (e.g., silicon dioxide-containing) wafer surfaces according to the invention, contains zirconia abrasive particles and filler such as calcium carbonate. In still other instances, the abrasive article may contain a mixture of zirconia and ceria abrasive particles and optionally filler such as calcium carbonate. Similarly, the abrasive article may contain a mixture of zirconia and silica abrasive particles and optionally filler such as calcium carbonate. Alternatively, the abrasive article may contain a mixture of zirconia abrasive particles, a cerium salt and optionally filler such as calcium carbonate. Likewise, the abrasive article may contain a mixture of zirconia abrasive particles, a silica complexing agent and optionally filler such as calcium carbonate.

4. Binders

Organic Resin

The binders for the abrasive articles of this invention are preferably formed from an organic binder precursor. The binder precursor has a phase that is capable of flowing sufficiently so as to be coatable, and then solidifying. The solidification can be achieved by curing (e.g., polymerizing and/or crosslinking) and/or by drying (e.g., driving off a liquid), or simply upon cooling. The precursor can be an organic solvent-borne, water-borne, or 100% solids (i.e., a substantially solvent-free) composition. Both thermoplastic and thermosetting materials, as well as combinations thereof, can be used as the binder precursor.

In many instances, the abrasive coating is formed from a slurry that comprises a mixture of abrasive particles and a binder precursor. The abrasive coating can comprise by weight between about 1 part abrasive particles to 90 parts abrasive particles and 10 parts binder to 99 parts binder. Preferably the abrasive coating comprises about 30 to 85 parts abrasive particles and about 15 to 70 parts binder. More preferably the abrasive coating comprises about 40 to 70 parts abrasive particles and about 30 to 60 parts binder precursor.

The binder precursor is preferably a curable organic material (i.e., a material capable of polymerizing and/or crosslinking upon exposure to heat and/or other sources of energy, such as E-beam, ultraviolet, visible, etc., or with time upon the addition of a chemical catalyst, moisture, and the like). Binder precursor examples include amino resins (e.g., aminoplast resins) such as alkylated urea-formaldehyde resins, melamine-formaldehyde resins, and alkylated benzoguanamine-formaldehyde resin, acrylate resins (including acrylates and methacrylates) such as vinyl acrylates, acrylated epoxies, acrylated urethanes, acrylated polyesters, acrylated acrylics, acrylated polyethers, vinyl ethers, acrylated oils, and acrylated silicones, alkyd resins such as urethane alkyd resins, polyester resins, reactive urethane resins, phenolic resins such as resole and novolac resins, phenolic/latex resins, epoxy resins such as bisphenol epoxy resins, isocyanates, isocyanurates, polysiloxane resins (including alkylalkoxysilane resins), reactive vinyl resins, and the like. The resins may be in the form of monomers, oligomers, polymers, or combinations thereof.

Both types of phenolic resins (resole and novolac) are useful. Resole phenolic resins have a molar ratio of formaldehyde to phenol of greater than or equal to one, typically between 1.5:1.0 to 3.0:1.0. Novolac resins have a molar ratio of formaldehyde to phenol of less than to one to one. Examples of commercially available phenolic resins include those known by the tradenames "Durez" and "Varcum" from Occidental Chemicals Corp.; "Resinox" from Monsanto; "Arofene" from Ashland Chemical Co. and "Arotap" from Ashland Chemical Co.

Examples of latex resins that may be suitable as binder precursors include acrylonitrile-butadiene emulsions, acrylic emulsions, butadiene emulsions, butadiene-styrene emulsions, and combinations thereof. Such latex resins are commercially available from a variety of different sources under various tradenames including: "Rhoplex" and "Acrylsol" commercially available from Rohm and Haas Company, "Flexcryl" and "Valtac" commercially available from Air Products & Chemicals Inc., "Synthemul" and "Tylac" commercially available from Reichold Chemical Co., "Hycar" and "Goodrite" commercially available from B.F. Goodrich, "Chemigum" commercially available from Goodyear Tire and Rubber Co., "Neocryl" commercially available from ICI, "Butafon" commercially available from BASF and "Res" commercially available from Union Carbide. It is also feasible to blend the latex resin with a phenolic resin or other thermosetting resins to form a binder precursor.

The binder precursor may also be a urea-formaldehyde resin, e.g., as described in U.S. Pat. No. 5,486,219 (Ford et al.) incorporated herein by reference.

Useful epoxy resins are characterized by having an oxirane ring and are polymerized by the ring opening. Such resins include monomeric epoxy resins and oligomeric epoxy resins. These resins can vary greatly in the nature of their backbones and substituent groups. For example, the backbone may be any conventional back bone normally found in epoxy resins and substituent groups thereon can be any group free of an active hydrogen atom that is reactive with an oxirane ring at room temperature. Representative examples of acceptable epoxy substituent groups include halogens, ester groups, ether groups, sulfonate groups, siloxane groups, nitro groups and phosphate groups. Examples of preferred epoxy resins include 2,2-bis(4-(2,3-epoxypropoxy)-phenyl)propane (diglycidyl ether of bisphenol A) and materials commercially available under the trade designation "Epon 828", "Epon 1004" and "Epon 1001F" from Shell Chemical Co.; and "DER-331", "DER-332" and "DER-334" from Dow Chemical Co. Other suitable epoxy resins include glycidyl ethers of phenol formaldehyde novolac (e.g., "DEN-431" and "DEN-428" available from Dow Chemical Co.)

Examples of ethylenically unsaturated binder precursors include aminoplast monomers or oligomers having pendant alpha, beta unsaturated carbonyl groups, ethylenically unsaturated monomers or oligomers, acrylated isocyanurate monomers, acrylated urethane oligomers, acrylated epoxy monomers or oligomers, ethylenically unsaturated monomers or diluents, acrylate dispersions, and mixtures thereof.

The aminoplast binder precursors have at least one pendant alpha, beta-unsaturated carbonyl group per molecule or oligomer. These materials are further described in U.S. Pat. Nos. 4,903,440 (Larson et al.) and 5,236,472 (Kirk et al.), both incorporated herein by reference.

The ethylenically unsaturated monomers or oligomers may be monofunctional, difunctional, trifunctional, tetrafunctional or even higher functionality, and include both acrylate and methacrylate-based monomers. Ethylenically unsaturated binder precursors include both monomeric and polymeric compounds that contain atoms of carbon, hydrogen and oxygen, and optionally, nitrogen and the halogens. Oxygen or nitrogen atoms or both are generally present in ether, ester, urethane, amide, and urea groups. Suitable ethylenically unsaturated compounds preferably have a molecular weight of less than about 4,000 and are preferably esters made from the reaction of compounds containing aliphatic monohydroxy groups or aliphatic polyhydroxy groups and unsaturated carboxylic acids, such as acrylic acid, methacrylic acid, itaconic acid, crotonic acid, isocrotonic acid, maleic acid, and the like. Representative examples of ethylenically unsaturated monomers include methyl methacrylate, ethyl methacrylate, styrene, divinylbenzene, hydroxy ethyl acrylate, hydroxy ethyl methacrylate, hydroxy propyl acrylate, hydroxy propyl methacrylate, hydroxy butyl acrylate, hydroxy butyl methacrylate, vinyl toluene, ethylene glycol diacrylate, polyethylene glycol diacrylate, ethylene glycol dimethacrylate, hexanediol diacrylate, triethylene glycol diacrylate, trimethylolpropane triacrylate, glycerol triacrylate, pentaerthyitol triacrylate, pentaerythritol trimethacrylate, pentaerythritol tetraacrylate and pentaerythritol tetramethacrylate. Other ethylenically unsaturated materials include monoallyl, polyallyl, and polymethallyl esters and amides of carboxylic acids, such as diallyl phthalate, diallyl adipate, and N,N-diallyladipamide. Still other nitrogen containing compounds include tris(2-acryloxyethyl)isocyanurate, 1,3,5-tri(2-methyacryloxyethyl)-s-triazine, acrylamide, methylacrylamide, N-methylacrylamide, N,N-dimethylacrylamide, N-vinyl-pyrrolidone, and N-vinyl-piperidone.

Examples of suitable mono-functional acrylates and methacrylates that can be used (e.g., in combination with di- or tri-functional acrylate and methacrylate monomers, or with phenolic or epoxy resins) include lauryl acrylate, octyl acrylate, 2(2-ethoxyethoxy) ethylacrylate, tetrahydrofurfuryl methacrylate, cyclohexyl acrylate, stearyl acrylate, 2-phenoxyethyl acrylate, isooctyl acrylate, isobornyl acrylate, isodecyl acrylate, polyethylene glycol monoacrylate, and polypropylene glycol monoacrylate.

It is also feasible to formulate a binder precursor that comprises a mixture of an acrylate resin and an epoxy resin, e.g., as described in U.S. Pat. No. 4,751,138 (Tumey et al.) incorporated herein by reference.

Isocyanurate derivatives having at least one pendant acrylate group and isocyanate derivatives having at least one pendant acrylate group are further described in U.S. Pat. No. 4,652,274 (Boettcher et al.), incorporated herein by reference. The preferred isocyanurate material is a triacrylate of tris(hydroxy ethyl) isocyanurate.

Acrylated urethanes are diacrylate esters of hydroxy terminated isocyanate extended polyesters or polyethers. Examples of commercially available acrylated urethanes include those under the tradename "UVITHANE 782", available from Morton Chemical; "CMD 6600", "CMD 8400", and "CMD 8805", available from UCB Radcure Specialties, Smyrna, Ga.; "PHOTOMER" resins (e.g., PHOTOMER 6010) from Henkel Corp., Hoboken, N.J.; "EBECRYL 220" (hexafunctional aromatic urethane acrylate of molecular weight 1000), "EBECRYL 284" (aliphatic urethane diacrylate of 1200 molecular weight diluted with 1,6-hexanediol diacrylate), "EBECRYL 4827" (aromatic urethane diacrylate of 1600 molecular weight), "EBECRYL 4830" (aliphatic urethane diacrylate of 1200 molecular weight diluted with tetraethylene glycol diacrylate), "EBECRYL 6602" (trifunctional aromatic urethane acrylate of 1300 molecular weight diluted with trimethylolpropane ethoxy triacrylate), and "EBECRYL 840" (aliphatic urethane diacrylate of 1000 molecular weight) from UCB Radcure Specialties; and "SARTOMER" resins (e.g., SARTOMER 9635, 9645, 9655, 963-B80, 966-A80, etc.) from Sartomer Co., Exton, Pa.

Acrylated epoxies are diacrylate esters of epoxy resins, such as the diacrylate esters of bisphenol A epoxy resin. Examples of commercially available acrylated epoxies include those under the tradename "CMD 3500", "CMD 3600", and "CMD 3700", available from UCB Radcure Specialties.

The binder precursor may also comprise an acrylated polyester resin. Acrylated polyesters are the reaction products of acrylic acid with a dibasic acid/aliphatic diol-based polyester. Examples of commercially available acrylated polyesters include those known by the trade designations "PHOTOMER 50071" (hexafunctional acrylate of 2000 molecular weight), and "PHOTOMER 5018" (tetrafunctional tetracrylate of 1000 molecular weight) from Henkel Corp.; and "EBECRYL 80" (tetrafunctional modified polyester acrylate of 1000 molecular weight), "EBECRYL 450" (fatty acid modified polyester hexaacrylate) and "EBECRYL 830" (hexafunctional polyester acrylate of 1500 molecular weight) from UCB Radcure Specialties.

Examples of ethylenically unsaturated diluents or monomers can be found in U.S. Pat. No. 5,236,472 (Kirk et al.) and U.S. patent application Ser. No. 08/474,289 now U.S. Pat. No. 5,667,842 (Larson et al.); the disclosures of both of which are incorporated herein by reference. In some instances these ethylenically unsaturated diluents are useful because they tend to be compatible with water. Additional reactive diluents are disclosed in U.S. Pat. No. 5,178,646 (Barber et al.) incorporated herein by reference.

The binder precursor can also comprise an acrylate-based dispersion. The acrylate-based dispersion comprises a multitude of acrylate-based droplets suspended in water with the aid of a dispersing agent. Each acrylate-based droplet contains at least one acrylate functional group, typically two and sometimes three or four acrylate functional groups. During curing, polymerization or crosslinking occurs at the site of these acrylate functional group(s). The acrylate-based droplets by themselves are usually not soluble in water, but rather tend to phase separate from the water. However, a dispersing agent is added such that the acrylate-based droplets are capable of being dispersed or suspended in water. With the aid of the dispersing agent, the acrylate-based droplets form a phase within the water. It is preferred that the acrylate-based droplets are uniformly dispersed or suspended within the water.

The dispersing agent can be an emulsifier. There are three main classes of emulsifiers: cationic, anionic, and nonionic. Examples of cationic emulsifiers include quaternary ammonium salts. Examples of anionic emulsifiers include triethylamine and sulphonated materials. Examples of nonionic emulsifiers include nonyl-phenol ethoxylate commercially known under the tradename "Triton X-100". The concentration of the emulsifier typically ranges between about 0.01 to about 15%, typically between about 0.1% to about 2% of the acrylate-based dispersion.

Alternatively, the acrylate-based monomer may be self-emulsifying, eliminating the need for a supplemental dispersing agent. For example, the acrylate-based monomer may have polar groups that when combined with water will self-emulsify into acrylate-based droplets. These acrylate-based droplets are then suspended in the water. Additional details concerning acrylate dispersions can be found in U.S. Pat. No. 5,378,252 (Follensbee), incorporated herein by reference.

In general it is preferred that the abrasive article provide a substantially consistent cut rate throughout the life of the abrasive article. In some instances as a result of processing, the binder tends to migrate to the outer surface of the abrasive coating and this essentially results in a film of binder on the outer surface of the abrasive article. Although not wishing to be bound by any theory, it is believed that this binder film may interfere with the initial cutting ability of the abrasive article. When a new abrasive article is first used to planarize a semiconductor wafer, the abrasive article tends to have a lower initial cut rate in comparison to the abrasive article cut rate after this outer binder film is worn away. One solution to this problem is to condition the new abrasive article before it is used to planarize a semiconductor wafer, although conditioning is not always preferred because conditioning requires an additional step. It is preferred to formulate the slurry such that this binder film is minimized. Although not wishing to be bound by any theory, one approach to minimize the binder migration during curing is to have a high volume concentration of abrasive particles and/or filler in the binder. This high volume concentration is based upon a packing of the abrasive particles and/or filler in the binder such that there is minimal porosity of abrasive particles and/or filler alone, i.e., without the binder present. This high volume concentration will tend to minimize the pathway(s) for the binder to migrate during curing. One means to achieve this high packing density of the abrasive particles and/or fillers is to use a broad particle size distribution of the abrasive particles and/or filler. In a broad particle size distribution, the smaller particles will tend to fill in between the larger particle sizes. However, the larger particles should not generate undesirable coarse scratches on the semiconductor wafer surface.

Although not wishing to be bound by any theory, another approach to minimize the binder migration during curing is to use a binder precursor that is partially polymerized before it is incorporated into the slurry. The partially polymerized binder precursor will tend to have less mobility and therefor it should migrate less during complete polymerization or curing of the binder precursor. One such binder precursor that can be partially polymerized is an acrylate monomer. However, the binder precursor should not be polymerized to such a degree that when incorporated into a slurry, the resulting viscosity of the slurry is excessively high.

An example of an acrylate monomer that can be partially polymerized is isooctyl acrylate. A combination of a partially polymerized ethylenically unsaturated monomer with another ethylenically unsaturated monomer and/or a condensation curable binder can also be used. Additional details concerning partially polymerized ethylenically unsaturated monomers can be found in U.S. Pat. No. 5,256,170 (Harmer et al.) incorporated herein by reference.

Thermoplastic binders can also be used. Examples of suitable thermoplastic binders include: polyamides (nylon), polyethylene, polypropylene, polyesters, polyurethanes, polyetherimide, polysulfone, polystyrene, acrylonitrile-butadiene-styrene block copolymer, acetal polymers, polyvinyl chloride and combinations thereof.

It is also feasible to use a water-soluble binder precursor, which may be further blended with a thermosetting resin. The amount and type of binder precursor are selected to achieve an abrasive surface having the proper degree of erodibility for a particular planarization operation. Examples of water-soluble binder precursors include polyvinyl alcohol, hide glue, and water-soluble cellulose ethers (e.g., hydroxypropylmethyl cellulose, methyl cellulose and hydroxyethylmethyl cellulose). Additional details on this type of chemistry can be found in U.S. Pat. No. 4,255,164 (Butkze et al.) incorporated herein by reference.

The following discussion relates to materials that may be added to the organic resin in preparing the binder.

Plasticizer

The abrasive coating may optionally include a plasticizer. In general, the addition of the plasticizer will increase the erodibility of the abrasive article and soften the overall binder hardness. In some instances, the plasticizer will act as a diluent for the binder precursor. The plasticizer is preferably compatible with the binder to minimize phase separation. Examples of suitable plasticizers include polyethylene glycol, polyvinyl chloride, dibutyl phthalate, alkyl benzyl phthalate, polyvinyl acetate, polyvinyl alcohol, cellulose esters, phthalate, silicone oils (e.g., as described in U.S. Pat. No. 5,453,312 (Haas et al.)), adipate and sebacate esters, polyols, polyols derivatives, t-butylphenyl diphenyl phosphate, tricresyl phosphate, castor oil, combinations thereof and the like. The preferred plasticizers are phthalate derivatives.

The amount of plasticizer preferably is at least 25%, and preferably ranges from about 40% to about 75% by weight based on the total weight of the resin plus plasticizer. The particular weight percentage is selected to achieve the desired degree of erodibility. For example, the amount of plasticizer should not be so high that the resulting abrasive article is too erodible. Additionally, sometimes if there is too much plasticizer, there may be poor adhesion between the primer associated with the polyester film backing and the abrasive coating in abrasive articles featuring such a construction.

Although not wishing to be bound by any theory at this time, it is theorized that water-soluble or water-swellable plasticizers may at least partially leach out of the abrasive coating during semiconductor wafer planarization. When this occurs, it is postulated that it increases the overall erodibility of the abrasive coating. Thus in some instances, it is preferred to utilize water-soluble or water-swellable plasticizers.

Initiator

In the case of binder precursors containing ethylenically unsaturated monomers and oligomers, polymerization initiators may be used. Examples include organic peroxides, azo compounds, quinones, nitroso compounds, acyl halides, hydrazones, mercapto compounds, pyrylium compounds, imidazoles, chlorotriazines, benzoin, benzoin alkyl ethers, diketones, phenones, and mixtures thereof. Examples of suitable commercially available, ultraviolet-activated photoinitiators have tradenames such as "Irgacure 651" and "Irgacure 184" commercially available from the Ciba Geigy Company and "DAROCUR 1173" commercially available from Merck. Examples of suitable visible light-activated initiators can be found in U.S. Pat. No. 4,735,632. Another visible light-activated photoinitiator has the trade name "IRGACURE 369", commercially available from Ciba Geigy Company.

In the case of photopolymerizations, the initiator system may include a photosensitizer as well. Examples include compounds having carbonyl groups or tertiary amino groups and mixtures thereof. Among the preferred compounds having carbonyl groups are benzophenone, acetophenone, benzil, benzaldehyde, o-chlorobenzaldehyde, xanthone, thioxanthone, 9,10-anthraquinone, and other aromatic ketones which can act as photosensitizers. Among the preferred tertiary amines are methyldiethanolamine, ethyldiethanolamine, triethanolamine, phenylmethyl-ethanolamine, and dimethylaminoethylbenzoate. Commercially available examples of photosensitizers include those having the tradenames such as "Quanticure ITX", "Quanticure QTX", "Quanticure PTX", "Quanticure EPD" from Biddle Sawyer Corp. In general, the amount of photosensitizer or photoinitiator system may vary from about 0.01 to 10% by weight, more preferably from 0.25 to 4.0% by weight, based on the weight of the resin component of the binder precursor (i.e., monomers and/or oligomers).

Typically, the initiator is used in amounts ranging from 0.1 to 10%, preferably 2 to 4% by weight, based on the weight of the resin component of the binder precursor. Additionally, it is preferred to disperse (preferably uniformly) the initiator in the binder precursor prior to the addition of any particulate material, such as the abrasive particles and/or filler particles.

In general, it is preferred that the binder precursor be exposed to radiation energy, preferably ultraviolet light or visible light, to form the final binder. In some instances, certain abrasive particles and/or certain additives will absorb ultraviolet and visible light, which makes it difficult to properly cure the binder precursor. This phenomenon occurs, for example, with ceria abrasive particles and silicon carbide abrasive particles. It has been found, quite unexpectedly, that the use of phosphate containing photoinitiators, in particular acylphosphine oxide containing photoinitiators, tend to overcome this problem. An example of such a photoinitiator is 2,4,6-trimethylbenzoyldiphenylphosphine oxide which is commercially available from BASF Corporation, under the trade designation "Lucirin TPO". Other examples of commercially available acylphosphine oxides include "Darocur 4263" and "Darocur 4265" commercially available from Merck.

In some binder systems (e.g., where the binder is based upon an epoxy or vinyl ether), cationic initiators may be used to initiate polymerization. Examples include salts of onium cations, such as arylsulfonium salts, as well as organometallic salts such as ion arene systems. Specific examples are disclosed in U.S. Pat. Nos. 4,751,138 (Tumey et al.), 5,256,170 (Harmer et al.) and 4,985,340 (Palazotto), and U.S. Pat. No. 4,950,696, all incorporated herein by reference.

Dual-cure and hybrid-cure systems may also be used. In dual-cure systems, curing occurs in two separate stages, via either the same or different reaction mechanisms. In hybrid-cure systems, two curing mechanisms occur at the same time upon exposure to ultraviolet/visible or E-beam radiation.

Other Additives

The slurry can further comprise additives such as abrasive particle surface modification additives, coupling agents, fillers, expanding agents, fibers, anti-static agents, initiators, suspending agents, lubricants, wetting agents, surfactants, pigments, dyes, UV stabilizers, complexing agents, chain transfer agents, accelerators, catalysts, and activators. The amounts of these materials are selected to provide the properties desired.

Expanding agents may be included to increase the erodibility of the abrasive article. The expanding agent can be any material that increases the volume of the abrasive coating. It is preferred that when an expanding agent is employed, the average particle size of the abrasive particles is less than 30 micrometers.

Examples of suitable expanding agents include steam, swelling solvents, nitrogen gas, carbon dioxide gas, air as a gas, pentane, hexane, heptane, butene, $CFCl_3$, $C_2F_3Cl_3$, vermiculite, toluene diisocyanate, 4,4'-diphenylmethane diisocyanate, hexamethylene diisocyanate, or polyurethane prepolymer which reacted with water to generate carbon dioxide gas. Other suitable expanding agents include a decomposition-type expanding agent such as ammonium carbonate, ammonium bicarbonate, sodium bicarbonate, dinitropentamethylenetetramine, azodicarbonamide, azobisisobutylonitrile, hydradine compounds such as maleic acid hydrazide, oxalic acid hydrazide, benzenesulfonyl hydrazide, toluenesulfonyl hydrazide, p,p'-hydroxy bis (benzene-sulfonyl hydrazide), and t-alkylhydrazonium salt. Two or more expanding agents may be used in combination with each other. An example of an expanding agent is an expanding bead commercially available from the Kema Nobel Company, Sundsvall, Sweden under the trade designation "Expancel 551".

Examples of antistatic agents include graphite, carbon black, vanadium oxide, conductive polymers, humectants, and the like. These antistatic agents are disclosed in U.S. Pat. Nos. 5,061,294; 5,137,542; and 5,203,884, incorporated herein by reference.

An example of a suspending agent is an amorphous silica particle having a surface area less than 150 meters square/gram that is commercially available from DeGussa Corp. under the trade name "OX-50". The addition of the suspending agent can lower the overall viscosity of the slurry. The use of suspending agents is further described in U.S. Pat. No. 5,368,619 (Culler), incorporated herein by reference.

Examples of suitable lubricants include metal salts of fatty acids (e.g., zinc stearate, calcium stearate, and lithium stearate), graphite, waxes, glycol ethers, glycerine, silicone compounds, combinations thereof and the like. Encapsulated lubricants may also be used, e.g., as described in U.S. Pat. No. 3,502,453 (Baratto) incorporated herein by reference.

Examples of chain transfer agents include carbon tetrabromide and other chain transfer agents described in "Principles of Polymerization" by G. Odian, Wiley-Interscience, New York, 1991.

Examples of suitable complexing agents (particularly in the case of silicon dioxide-containing wafer surfaces) include ammonium salts such as $NH_4HCO_3$, tannic acid, catechol, $[Ce(OH)(NO)_3]$; $Ce(SO_4)_2$, phthalic acid, salicyclic acid and the like. These complexing agents may be in the form of particulates that can be added to the slurry.

Water and/or organic solvent can be incorporated into the slurry. The amount of water and/or organic solvent is selected to achieve the desired coating viscosity. In general, the water and/or organic solvent should be compatible with the binder precursor. The water and/or solvent may be removed following polymerization of the precursor, or it may remain with the binder. Water soluble and/or water sensitive additives such as polyvinyl alcohol, polyvinyl acetate, cellulosic based particles and the like may also be included to increase the erodibility of the abrasive surface.

Ceramer Binders

Another suitable type of binder is a ceramer binder. "Ceramer" is a term used to identify a curable material containing at least one component that is 1) a precursor of a ceramic or a ceramic particle (i.e., metal oxide particle) and 2) at least one component that is a binder precursor (i.e., precursor of a polymer). The cured ceramer is formed from a ceramer binder precursor comprising: 1) a dispersing liquid, 2) a binder precursor and 3) non-aggregated colloidal metal oxide particles dispersed in the dispersing liquid and the binder precursor. The dispersing liquid can be water (including tap water, distilled water and deionized water) or an organic solvent (including aqueous alcohol solutions, lower aliphatic alcohols, toluene, ethylene glycol, dimethyl acetamide, formamide, and combinations thereof). The preferred dispersing liquid is water, preferably distilled or deionized water. It is preferred that the amount of water in the dispersing liquid is at least 10% by weight, preferably at least 12% by weight and more preferably at least 15% by weight of the total dispersing liquid (i.e., includes the water, binder precursor and not the colloidal metal oxide particles). The preferred binder precursors include ethylenically unsaturated monomers, ethylenically unsaturated oligomers, epoxy resins and combinations thereof.

Suitable colloidal metal oxide particles are non-aggregated metal oxide particles dispersed in a liquid medium to form a sol. These metal oxide particles have an average particle diameter of from about 5 to about 1000 nanometers, preferably from about 10 to about 100 nanometers, and more preferably from about 10 to about 50 nanometers. In some instances these small metal oxide particles will tend to agglomerate due to interparticle attraction. Thus, these metal oxide agglomerates will be greater in particle size than the individual metal oxide particles. These metal oxide particle size ranges are preferred on the basis of both ease of dispersing the metal oxide particles in the binder precursor and the surface finish that will be generated by the abrasive article derived therefrom.

The metal oxide sol particles may be formed of any metal oxide, in any oxidation state. Examples of preferred metal oxides include silica, alumina, zirconia, chromia, antimony pentoxide, vanadia, ceria, titania, with silica being most preferred. In general, silicon is considered to be a non-metal. However, for this aspect of this invention, silicon is considered to be a metal.

The colloidal metal oxide particles are provided as a sol, rather than as a powder or a gel. In the sol state, the colloidal metal oxide particles are dispersed in a liquid medium. When the colloidal metal oxide particles are dispersed in water, the particles are stabilized on account of common electrical charges on the surface of each particle, which tends to promote dispersion rather than agglomeration. The like charged particles repel one another, thereby minimizing aggregation. By contrast, in the powder state, such as in fumed silica or silica gel, uncharged colloidal particles will agglomerate to form networks and thus will not provide a uniform dispersion of particles when combined with the organic component of the ceramer. Ceramers are easily distinguished from other materials that comprise a binder precursor but are filled with agglomerated colloidal metal oxide particles. When the colloidal metal oxide particles in a ceramer are derived from a sol, the ceramer can remain a free-flowing liquid even at loadings of colloidal metal oxide particles exceeding 50% by weight. On the other hand, when the colloidal metal oxide particles derived from a sol are replaced with the same weight fraction of agglomerated colloidal metal oxide particles, wetted powders result.

Sols useful for preparing ceramers can be prepared by methods well-known in the art. Colloidal silicas dispersed as sols in aqueous solutions are also available commercially under such trade names as "LUDOX" (E.I. Dupont de Nemours and Co., Inc. Wilmington, Del.), "NYACOL" (Nyacol Co., Ashland, Mass.), and "NALCO" (Nalco Chemical Co., Oak Brook, Ill.). Non-aqueous silica sols (also called silica organosols) are also commercially available under such trade names as "NALCO 1057" (a silica sol in 2-propoxyethanol, Nalco Chemical Co.), and "MA-ST", "IP-ST", and "EG-ST" (Nissan Chemical Industries, Tokyo, Japan). Sols of other oxides are also commercially available, e.g., "NALCO ISJ-614" and "NALCO ISJ-613" alumina sols, and "NYACOL 10/50" zirconia sol. These colloidal silica sols can contain anywhere from about 10 to 85% by weight water, typically between 25 to 60% by weight water. Two or more different colloidal silicas can also be used.

Among the ceramers, those having non-aggregated metal oxide particles functionalized with coupling agents have processing advantages over ceramers having non-aggregated metal oxide particles not functionalized with coupling agents. These coupling agents can be organosilanes (e.g., 3-methacryloxyalkyl trimethoxysilane, methacryloxyalkyl trimethoxysilane, phenyl trichlorosilane, phenyltrimethoxysilane, phenyl triethoxysilane, vinyltrimethoxysilane, vinyl triethoxysilane, methyltrimethoxysilane, methyl triethoxysilane, propyltrimethoxysilane, propyl triethoxysilane, octyltriethoxysilane and mixtures thereof), titanates (e.g., isopropyl trisosteroyl titanate), zircoaluminates and combinations thereof. The ceramers having colloidal metal oxide particles functionalized with coupling agents tend to have a lower viscosity than those not functionalized with coupling agents. This reduction in viscosity can then allow the ceramer binder precursor to be filled with more abrasive particles than those ceramers having non-functionalized colloidal metal oxide particles and still provide coatable or processable mixtures. The degree of functionalization of the colloidal metal oxide particles required to allow mixtures comprising ceramer and abrasive particles to remain coatable depends to a large extent on the concentration of colloidal metal oxide particles, the nature of the binder precursor, and the type of coupling agent. If not enough coupling agent is added, the metal oxide particles in the ceramer may not be properly dispersed, which tends to lead to a higher viscosity of the overall ceramer. Conversely, if too much coupling agent is added, this can lead to an overall increase in cost and/or the ceramer may gel. Likewise, if the coupling agent is trifunctional, too much of a trifunctional coupling agent may result in premature gellation of the ceramer.

The coupling agent should be compatible with the chemistry of the binder precursor. If the coupling agent is not compatible with the binder precursor, there may be phase separation or, alternatively, the ceramer may gel. Sometimes this gellation occurs immediately after the ceramer is made and other times this gellation occurs within hours after the ceramer is made. It is preferred that the ceramer have a stable viscosity over a period of at least 24 hours.

In some instances, there may be a blend of two coupling agents to provide the appropriate reduction in viscosity and the appropriate compatibility with the binder precursor. For instance, when the binder precursor is hydroxy ethyl acrylate and the metal oxide particles are silica, the preferred coupling agent is a blend of 3-methacryloxypropyltrimethoxysilane and a polyethylene oxide group-containing trialkoxy silane coupling agent commercially available from OSI, Danbury, Conn. under the trade designation "A1230". Another useful polyethylene oxide group-containing trialkoxysilane with a urethane group may be obtained from reaction of 2-isocyanotriethyltriethoxysilane ("A-1310" commercially available from OSI) with Carbowax PEG 350, a methoxy end capped polyethylene glycol having a molecular weight of about 350, available from Union Carbide.

The general method of making the ceramer binder precursor comprises the steps of:
a) providing a metal oxide sol in an inert liquid, such as water,
b) providing a dispersing liquid comprising a binder precursor (preferably an ethylenically unsaturated binder precursor), optionally a coupling agent and optionally water;
c) dispersing the metal oxide sol into the dispersing liquid;
d) optionally removing a portion of the inert liquid to form a ceramer binder precursor.

In the preferred form, the ceramer binder precursor comprises at least 5%, preferably at least about 10% by weight, more preferably at least about 12% by weight and even higher than 15% by weight water based upon the combination of the water and the binder precursor.

The preferred binder precursors for the ceramers are selected from the group consisting of ethylenically unsaturated monomers, ethylenically unsaturated oligomers, epoxy resins and combinations thereof. The more preferred binder precursor is an ethylenically unsaturated monomer(s). Many ethylenically unsaturated binder precursors are not compatible with water. Thus, the preferred ethylenically unsaturated binder precursors are compatible with water and are even soluble in water. Examples of such binder precursors include: hydroxy ethyl acrylate, hydroxy ethyl methacrylate, hydroxy propyl acrylate, hydroxy propyl methacrylate, hydroxy butyl acrylate, hydroxy butyl methacrylate, acrylamide, N,N-dimethyl acrylamide and the like.

In general, the concentration of colloidal metal oxide particles in the ceramer can be as high as 70% by weight, with the preferred concentration ranging from about 15% to about 60% by weight. The coupling agent may range anywhere from about 1 to 10% by weight of the metal oxide particles, preferably between 1 to 5% by weight of the metal oxide particles.

After the ceramer is made, the abrasive particles are added or dispersed into the ceramer sol to form a slurry. There may be an additional coupling agent added to the ceramer to improve the dispersability of the abrasive particles in the ceramer sol. Alternatively, the abrasive particles may have been pretreated with another coupling agent. The coupling agent for the metal oxide particles in the ceramer binder precursor may be the same or it may be different from the coupling agent for the abrasive particles. Likewise after the ceramer binder precursor is made, an initiator may be added along with the abrasive particles. The initiator can help to accelerate the polymerization of the binder precursor to form the binder.

In some instances, the ceramer binder precursor may contain excess water, i.e., for some reason there is excess water which can be undesirable either from a processing and/or a product performance viewpoint. If there is excess water, the water may be removed by any conventional technique. These techniques include vacuum stripping, distillation and the like, with vacuum stripping being preferred. It is preferred that the water be removed to the desired level prior to the addition of the abrasive particles. If too much water is removed from the ceramer binder precursor, it may be difficult to add more water to the ceramer binder precursor.

One example of a useful slurry comprises by weight about 1 to about 50 parts colloidal metal oxide particles, (preferably silica particles), about 2 to about 60 parts ethylenically unsaturated binder precursor, 0.1 to 50 parts coupling agent and about 0.1 to about 50 parts water. In another example the ceramer binder precursor comprises by weight about 3 to about 50 parts colloidal metal oxide particles, (preferably silica particles), about 5 to about 35 parts ethylenically unsaturated binder precursor, about 0.1 to about 20 parts coupling agent and about 1 to about 45 parts water. In yet another example the slurry comprises by weight about 5 to about 15 parts colloidal metal oxide particles, (preferably silica particles), about 5 to 20 parts ethylenically unsaturated binder precursor, about 0.5 to about 6 parts coupling agent and about 1 to 20 parts water.

After the slurry is made, it is further processed to convert or crosslink the binder precursor into a binder and thus the slurry is converted into an abrasive composition. It is preferred that during the process, not all of the water be removed prior to the polymerization of the ethylenically unsaturated binder precursor. Although not wishing to be bound by any theory, it is theorized that there may be residual water either present in the abrasive coating and/or the water that is removed (typically by evaporation) creates voids in the abrasive coating. Again not wishing to be bound by any theory, it is contemplated that this residual water and/or voids results in an abrasive composition that has a degree of erodibility very suitable for semiconductor wafer planarization.

The ceramer binder tends to be harder than many other binders, due in part to the presence of the colloidal metal oxide particles. The abrasive articles comprising these ceramer binders tend to have excellent performance attributes in regards to semiconductor wafer planarization. Although not wishing to be bound by any theory, it is theorized that it may be the combination of a hard binder and an erodible binder that provides the resulting abrasive article with these excellent performance attributes. It is possible that the hard binder contributes to a relatively high cut rate, but does not adversely cause deep or coarse scratches due to the erodibility of the abrasive coating. The abrasive particles are expelled at such rate as to minimize any coarse scratching.

5. Abrasive Article Configuration

There are many different forms of three-dimensional, textured, fixed abrasive articles. Examples of representative forms are schematically shown in FIGS. 4 though 12.

One preferred abrasive article features a plurality of abrasive composites (as defined in the Summary of the Invention, above). These abrasive composites can be precisely shaped (as defined in the Summary of the Invention, above) or irregularly shaped, with precisely shaped composites being preferred. Such a precise shape can be formed, for example, by curing the binder precursor in the slurry while the slurry is both being formed on a backing and filling a cavity on the surface of a production tool, as described in greater detail, below.

The abrasive composite shape can be any shape. Typically the surface area of the base side of the shape that is in contact with the backing is larger in value than that of the distal end of the composite spaced from the backing. The shape of the composite can be selected from among a number of geometric shapes such as a cubic, cylindrical, prismatic, rectangular, pyramidal, truncated pyramidal, conical, truncated conical, cross, and post-like with a top surface which is flat. Another shape is hemispherical as described in PCT WO 95/224,436. The resulting abrasive article can have a mixture of different abrasive composite shapes. The abrasive composites may be arranged in rows, spiral, helix, corkscrew, or lattice fashion, or may be randomly placed.

The sides forming the abrasive composites may be perpendicular relative to the backing or they can be tapered with diminishing width toward the distal end. If the sides are tapered, it is easier to remove the abrasive composite from the cavities of the production tool. The angle forming the taper can range from about 1 to 75 degrees, preferably from about 2 to 50 degrees, more preferably from about 3 to 35 degrees and most preferably between about 5 to 15 degrees. The lower angles tend to be preferred because this tends to result in a more uniform cross sectional area along the height of the abrasive composite. Thus, in general, the taper angle is a compromise between an angle large enough to remove the abrasive composite from the production tool and small enough to create a uniform cross sectional area. The constant cross sectional area is preferred because this provides a more consistent abrasive coating surface area during planarization. This in turn leads to a more consistent cut rate, flatness and surface finish. One preferred shape is a cylinder having a taper angle between 10 to 15 degrees.

The height of each composite in the same abrasive article is preferably the same, but it is possible to have composites of varying heights. The height of the composites generally can be a value up to about 200 micrometers, and more particularly in the range of about 25 to 200 micrometers. The diameter or cross sectional width of the abrasive composite can range from about 5 to 500 micrometers, typically between about 10 to 250 micrometers and preferably between 15 to 150 micrometers.

Figure 12:
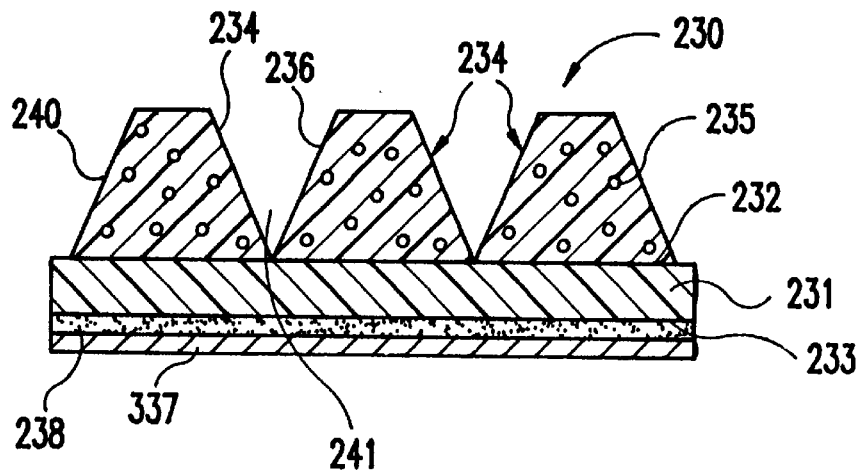
FIGS. 9–12 are enlarged cross sectional views of portions of additional three-dimensional, textured, fixed abrasive articles useful in the process of the present invention.

In the case of pyramids such as illustrated in FIGS. 4, or truncated pyramids such as illustrated in FIG. 12, the pyramidal shape preferably has four to five sides if untruncated, and five to six sides if truncated (inclusive of the base side), although a larger number of sides may be used as well. Where a pyramidal or truncated pyramidal shape is used as the composite shape, the base side lengths generally can have a length of from about 100 to 500 micrometers.

In the case of cross-shaped composites, the cross comprises two essentially straight linear features that intersect one another. Alternatively, the lines may be wavy or non-straight. The two lines may intersect one another at an angle between 1 to 90 degrees, preferably between 45 to 90 degrees. In those embodiments of abrasive articles in which the backing includes straight sides, one of the two lines may be parallel to the sides of the backing. Alternatively, one of the two lines may be at an angle less than 180° relative to the side of the backing. For this cross-shaped pattern, it is preferred that the lines comprising the cross have a length from about 50 to 1500 micrometers, preferably about 100 to 1000 micrometers and more preferably 250 to 800 micrometers. The height of the abrasive composite will range from about 10 to 2000 micrometers, preferably between 25 to 500 micrometers and more preferably between 50 to 100 micrometers. The taper angle will range from about 5 to 30 degrees, preferably between 10 to 20 degrees and most preferably between 15 to 20 degrees. The top or outermost surface of the cross-shaped abrasive composite, will have a width between about 10 to 250 micrometers, preferably between 25 to 150 micrometers and more preferably between 50 to 125 micrometers.

In any of the abrasive articles described herein, all of the abrasive composites may have essentially the same shape and size, but the orientation of individual abrasive composites may be different from one another relative to a reference point. If the abrasive article contains a backing, then the reference point may be a plane that is tangent to a point on the side of the backing. One potential advantage of rotating the abrasive composite relative to an adjacent abrasive composite is to increase the packing density of abrasive composites that have a certain shape. In some embodiments, an adjacent abrasive composite is rotated between 5 to 355 degrees, relative to its nearest neighbor. In those embodiments in which adjacent composites are rotated relative to one another, an adjacent abrasive composite is typically rotated between 30 to 120 degrees. In one embodiment, adjacent abrasive composites are rotated about 45 degrees from one another. In another embodiment, the adjacent abrasive composites are mirror images of each other.

It is also possible for all of the abrasive composites to be identically shaped and oriented. Constructions are also possible in which the composites have different shapes and different orientations.

The base of the abrasive composites can abut one another or alternatively, the bases of adjacent abrasive composites may be separated from one another by some specified distance. In some embodiments, the physical contact between adjacent abrasive composites involves no more than 33% of the vertical height dimension of each contacting composite. More preferably, the amount of physical contact between the abutting composites is in the range of 1 to 25% of the vertical height of each contacting composite. It is to be understood that this definition of abutting also covers an arrangement where adjacent composites share a common abrasive material land or bridge-like structure which contacts and extends between facing sidewalls of the composites. Preferably, the land structure has a height of no greater than 33% of the vertical height dimension of each adjacent composite. The abrasive material land is formed from the same slurry used to form the abrasive composites. The composites are "adjacent" in the sense that no intervening composite is located on a direct imaginary line drawn between the centers of the composites.

It is preferred that at least portions of the abrasive composites be separated from one another so as to provide the recessed areas between the raised portions of the composites as described above. Although not wishing to be bound by any theory, it is postulated that this separation provides a means to allow the liquid medium to freely flow between the abrasive composites. It is believed then that this free flow of the liquid medium may contribute to a better cut rate, surface finish, and/or flatness during semiconductor wafer planarization.

The spacing of the abrasive composites can vary from about 1 abrasive composite per linear cm to about 100 abrasive composite per linear cm, preferably between about 5 abrasive composite per linear cm to about 80 abrasive composite per linear cm, more preferably between about 10 abrasive composite per linear cm to about 60 abrasive composite per linear cm, and most preferably between about 15 abrasive composite per linear cm to about 50 abrasive composite per linear cm. In addition, the spacing can be varied such that the concentration of composites is greater in one location than in another (e.g., the concentration may be greatest in the center of the surface).

In some embodiments, there is an area spacing density of at least 1,200 composites/cm$^2$, said composites each comprising a plurality of abrasive particles and a binder. In a further embodiment of the invention, the area spacing density of composites ranges from about 1 to 12,000 composites/cm$^2$, preferably at least about 50 to 7,500 abrasive composites/cm$^2$, and more preferably at least about 50 to 5,000 abrasive composites/cm$^2$.

It is also feasible to have areas of the backing exposed, i.e., where the abrasive coating does not cover the entire surface area of the backing. This type of arrangement is further described in U.S. Pat. No. 5,014,468 (Ravipati et al.) incorporated herein by reference.

The abrasive composites are preferably provided in a predetermined pattern. That is, the composites are provided at predetermined locations. For example, in the abrasive article made by providing a slurry between the backing and a production tool having cavities therein, the predetermined pattern of the composites will correspond to the pattern of the cavities on the production tool. The pattern is thus reproducible from article to article.

In one version of the predetermined pattern, the abrasive composites can be in an array or arrangement, by which is meant that the composites are in a regular array such as aligned rows and columns, or alternating offset rows and columns. In some instances, the one row of abrasive composites can be directly aligned in front of a second row of abrasive composites. Alternatively, one row of abrasive composites can be offset from the second row of abrasive composites. It is preferred that adjacent rows of abrasive composites are offset from one another.

Alternatively, the composites can be deployed in a "random" array or configuration. By this it is meant that the composites are not in a regular array of rows and columns as described above. For example, the abrasive composites may be arranged in a manner as described in WO PCT 95/07797 published Mar. 23, 1995 (Hoopman et al.) and WO PCT 95/22436 published Aug. 24, 1995 (Hoopman et al.). It is understood, however, that this "random" array is a predetermined pattern in that the location of the composites on the abrasive article is predetermined and corresponds to the location of the cavities in the production tool used to make the abrasive article.

The three-dimensional, textured, fixed abrasive article also may have a variable abrasive coating composition. For example, the center of a fixed abrasive disc may contain an abrasive coating that is different (e.g., "softer, harder, or more or less erodible) from the outer region of the abrasive disc.

Particular configurations are shown in FIGS. 4–12.

Referring to FIG. 4, abrasive article 50 comprises backing 59 having front surface 58 in which abrasive coating 57 is bonded on front surface 58 of backing 59. Abrasive coating 57 is three-dimensional and comprises a plurality of abrasive composites 54. In this particular embodiment, abrasive composites 54 are pyramids. There are recesses or valleys 53 between adjacent abrasive composites. There is also more than one row of pyramidal abrasive composites shown in which the second row of abrasive composites is offset from the first row. Abrasive composites 54 comprise a plurality of abrasive particles 56 dispersed in binder 55. Outermost point or distal end 51 of abrasive composites 54 contacts the semiconductor wafer during planarization.

Figure 5:
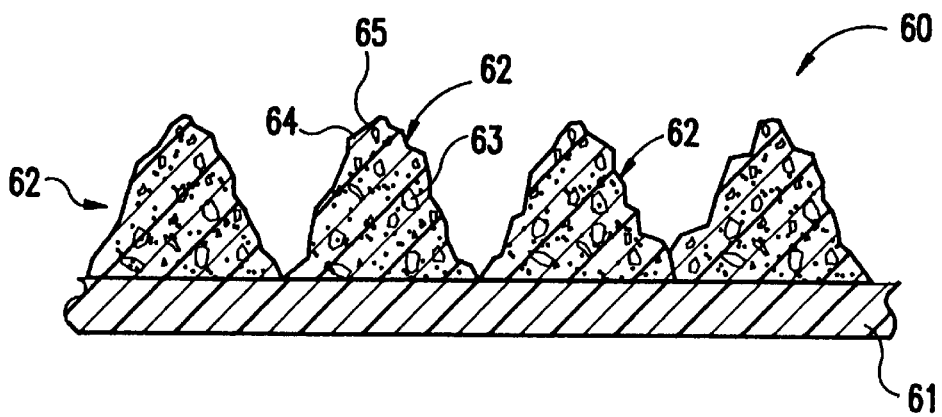
FIG. 5 is an enlarged cross sectional view of a portion of another three-dimensional, textured, fixed abrasive article useful in the process of the present invention.

FIG. 5 illustrates an abrasive composite that has an irregular shape. The abrasive article 60 comprises backing 61 and bonded to the backing is a plurality of abrasive composites 62. Inside the abrasive composites is a plurality of abrasive particles 63 dispersed in binder 64. In this particular illustration, the abrasive composite has a pyramidal type shape. Boundaries 65 which define the pyramid are irregularly shaped. The imperfect shape can be formed by the slurry flowing and distorting the initial shape prior to curing or solidification of the binder precursor. These non-straight, non-clear, non-reproducible, inexact or imperfect planes or shape boundaries is what it is meant by an irregular shape.

Figure 6:
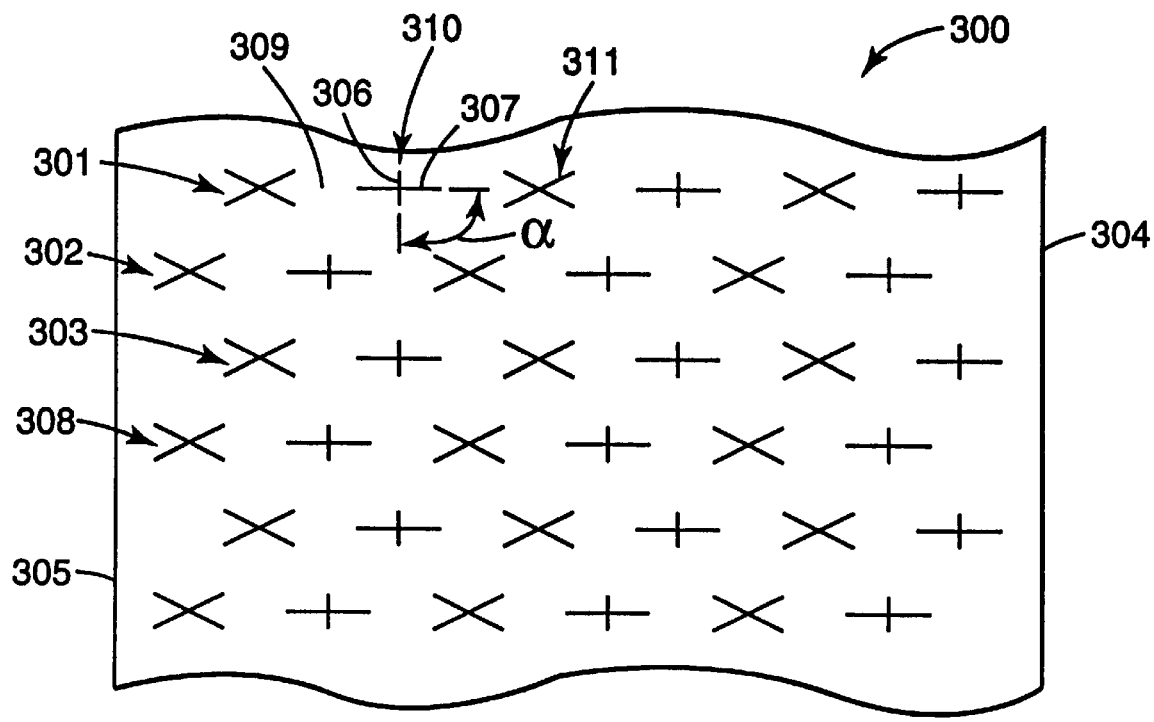
FIG. 6 is a top plan view of a portion of a three-dimensional, textured, fixed abrasive article useful in the process of the present invention.

Referring to FIG. 6, FIG. 6 is a top view of an arrangement of abrasive composites 300. These abrasive composites have a "cross" shape 310 and an "x" shape 311 associated with them. Abrasive composites are bonded to a backing and this backing has two sides 304 and 305. In this particular illustration, there are four rows of abrasive composites 301, 302, 303 and 308. The abrasive composites in rows 301 and 303 are positioned on the backing in an identical manner. Likewise abrasive composites in rows 302 and 308 are positioned on the backing in an identical manner.

The abrasive composites from row 301 and the adjacent row 302 are offset from one another, i.e., the abrasive composites in row 301 do not directly align with the abrasive composites in row 302. Although not illustrated in FIG. 6, the shape and/or orientation of the individual abrasive composites from adjacent rows may be the same.

Abrasive composite 310 consists of two intersecting lines 306 and 307 that intersect at an angle alpha. Line 306 may be parallel to backing sides 304 and 305 or line 306 may be non-parallel. Line 307 may intersect backing sides 304 and 305 at an angle of 90 degrees or less. In FIG. 6, abrasive composites 310 and 311 do not abut one another, but rather are separated by space or valley 309. In some instances, the valley may consist of a very small amount (i.e., height) of abrasive composite. Valley 309 may consist of no abrasive composite and in this case, the backing is exposed.

Another preferred arrangement of abrasive composites is similar to FIG. 6, except that each alternating row comprises either abrasive composites having the "cross" shape or abrasive composites having the "x" shape. In this arrangement, the abrasive composites from the odd rows are still offset from the abrasive composites from the even rows.

In the above described arrangements of cross-shaped or "x"-shaped composites, it is preferred that the length of one line forming either the cross or the x shape is about 750 micrometers and the width of one line forming either the cross or the x shape is about 50 micrometers. There is approximately 1270 micrometers distance between the center of one cross to the center of the adjacent x-shaped abrasive composite.

Figure 7:
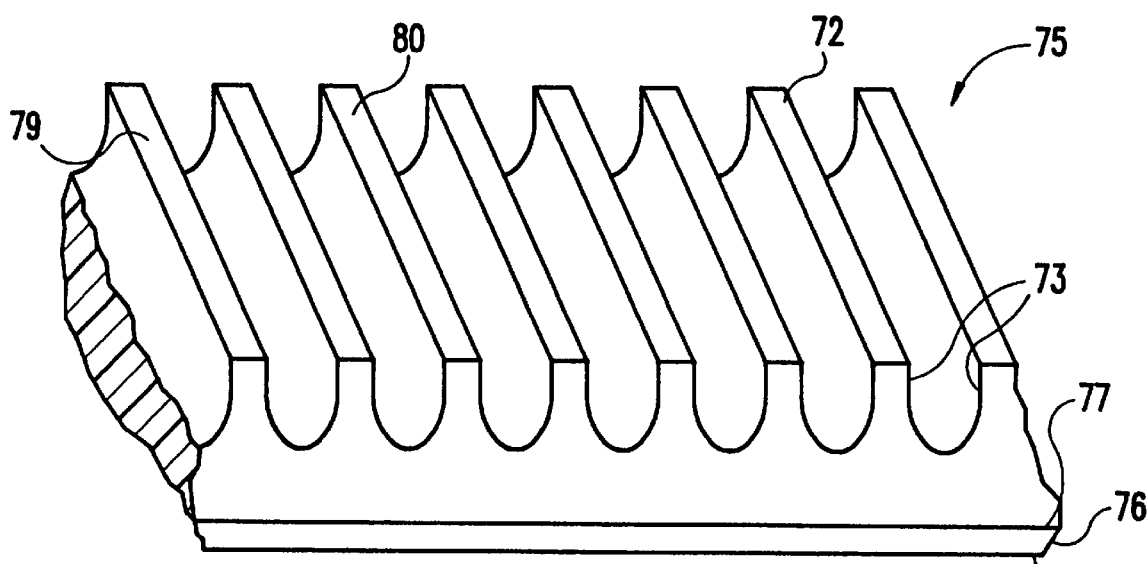
FIG. 7 is an isometric view of a portion of a three-dimensional, textured, fixed abrasive article useful in the process of the present invention.

Referring to FIG. 7, abrasive article 75 comprises backing 76 having front surface 77 and back surface 78. Abrasive coating 79 consists of series of abrasive composites 80; the binder and abrasive particles are omitted for the sake of simplicity. Abrasive composites 80 have a ridge shape. Ridges 80 are separated by valleys 73. Ridges 80 have upper section 72 that contact the semiconductor wafer during planarization. These ridges are typically continuous and can have any cross sectional shape.

In another embodiment, the ridges of the abrasive composites are non-parallel and non-perpendicular relative to the sides forming the abrasive backing. This type of arrangement is further described in U.S. Pat. No. 5,489,235 (Gagliardi et al.) incorporated herein by reference.

Referring to FIG. 12, abrasive article 230 comprises backing 231 having pressure sensitive adhesive coating 238 and a protective liner 237. Over front surface 232 of backing 231 is abrasive coating 240. Abrasive coating 240 is three-dimensional and comprises a plurality of abrasive composites 234. There are openings or valleys 241 between adjacent abrasive composites. In this particular example, abrasive composites 234 are truncated pyramids. Abrasive composites 241 comprise a plurality of abrasive particles 235 and binder 236.

Figure 10:
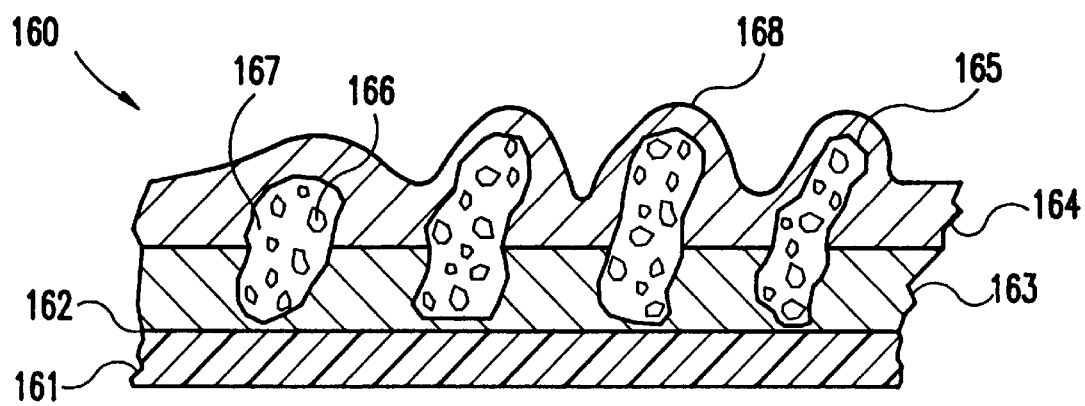

Another abrasive construction that may be useful for semiconductor wafer polishing is a coated abrasive containing abrasive agglomerates. Referring to FIG. 10, coated abrasive 160 comprises backing 161 having front surface 162. First binder 163 is applied over front surface 162 and embedded into first binder 163 are plurality of abrasive agglomerates 165. Abrasive agglomerates 165 comprise binder 167 and abrasive particles 166. Over abrasive agglomerates 165 is second binder 164 to form outermost surface 168 of the abrasive article. In FIG. 10, the abrasive agglomerates are irregularly shaped. The abrasive agglomerates can be made by any technique such as that illustrated in U.S. Pat. Nos. 4,652,275 (Bloecher) and 4,799,939 (Bloecher et al.), incorporated herein by reference.

Figure 11:
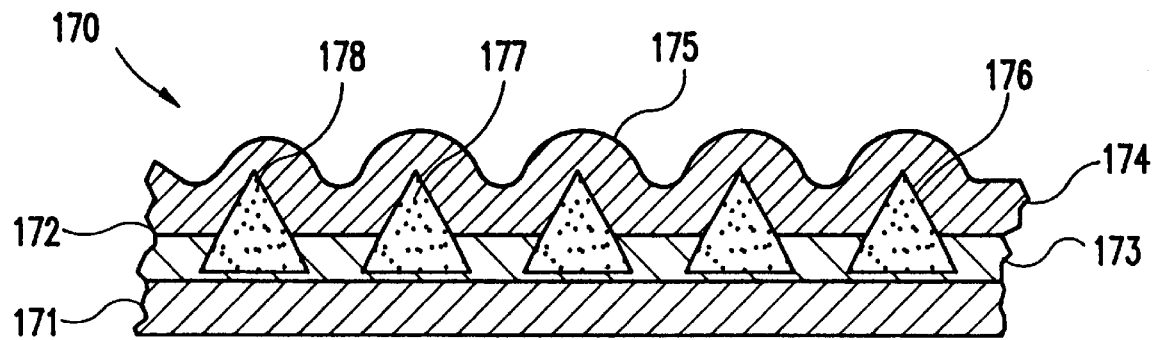

Referring to FIG. 11, coated abrasive 170 comprises backing 171 having front surface 172. First binder 173 is applied over front surface 172 and embedded into first binder 173 are plurality of abrasive agglomerates 175. Abrasive agglomerates 175 comprise binder 177 and abrasive particles 176. Over abrasive agglomerates 175 is second binder 174 to form outermost surface 178 of the abrasive article. In FIG. 11, the abrasive agglomerates are precisely shaped. The abrasive agglomerates can be made by any molding or other technique such as that illustrated in U.S. Pat. No. 5,500,273 (Holmes et al.).

Supersize Coating

A supersize coating may be applied over the abrasive coating using conventional techniques such as roll coating, spray coating, hot melt coating, and the like. This supersize coating may serve several functions. For example, the supersize coating tends to reduce the friction between the abrasive article and the semiconductor wafer during planarization. The supersize coating may also prevent the build up of debris generated during planarization from adhering to the abrasive article.

The supersize coating may typically comprise a loading-resistant material such as metal salts of fatty acids (e.g., zinc stearate, aluminum stearate, calcium stearate, or lithium stearate), graphite, waxes, glycol ethers, glycerine, silicone compounds, crosslinked alkoxy silanes (e.g., as described in U.S. Pat. No. 5,213,589 (Ronning), incorporated herein by reference), polycarbamates and the like. A binder may be included as well.

B. Manufacture

Precisely Shaped Composites

The preferred method for making a useful abrasive article having precisely shaped abrasive composites is described in U.S. Pat. Nos. 5,152,917 (Pieper et al) and 5,435,816 (Spurgeon et al.) and incorporated herein by reference. Manufacture is preferably conducted in a clean room type environment (e.g., a class 100, class 1,000, or class 10,000 clean room) to minimize any contamination in the abrasive article.

Other descriptions of suitable methods can be found in U.S. Pat. No. 5,437,754; U.S. Pat. Nos. 5,454,844 (Hibbard et al.), 5,437,7543 (Calhoun); 5,435,816 (Spurgeon et al.) and 5,304,223 (Pieper et al.), all incorporated herein after by reference.

One preferred method involves:

a) preparing a slurry comprising abrasive particles, binder precursor and optional additives;

b) providing a production tool having a front surface and having a plurality of cavities that extend from the front surface;

c) introducing the slurry into the cavities of the production tool;

d) introducing a backing to the front surface of the production tool such that the slurry wets one major surface of the backing to form an article;

e) at least partially curing or gelling the binder precursor before the article departs from the outer surface of the production tool;

f) removing the resulting abrasive article from the production tool to form an abrasive article having precisely shaped abrasive composites bonded to a backing;

g) optionally further curing the binder precursor.

Figure 15:
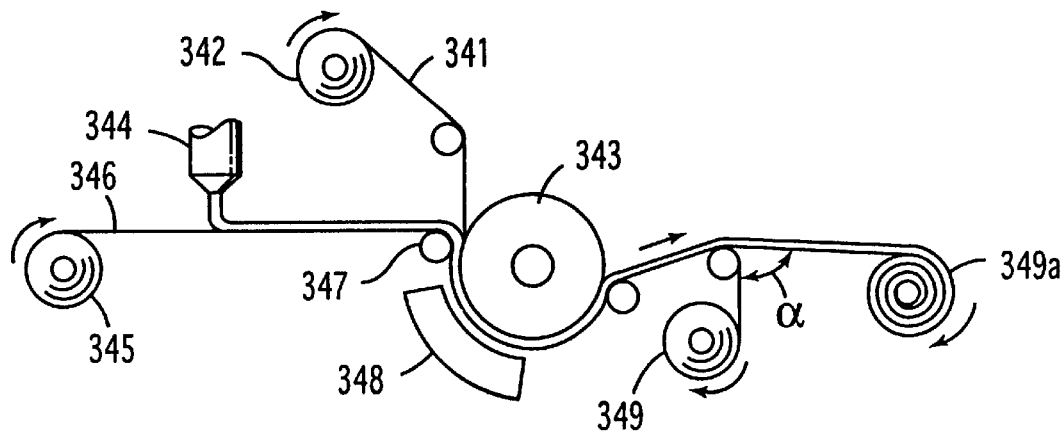
FIG. 15 is a schematic representation of one process for making a three-dimensional, textured, fixed abrasive article useful in the process of the present invention.

This process is further illustrated in FIG. 15. Referring to FIG. 15, backing 341 leaves an unwind station 342, and at the same time the production tool (pattern tool) 346 leaves an unwind station 345. Production tool 346 is coated with slurry by means of coating station 344.

The slurry is made by combining together by any suitable mixing technique the binder precursor, the abrasive particles and the optional additives. Examples of mixing techniques include low shear and high shear mixing, with high shear mixing being preferred. Ultrasonic energy may also be utilized in combination with the mixing step to lower the slurry viscosity (the viscosity being important in the manufacture of the abrasive article) and/or affect the rheology of the resulting abrasive slurry. Another means is to use solvent or water in the slurry, or to use surface treatments with the abrasive and/or filler particles. Still another means is to heat the slurry (e.g., in the range of 30 to 70° C.). Additionally another means is use to microfluidized or ball mill the slurry prior to coating.

Typically, the abrasive particles are gradually added into the binder precursor. It is preferred that the slurry be a homogeneous mixture of binder precursor, abrasive particles and optional additives. If necessary water and/or solvent can be added to lower the viscosity. The formation of air bubbles may be minimized, e.g., by pulling a vacuum either during or after the mixing step. Alternatively, in some instances it is preferred to introduce air bubbles in the slurry. After curing, these air bubbles remain in the abrasive coating to form porosity.

The coating station can be any conventional coating means such as drop die coater, knife coater, curtain coater, vacuum die coater or a die coater. The preferred coating technique is a vacuum fluid bearing die, such as described in U.S. Pat. Nos. 3,594,865; 4,959,265 (Wood); and 5,077,870 (Millage), which are incorporated herein by reference. During coating, the formation of air bubbles is preferably minimized. Conversely, in some instances, it may be preferred to incorporate air into the slurry as the slurry is being coated into the production tool. This entrapped air can led to porosity (i.e., voids) in the abrasive coating and possibly increase the erodibility of the abrasive coating. Additionally, air can be pumped into the slurry either during mixing or coating.

After the production tool is coated, the backing and the slurry are brought into contact by any means such that the slurry wets the front surface of the backing.

In FIG. 15, the slurry is brought into contact with the backing by means of contact nip roll 347. Contact nip roll 347 forces the resulting construction against support drum 343. The nip roll can be made from any material; however, it is preferred that the nip roll be made from a structural material such as metal, metal alloys, rubber or ceramics. The hardness of the nip roll can vary anywhere from about 30 to 120 durometer, typically between 60 to 100 durometer and preferably about 90 durometer.

Next, some form of energy preferably is transmitted into the slurry to at least partially cure the binder precursor by energy source 348. The selection of the energy source will depend in part upon the chemistry of the binder precursor, production tool and other processing conditions. The energy source should not appreciably degrade the production tool or backing. The term partial cure means that the binder precursor is polymerized to such a state that the slurry does not flow when inverted in the tool. The binder precursor can be fully cured once it is removed from the production tool by any convenient energy source.

Then, the production tool and abrasive article are separated at angle alpha. The angle alpha is an angle effective to separate the production tool and abrasive article. If the binder precursor is not fully cured, the binder precursor can then be fully cured by either time and/or exposure to an energy source. Next, the production tool is rewound on mandrel 349 so that the production tool can be reused again. Additionally, abrasive article 340 is wound on mandrel 349'.

In another variation of this first method, the slurry can be coated onto the backing and not into the cavities of the production tool. The slurry coated backing is then brought into contact with the production tool such that the slurry flows into the cavities of the production tool. The remaining steps to make the abrasive article are the same as detailed above.

The energy source can be a source of thermal energy or radiation energy, such as electron beam, ultraviolet light, or visible light. The amount of energy required is dependent upon the chemical nature of the reactive groups in the binder precursor, as well as upon the thickness and density of the binder precursor coating. For thermal energy, an oven temperature of from about 50° C. to about 250° C. and a duration of from about 15 minutes to about 16 hours is generally sufficient. Electron beam radiation, which is also known as ionizing radiation, can be used at an energy level of about 0.1 to about 10 Mrad, preferably at an energy level of about 1 to about 10 Mrad. Ultraviolet radiation refers to radiation having a wavelength within the range of about 200 to about 400 nanometers, preferably within the range of about 250 to 400 nanometers. It is preferred that 118 to 236 Watt/cm ultraviolet lights are used. Visible radiation refers to radiation having a wavelength within the range of about 400 to about 800 nanometers, preferably in the range of about 400 to about 550 nanometers.

It is preferred that the binder precursor is cured by radiation energy. The radiation energy can be transmitted through the backing or through the production tool. The backing or production tool should not appreciably absorb the radiation energy. Additionally, the radiation energy source should not appreciably degrade the backing or production tool. For instance, ultraviolet light can be transmitted through a polyester backing. Alternatively, if the production tool is made from certain thermoplastic materials, such as polyethylene, polypropylene, polyester, polycarbonate, poly (ether sulfone), poly(methyl methacrylate), polyurethanes, polyvinylchloride, or combinations thereof, ultraviolet or visible light can be transmitted through the production tool and into the slurry. For thermoplastic based production tools, the operating conditions for making the abrasive article should be set such that excessive heat is not generated. If excessive heat is generated, this may distort or melt the thermoplastic tooling.

The resulting solidified slurry or abrasive composite will have the inverse pattern of the production tool. By at least partially curing or solidifying on the production tool, the abrasive composite has a precise and predetermined pattern.

The production tool has a front surface which contains a plurality of cavities distending as indentations out of the front surface. These cavities are essentially the inverse shape of the abrasive composite and are responsible for generating the shape and placement of the abrasive composites.

These cavities can have any geometric shape that is the inverse shape to the geometric shapes suitable for the abrasive composites, such as cubic, cylindrical, prismatic, hemispheric, rectangular, pyramidal, truncated pyramidal, conical, truncated conical, and post-like with a top surface which is flat. The dimensions of the cavities are selected to achieve the desired number of abrasive composites/square centimeter. The cavities can be present in a dot-like pattern where adjacent cavities butt up against one another at their portions where the indentations merge into a common planar major surface of the production tool formed in the interstices of the cavities. Preferably, the shape of the cavities is selected such that the surface area of the abrasive composite decreases away from the backing.

The production tool can be in the form of a belt, a sheet, a continuous sheet or web, a coating roll such as a rotogravure roll, a sleeve mounted on a coating roll, or die. The production tool can be composed of metal, (e.g., nickel), metal alloys, or plastic. The production tool can be fabricated by any conventional technique, including photolithography, knurling, engraving, hobbing, electroforming, diamond turning, and the like. For example, a copper tool can be diamond turned and then a nickel metal tool can be electroplated off of the copper tool. Additional details on how to make a master tool or a production tool can be found in U.S. Pat. Nos. 5,152,917 (Pieper et al.); 5,489, 235 (Gagliardi et al.); 5,454,844 (Hibbard et al.); 5,435,816 (Spurgeon et al.); PCT WO 95/07797 (Hoopman et al.) and PCT WO 95/22436 (Hoopman et al.), all incorporated herein by reference. In some instances, a photolithography process is desired because it creates patterns that cannot or are otherwise difficult and expensive to generate by other techniques such as diamond turning.

A thermoplastic tool can be replicated off a metal master tool. The master tool will have the inverse pattern desired for the production tool. The master tool is preferably made out of metal, e.g., a nickel-plated metal such as aluminum, copper or bronze. A thermoplastic sheet material optionally can be heated along with the master tool such that the thermoplastic material is embossed with the master tool pattern by pressing the two together. The thermoplastic material can also be extruded or cast onto to the master tool and then pressed. The thermoplastic material is cooled to a nonflowable state and then separated from the master tool to produce a production tool.

Additional information on thermoplastic production tools can be found in U.S. Pat. No. 5,435,816 (Spurgeon et al.) incorporated herein by reference. Examples of thermoplastic materials that may be useful to form the production tool include: polyesters, polypropylene, polyethylene, polyamides, polyurethanes, polycarbonates, combinations thereof and the like. Additionally in some instances, it is preferred that the thermoplastic production tool contain additives such as anti-oxidants and/or UV stabilizers. These additives may extend the useful life of the production tool.

The production tool may also contain a release coating to permit easier release of the abrasive article from the production tool. Examples of such release coatings include silicones and fluorochemicals.

Irregularly Shaped Abrasive Composites

There are many means to make an abrasive article comprising irregularly shaped abrasive composites. While being irregularly shaped, these composites can nonetheless be provided in a predetermined pattern, in that the location of the composites is predetermined. In one method, the slurry is coated into cavities of a production tool to generate the abrasive composites. The production tool can be the same production tool as described above in the case of precisely shaped composites. However, the slurry is removed from the production tool before the binder precursor is cured or solidified sufficiently for it to substantially retain its shape upon removal from the production tool. Subsequent to this, the binder precursor is cured or solidified. Since the binder precursor is not cured while in the cavities of the production tool, this results in the slurry flowing and distorting the abrasive composite shape.

Figure 16:
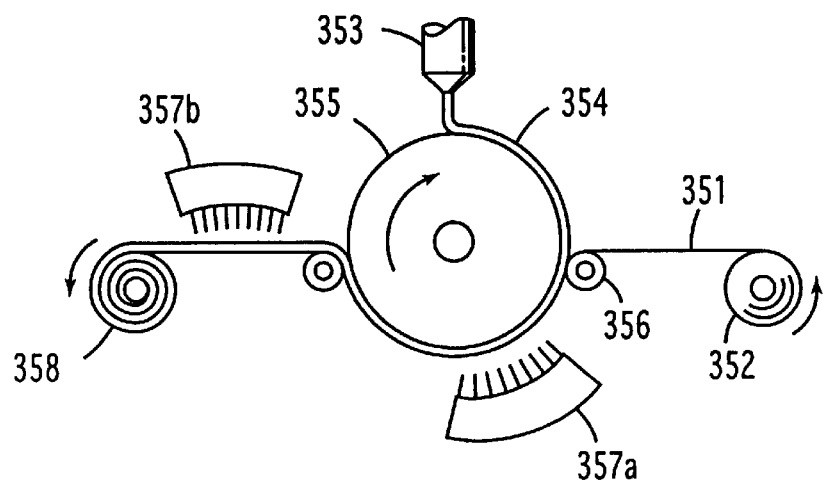
FIG. 16 is a schematic representation of a second process for making a three-dimensional, textured, fixed abrasive article useful in the process of the present invention.

An example of such a method for making an abrasive article featuring irregularly shaped composites is illustrated in FIG. 16. Backing 351 leaves an unwind station 352 and the slurry 354 is coated onto the production tool 355 by means of the coating station 353. The production tool can be provided in sheet form and welded at its free ends to form an endless sleeve which can be heat shrunk fit upon an outer surface of drum 355. The slurry can be coated onto the tool, and its viscosity controlled, as described above in the case of manufacturing precisely shaped abrasive composites. The presence or absence of air bubbles during mixing and/or coating can likewise be controlled following the procedures described in the case of the precisely shaped composites.

Next, the backing is brought into contact with the slurry and the production tool 355 by a nip roll 356 such that the slurry fills the cavities of the production tool. Then, the slurry-coated backing is removed from the production tool. Upon removal the slurry will have a pattern associated with it; the pattern of abrasive composites is formed from the cavities in the production tool.

Following removal, the slurry-coated backing is exposed to an energy source 357b to initiate the polymerization of the binder precursor and thus forming the abrasive composites; suitable energy sources are the same as those described above for the manufacture of precisely shaped abrasive composites. After curing, the resulting abrasive article is wound onto a roll at station 358. It is generally preferred that the time between release of the slurry-coated backing from the production tool to curing of the binder precursor is relatively minimal (e.g., on the order of seconds to hours). If this time is too long, the slurry will flow and the pattern will distort to such a degree that the pattern essentially disappears. Additional details on how to make this type of abrasive article can be found in U.S. Pat. Nos. 4,773,920 (Chasman et al.) and 5,014,468 (Ravipati et al.) both incorporated herein by reference. Optionally, the slurry can be partially cured while in contact with the production tool by energy source 357a, provided that the slurry is removed from the production tool before the binder precursor is cured or solidified sufficiently for it to substantially retain its shape upon removal from the production tool. Subsequent to this, the binder precursor is cured or solidified at energy source 357b.

In a variation of this method, the slurry can be coated onto the backing. The backing is then brought into contact with the production tool such that the cavities of the production tool are filled by the slurry. The remaining steps to make the abrasive article are the same as detailed above. After the abrasive article is made, it can be flexed and/or humidified prior to converting.

In another method of making irregularly shaped composites, the slurry can be coated onto the surface of a rotogravure roll. The backing comes into contact with the rotogravure roll and the slurry wets the backing. The rotogravure roll then imparts a pattern or texture into the slurry. Next, the slurry/backing combination is removed from the rotogravure roll. Next, the resulting construction is exposed to conditions to solidify the binder precursor such that an abrasive coating is formed. A variation of this process is to coat the slurry onto the backing and bring the backing into contact with the rotogravure roll.

The rotogravure roll can impart any desired pattern such as a hexagonal array, ridges, lattices, spheres, pyramids, truncated pyramids, cones, cubes, blocks, rods, and the like. The rotogravure roll can impart a pattern such that there is a land area between adjacent abrasive composite shapes. This land area can comprise a mixture of abrasive particles and binder. Alternatively, the rotogravure roll can impart a pattern such that the backing is exposed between adjacent abrasive composite shapes. Similarly, the rotogravure roll can impart a pattern such that there is a mixture of shapes.

Another method is to spray or coat the slurry through a screen to generate a pattern and the abrasive composites. Then the binder precursor is cured or solidified to form the abrasive composites. The screen can impart any desired pattern such as a hexagonal array, ridges, lattices, spheres, pyramids, truncated pyramids, cones, cubes, blocks, rods, and the like. The screen can impart a pattern such that there is a land area between adjacent abrasive composites. This land area can comprise a mixture of abrasive particles and binder. Alternatively, the screen can impart a pattern such that the backing is exposed between adjacent abrasive composites. Similarly, the screen can impart a pattern such that there is a mixture of shapes. This type of process is further described in U.S. Pat. No. 3,605,349 (Anthon) incorporated herein by reference.

Embossed Backings

There is another technique to make a three-dimensional, textured, fixed abrasive article. According to this technique, a backing is provided that is embossed. A slurry is coated over the backing. The abrasive coating follows the contour of the embossed backing to provide a textured coating. The slurry can be applied over the embossed backing by any suitable technique such as roll coating, spraying, die coating, knife coating and the like. After the slurry is applied over the embossed backing, the resulting construction is exposed to an appropriate energy source to initiate the solidification process to form the abrasive coating. An example of an abrasive coating applied over an embossed backing can be found in U.S. Pat. No. 5,015,266 (Yamamoto et al.) incorporated herein by reference.

Another method of making an abrasive article using an embossed backing is described in U.S. Pat. No. 5,219,462 (Bruxvoort), incorporated herein by reference. A slurry is coated into the recesses of an embossed backing. The slurry contains abrasive particles, binder precursor and an expanding agent. The resulting construction is exposed to conditions such that the expanding agent cause the slurry to expand above the front surface of the backing. Next the binder precursor is solidified to form a binder and the slurry is converted into abrasive composites. The resulting abrasive articles are illustrated in FIGS. 8 and 9.

Figure 8:
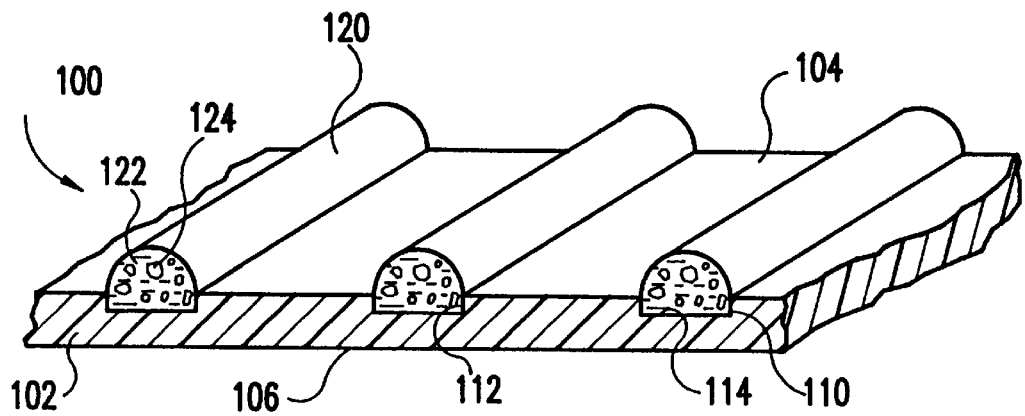
FIG. 8 is an isometric view with parts shown in cross sectional of a portion of another three-dimensional, textured, fixed abrasive article useful in the process of the present invention.

Referring to FIG. 8, abrasive article 100 comprises embossed backing 102 having recesses 110 with side walls 112 and bottom wall 114. Backing 102 has back surface 106. Abrasive composites 120 are elongate and there are openings 104 between adjacent abrasive composites where the backing is exposed. Abrasive composites 120 comprises abrasive particles 124 and binder 122.

Figure 9:
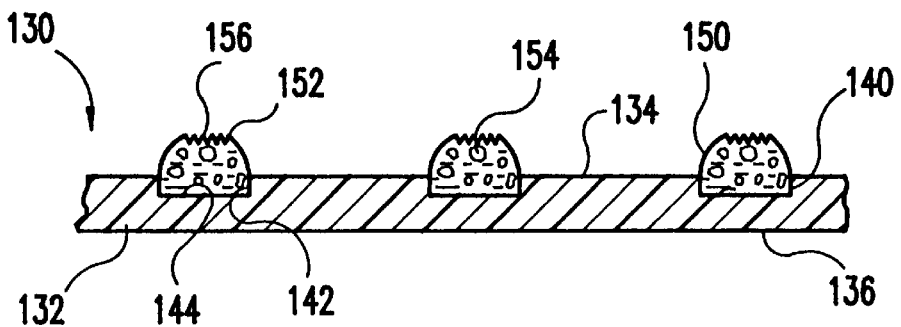

Referring to FIG. 9, abrasive article 130 comprises embossed backing 132 having recesses 140 with side walls 142 and bottom wall 144. Backing 132 has back surface 136. Abrasive composites 150 are discrete and there are openings 134 between adjacent abrasive composites where the backing is exposed. Abrasive composites 150 comprises abrasive particles 154 and binder 152. The outer surface of the abrasive composites has rough surface or texture 156 associated with it.

A variation of the embossed backing technique uses a perforated backing having an abrasive coating bonded to the front surface of the backing. This perforated backing will have a series or a predetermined placement of holes or cavities that extend through the width of the backing. The slurry is coated (e.g., knife coated) over the backing. These cavities will inherently create a textured abrasive coating.

Thermoplastic Binders

An alternative method of making the abrasive article is use a thermoplastic binder. The article can be prepared with or without a backing. Typically, the thermoplastic binder, the abrasive particles and any optional additives are compounded together according to conventional techniques, e.g., by feeding the composition into a single or twin screw extruder, either a single screw or twin screw extruder; the extrudate can then be formed into pellets or long stands. The abrasive article is then formed according to any of a variety of protocols.

For example, the abrasive article can be formed by injection or compression molding the compounded composition using a mold having essentially the inverse pattern of the desired pattern of the abrasive article surface. The compounded composition may also be heated to the point at which it forms a molten slurry, which is then supplied to a mold and cooled. It is also possible to heat the binder until it flows and then add the abrasive particles, plus any other additives, to form the molten slurry.

Various modifications and alterations of this invention will become apparent to those skilled in the art without departing from the scope and spirit of this invention, and it should be understood that this invention is not to be unduly limited to the illustrative embodiments set forth herein.

EXAMPLES

The following non-limiting examples will further illustrate the invention. All percentages are based upon weight, and all amounts are given in grams, unless otherwise specified. The designations in Table 1 are used throughout the examples.

TABLE 1

Material Designations

| Designation | Material |
|---|---|
| PPF | A 76 micrometer thick (3 mil thick) polyester film containing an ethylene acrylic acid co-polymer primer on the front surface |
| CA1 | A 3-methacryloxypropyltrimethoxysilane coupling agent commercially available from OSI Specialties, Inc., Danbury, CT under the trade designation "A-174" |
| CA2 | A polyethylene oxide group containing trialkoxy silane coupling agent commercially available from OSI Specialties, Inc. under the trade designation "A1230" |
| CA3 | An isopropyl triisostearoyl titanate coupling agent commercially available from Kenrich Petrochemicals Inc., Bayonne, NJ under the trade designation "KR-TTS" |
| CA4 | Octyltriethoxysilane commercially available from DeGussa Corp., Ridgefield Park, NJ |
| SISOL1 | A silica sol having an average particle size of about 20 nanometers, about 34% solids in deionized water, commercially available from Nalco Chemical Co., Napierville, IL under the trade designation "Nalco 1042" |
| SISOL2 | A silica sol having an average particle size of about 60 nanometers, about 50% solids in deionized water and commercially available from Nalco Chemical Co., under the trade designation "Nalco 1060" |
| HEA | 2-Hydroxy ethyl acrylate commercially available from Rohm and Haas Co., Philadelphia, PA under the trade designation "Rocryl 420" |
| HEMA | Hydroxy ethyl methacrylate commercially available from Rohm and Haas Co., under the trade designation "Rocryl 400" |
| BP1 | An ethoxylated trimethylolpropane triacrylate resin commercially available from Sartomer Co., Inc., Exton, PA under the trade designation "Sartomer 9035" |
| BP2 | A triacrylate of tris(hydroxy ethyl) isocyanurate resin commercially available from Sartomer Co., Inc., under the trade designation "Sartomer 368" |
| TMPTA | Trimethylolpropane triacrylate commercially available from Sartomer Co., Inc., under the trade designation "Sartomer 351" |
| HDDA | Hexanediol diacrylate commercially available from Sartomer Co., Inc., under the trade designation "Sartomer 238" |
| BP3 | A polyethylene glycol diacrylate commercially available from Sartomer Co., Inc., under the trade designation "Sartomer 344" |
| BP4 | A one to one mass blend of BP1 and BP2 |
| EPR | A bisphenol A based epoxy resin commercially available from Shell Chemical Co., Houston, TX under the trade designation "EPON 828" |
| BC | An amine curative commercially available from Air Products Inc., Allentown, PA under the trade designation "Ancamine 1922" |
| PEG | Polyethylene glycol having an average molecular weight of about 600, commercially available from Union Carbide, Danbury, CT under the trade designation "Carbowax 600" |
| DPP | Dibutyl phthalate plasticizer commercially available from Eastman Kodak Co., Rochester, NY under the trade designation "Kodaflex DBP" |
| ABP | Alkyl benzyl phthalate plasticizer commercially available from Monsanto Co., St. Louis, MO under the trade designation "Santicizer 261" |
| PP | Alkyl benzyl phthalate plasticizer commercially available from Monsanto Co., under the trade designation "Santicizer 278" |
| TDP | T-butylphenyl diphenyl phosphate plasticizer commercially available from Monsanto Co., under the trade designation "Santicizer 154" |
| DUP | Diundecyl phthalate plasticizer commercially available from Eastman Chemical Co., Kingsport, TN. |
| SAB | Sodium polyacrylate/polyalcohol copolymer commercially available from Stockbausen, Greensboro, NC under the trade designation "FAVOR SAB 800HS" |
| CEO1 | Ceria abrasive particles having an average particle size of about 0.5 micrometer, commercially available from Rhone Poulenc, Shelton, CT |
| CEO2 | Ceria abrasive particles having an average particle size of about 0.5 micrometer, commercially available from Rhone Poulenc containing an isopropyl triisostearoyl titanate coupling agent treatment |
| CEO3 | Ceria abrasive particles having an average particle size of about 0.5 micrometer, Lot #74906 commercially available from Fujimi, Japan |
| CEO4 | Ceria abrasive particles having a median average particle size of 0.490 micrometer commercially available from Transelco, Penn Yan, NY, under the trade designation "TRS-1794" |
| CEO5 | Ceria abrasive particles having a median particle size of 0.523 micrometer commercially available from Transelco under the trade designation "TRS-1793" |
| CEO6 | Ceria abrasive particles (reported average particle size of 5 micrometers) commercially available from Molycorp, Inc., White Plains, NY, under the trade designation "5350", Lot #530401630P |
| TNOX | Stannic oxide abrasive particles, commercially available from J. T. Baker, Philipsburg, NJ under the trade designation "S-3976" |
| ZRO | Zirconia abrasive particles having an average particle size of about 0.3 micrometers, commercially available from Tosoh Corp., Tokyo, Japan under the trade designation "TZ-3YTSK" |
| TIO | Titanium dioxide particles having an average particle size of about 0.3 micrometer, commercially available from Fisher, Fairlawn, NJ under the trade designation "T315, $TiO_2$" |
| PH1 | 2,4,6-Trimethylbenzoyl-diphenyl-phosphine oxide photoinitiator commercially available from BASF, Charlotte, NC under the trade designation "Lucirin TPO". |
| PH2 | 2-benzyl-2-N,N-dimethylamino-1-(4-morpholino-phenyl)-1-butanone, commercially available from Ciba Geigy Corp, Greensboro, NC under the trade designation "Irgacure 369" |
| PH3 | 2-isopropylthioxanthone commercially available from Biddle-Sawyer Corp., New York, NY (Distributor for Octel Chemicals, United Kingdom) under the trade designation "Quanticure ITX" |
| PH4 | Ethyl-4-(dimethylamino) benzoate photoinitiator commercially available from Biddle-Sawyer Corp. under the trade designation "EPD" |
| PH5 | 2-hydroxy 3(3,4-dimethyl-9-oxo 9H-thioxanthen-2-yloxy)-N,N,N trimethyl-1-propanaminium chloride commercially available from Biddle-Sawyer Corp. under the trade designation "Quanticure QTX" |
| PH6 | 2-propoxythioxanthone commercially available from Biddle-Sawyer Corp. under the trade designation "Quanticure PTX" |
| PH7 | 2,4,6-trimethylbenzoyl-diphenyl-phosphine oxide liquid photoinitiator commercially available from BASF, Charlotte, NC under the trade designation "Lucirin LR 8893" |
| CACO | Calcium carbonate filler having an average particle size of about one micrometer, commercially available from Pfizer Specialty Minerals, New York, NY under the trade designation "Superflex 200" |
| CACO2 | Calcium carbonate filler having an average particle size of about 2.6 micrometers, commercially available from Pfizer Specialty Minerals, under the trade designation "USP-MEDIUM" |
| CACO3 | Calcium carbonate filler having an average particle size of about 4.6 micrometers, commercially available from Pfizer Specialty Minerals, under the trade designation "USP-EX-HEAVY" |
| CACO4 | Calcium carbonate filler having an average particle size of about 0.07 micrometer, commercially available from Pfizer Specialty Minerals, under the trade designation "MULTIFLEX-MM" |
| SA1 | A silica suspending agent having a surface area of 50 meters square/gram, commercially available from DeGussa Corp. under the trade name "OX-50" |
| PLFP | Filler particles having an average particle size between 5 to 7 micrometers, these filler particles were a combination |

TABLE 1-continued

Material Designations

| Designation | Material |
|---|---|
| | of micronized polyethylene and TEFLON (PTFE) and were commercially available from Micro Powders, Inc. Tarrytown, NY under the trade designation "Polysilk 600" |
| DA1 | An anionic dispersing agent commercially available from Byk Chemie, Wallingford, CT under the trade designation "Disperbyk 111" |
| DA2 | A dispersing agent commercially available from ICI America Inc., Wilmington, DB, under the trade designation "Hypermer LP1" |
| DA3 | A cationic dispersing agent commercially available from Byk Chemie, Wallingford, CT under the trade designation "Disperbyk 115" |
| KD2 | A polyethylene oxide based dispersant commercially available from ICI America Inc., under the trade designation "Hypermer KD2" |
| ASP | An aluminosilicate filler commercially available from Engelhard, Menlo Park, NJ, under the trade designation "ASP600" |
| MA1 | 2(2-ethoxyethoxy) ethyl acrylate commercially available from Sartomer Co., Inc. under the trade designation "Sartomer 256" |
| MA2 | Lauryl acrylate commercially available from Sartomer Co., Inc., under the trade designation "Sartomer 335" |
| MA3 | Isodecyl acrylate commercially available from Sartomer Co., Inc., under the trade designation "Sartomer 395" |
| MA4 | Propoxylated neopentyl glycol diacrylate commercially available from Sartomer Co., Inc., under the trade designation "Sartomer 9003" |
| CACO5 | Calcium carbonate filler, commercially available from Pfizer Specialty Minerals, under the trade designation "USP Heavy Calcium Carbonate" |
| SIN | A silicon nitride abrasive particle having a particle size less than about 2 micrometers commercially available from Starck, Germany under the trade designation "M-11" |
| YZR1 | A sintered yttria modified zirconia abrasive particle having an average particle size of about 0.2 micrometer and comprising 8% $Y_2O_3$–92% $ZrO_2$ commercially available from Tosoh Ceramic Division, Bound Brook, NJ under the trade designation "TZ-8Y"; the zirconia was essentially fully stabilized in the tetragonal form |
| YZR2 | A sintered yttria modified zirconia abrasive particle having an average particle size of about 0.3 micrometer and comprising 3% $Y_2O_3$–97% $ZrO_2$ commercially available from Tosoh Ceramic Division under the trade designation "TZ-3Y"; the zirconia was partially stabilized in the tetragonal form |
| NHC | Ammonium carbonate salt ($NH_4HCO_3$) commercially available from Alfa Johnson Maffhey, Ward Hill, MA |
| TANA | Tannic acid commercially available from Sigma Chemical Co., St. Louis, MO |
| SAA | Salicylic acid commercially available from Sigma Chemical Co. |
| CMS | Calcium metasilicate filler commercially available from Alfa Johnson Maffhey under the trade designation "Wollastonite" |
| ZR | A sintered monoclinic zirconia abrasive particle having an average particle size of about 0.7 micrometer commercially available from Magnesium Electron Inc., Flemington, NJ under the trade designation "SC15" |

Preparation of the CEO2 Abrasive Particles

The ceria abrasive particles were treated with a coupling agent in the following manner to form CEO2. The ceria abrasive particles were mixed together with an isopropyl triisostearoyl titanate coupling agent and methyl ethyl ketone solvent. After mixing, a vacuum was applied to remove the organic solvent. Then the ceria particles were dried at room temperature for 48 hours. The resulting abrasive particles contained approximately 1% by weight coupling agent on their surface.

General Procedure I for Making an Abrasive Slurry Comprising a Ceramer Binder and Abrasive Particles The ceramer binder precursor was first prepared and to this were added additional materials to form the abrasive slurry. To prepare the ceramer binder precursor, the SISOL1 was first charged into a round bottom flask, followed by HEA, CA1 and CA2. This order of addition was important to achieve a uniform ceramer binder precursor and prevent gellation of the ceramer. These materials were mixed together to form a uniform dispersion. Then the flask containing these materials was placed on a rotary evaporator and heated for about 15 minutes at 55° C. and continuously stirred. Then a vacuum pump system operating at about 2.64–6.60 KPa (20 to 50 mm Hg) was installed to remove a portion of the water while maintaining the rotary evaporator temperature at about 55° C. These conditions were maintained until enough water was removed so that the resulting ceramer was about 66% by weight solids, in about 30 minutes, thus producing the ceramer binder precursor. BP1 was then added to the ceramer and the resulting blend was mixed for about one minute. CEO2 was then gradually added and the resulting blend was mixed about four minutes. Next, TIO was added and the resulting blend was mixed about four minutes. PH1 then was added and the resulting blend was mixed about two minutes. Following this, PH2 was added and the resulting blend was mixed about three to four minutes. Next, additional CA1 was added and the resulting blend was mixed about one minute. Any additional TIO was added and the resulting blend was mixed about three minutes to form the abrasive slurry.

General Procedure II for Making an Abrasive Slurry Comprising a Ceramer Binder and Abrasive Particles General Procedure II for Making an Abrasive Slurry Comprising a Ceramer Binder and Abrasive Particles was essentially the same as General Procedure I except for the following changes. The ceramer did not include CA2. There were 457.5 grams of SISOL1, 88.75 grams of HEA and 37.5 grams of CA1 charged to the round bottom flask. The ceramer was heated and stripped as in Procedure I. The abrasive slurry was made by mixing 11.4 grams of BP1 into 400 grams of the ceramer. Next, 11.4 grams of BP2 were added to this blend. Following this, 540.0 grams of CEO2 were gradually mixed into this blend. Next, 2.0 grams of PH1 were mixed into this blend. Finally, 4.7 grams of PH2 were mixed into this blend to form the abrasive slurry.

General Procedure III for Making an Abrasive Slurry Comprising a Ceramer Binder and Abrasive Particles The ceramer binder precursor was first prepared and to this were added additional materials to form the abrasive slurry. To prepare the ceramer binder, 200.0 grams of SISOL1 were first charged into a round bottom flask, followed by 20.67 grams of HEMA, 20.67 grams of BP3 and 16.38 grams of CA1. This order of addition was important to achieve a uniform ceramer binder precursor and prevent gellation of the ceramer. These materials were mixed together to form a uniform dispersion. Then the flask containing these materials was placed on a rotary evaporator and heated for about 15 minutes at 55° C. and continuously stirred. Then a vacuum pump system operating at about 2.64–6.6 KPa (20 to 50 mm Hg) was installed to remove a portion of the water. The rotary evaporator temperature was maintained at about 55° C. The flask containing the materials was subjected to these conditions until enough water was removed so that the resulting ceramer was about 66% solids, in about 30 minutes, thus forming the ceramer binder. Next, 100.0 grams of this ceramer binder precursor were placed into another flask, then 3.65 grams of BP1 and 3.65 grams of BP2 were added to the ceramer and the resulting blend was mixed about one minute. Following this, about 135.0 grams of CEO2 were gradually added and the resulting blend was mixed about four minutes. Following this, 0.5 grams of PH1 were added and the resulting blend was mixed for about two minutes. Following this, 1.2 grams of PH2 were added and the resulting blend was mixed about three to four minutes to form the abrasive slurry.

General Procedure IV for Making an Abrasive Slurry Comprising a Ceramer Binder and Abrasive Particles The ceramer binder precursor was first prepared and to this were added the additional materials to form the abrasive slurry. To prepare the ceramer binder, 366.4 grams of SISOL1 were first charged into a round bottom flask, followed by 306 grams of CA1 and 71.2 grams of HEA. These materials were mixed together to form a uniform dispersion. Then the flask containing these materials was placed on a rotary evaporator and heated for about 15 minutes at 55° C. and stirred continuously. Then a vacuum pump system operated at about 2.6 to 6.6 KPa (20 to 50 mm Hg) was installed to remove a portion of the water. The rotary evaporator temperature was maintained at about 55° C. The flask containing the materials was subjected to these conditions until enough water was removed so that the resulting ceramer was about 66% solids, in about 30 minutes, thus forming the ceramer binder. Next, 40.2 grams of this ceramer binder precursor were placed into another flask, then 0.47 gram of PH2, 0.47 gram of PH5 and 0.47 gram of PH4 were added to the ceramer and the resulting blend was mixed using an air stirrer until the blend was essentially homogeneous. Following this, about 9.8 grams of BP1 and 9.8 grams of BP2 were added and the resulting blend was mixed until the blend was essentially homogeneous. Next, 54.2 grams of CEO2 were gradually added and the resulting blend was mixed to form the abrasive slurry.

General Procedure I for Making the Abrasive Article

A polypropylene production tool was provided that comprised a series of cavities with specified dimensions and these cavities were arranged in a predetermined order or array. The production tool was essentially the inverse of the desired shape, dimensions and arrangement of the abrasive composites. The production tool was secured to a metal carrier plate using a masking type pressure sensitive adhesive tape. The abrasive slurry was coated into the cavities of the production tool using a rubber squeegee such that the abrasive slurry completely filled the cavities. Next, a PPF backing was brought into contact with the abrasive slurry contained in the cavities of the production tool. A rubber roller was rolled across the back surface of the backing to ensure that the abrasive slurry wetted the front surface of the backing and to remove any undesired air bubbles. The article was cured by passing the tool together with the backing and binder precursor for four passes under one ultraviolet light lamp ("V" bulb, commercially available from Fusion Systems Inc.), that operated at about 236.2 Watts/cm (600 Watts/inch). The radiation passed through the film backing. The speed was between about 7.6 to 10.7 meters/minute (25 to 35 feet/minute). In some instances, the sample was greater in width than the "V" bulb. For such a case, one side of the sample was passed under the bulb two times, and then the other side of the sample was passed two times under the belt. This ultraviolet light exposure resulted in the polymerization initiation of the binder precursor and the abrasive slurry being transformed into an abrasive composite with the abrasive composite being adhered to the PPF film backing. The curing was done in ambient conditions. Next, the PPF/abrasive composite construction was separated from the production tool to form an abrasive article. The abrasive article was then heated for about 15 seconds to one minute at about 110° C. to 115.5° C. (230 to 240° F.) to activate the primer on the PPF backing.

To prepare the abrasive article for testing, the edges of two abrasive articles were abutted and laminated to a pressure sensitive adhesive tape commercially available from 3M, St. Paul, Minn., under the trade designation "Scotch Adhesive 7963MP". Then, a 30.5 cm (12 inch) diameter circular test sample was die cut for testing.

General Procedure II for Making the Abrasive Article

The abrasive article was made on a machine similar to that illustrated in FIG. 15 of the present application. This process was carried out in a class 10,000 clean room. A polypropylene production tool was provided that comprised a series of cavities with specified dimensions arranged in a predetermined order or array. The production tool was essentially the inverse of the desired shape, dimensions and arrangement of the abrasive composites. The production tool was unwound from a winder. The abrasive slurry was coated at room temperature and applied into the cavities of the production tool using a vacuum slot die coater. Next, the PPF backing was brought into contact with the abrasive slurry coated production tool such that the abrasive slurry wetted the front surface of the backing. Afterwards, ultraviolet light radiation was transmitted through the production tool and into the abrasive slurry. Two different ultraviolet lamps were used in series. The first UV lamp was a Fusion System ultraviolet light that used a "V" bulb and operated at 236.2 Watts/cm (600 Watts/inch). The second was an ATEK ultraviolet lamp that used a medium pressure mercury bulb and operated at 157.5 Watts/cm (400 Watts/inch). Upon exposure to the ultraviolet light, the binder precursor was converted into a binder and the abrasive slurry was converted into an abrasive composite. Then, the production tool was removed from the abrasive composite/backing and the production tool was rewound. Following this, the abrasive composite/backing, which formed the abrasive article, was wound upon a core. This process was a continuous process that operated at between about 4.6 to 7.6 meters/minute (15 to 25 feet/minute). The abrasive article was then heated for about two minutes at 110 to 115.5° C. (230 to 240° F.) to activate the primer on the PPF backing.

To prepare the abrasive article for testing, the abrasive article was laminated to a pressure sensitive adhesive tape commercially available from 3M, St. Paul, Minn., under the trade designation "Scotch 467MP Hi Performance Adhesive". Then, a 30.5 cm (12 inch) diameter circular test sample was die cut for testing.

General Procedure III for Making the Abrasive Article

General Procedure III was generally the same as General Procedure II except that it was not carried out in a clean room and two identical ultraviolet lamps (Fusion System) that used a "V" bulb and operated at 236.2 Watts/cm (600 Watts/inch) were used. The abrasive article was then heated for about 15 seconds to one minute at about 110 to 115.5° C. (230 to 240° F.) to activate the primer on the PPF backing.

To prepare the abrasive article for testing, two abrasive articles were joined together and laminated to a pressure sensitive adhesive tape commercially available from 3M, St. Paul, Minn., under the trade designation "Scotch 467MP Hi Performance Adhesive". Then, a 30.5 cm (12 inch) diameter circular test sample was die cut for testing.

General Procedure IV for Making the Abrasive Article

General Procedure IV for Making the Abrasive Article was essentially the same as General Procedure I except that the abrasive article was not heated to activate the primer on the PPF backing.

General Procedure V for Making the Abrasive Article

General Procedure V was generally the same as General Procedure I, except that the wetted PPF backing and binder precursor, still secured to a metal carrier plate, was passed through a bench top laboratory laminator commercially available from Chem Instruments, Model #001998. The article was continuously fed between two rubber rollers at a pressure of about 280 Pa (40 psi) and a speed of 2 to 7. The article was cured by passing the tool together with the backing and binder precursor under two iron doped lamps commercially available from American Ultraviolet Company, that operated at about 157.5 Watts/cm (400 Watts/inch). The radiation passed through the film backing. The speed was about 10.2 meters/minute (35 feet/minute) and the sample was passed through two times.

To prepare the abrasive article for testing, the abrasive article was laminated to a pressure sensitive adhesive tape commercially available from 3M, St. Paul, Minn., under the trade designation "Scotch Tape 467MP Hi Performance Adhesive". Then, a 30.5 cm (12 inch) diameter circular test sample was die cut for testing.

General Procedure VI for Making the Abrasive Article

General Procedure VI was essentially the same method as General Procedure V except that the binder precursor was cured by passing the tool together with the backing and binder precursor under one visible light lamp "V" bulb commercially available from Fusion Systems, Inc., that operated at about 600 Watts/inch.

Pattern 1

A production tool was made by casting polypropylene material on a metal master tool having a casting surface comprised of a collection of adjacent truncated pyramids. The resulting production tool contained cavities that were in the shape of truncated pyramids. The pyramidal pattern was such that their adjacent bases were spaced apart from one another no more than about 510 micrometers (0.020 inch). The height of each truncated pyramid was about 80 micrometers, the base was about 178 micrometers per side and the top was about 51 micrometers per side. There were about 50 lines/centimeter delineating the array of composites.

Pattern 2

This arrangement of abrasive composites was similar to FIG. 6, each row comprised alternating abrasive composites which had the "cross" shape with abrasive composites which had the "x" shape. In this arrangement, the abrasive composites from the odd rows were offset from the abrasive composites of the even rows. In this arrangement, the total length of both arms of either the cross or the x shape was about 750 micrometers and the width of one arm of either the cross or the x shape was about 50 micrometers. There were about 1270 micrometers between the center of one cross to the center of the adjacent x shaped abrasive composite. There were about 8 crosses per lineal cm (20 crosses per lineal inch). The height of the composites was about 76 micrometers (3 mils). The crosses and x's were slightly tapered with an angle of between about 15 to 20 degrees. The production tooling was made by extruding (casting) polypropylene onto a master tool which was made by a photolithographic process. During this photolithographic process a photoresist was applied to a magnesium printing plate. Then photolithography was used to create the desired pattern and the magnesium plate was etched to create the pattern and thus the master tool.

Pattern 3

This pattern was a square array of posts having a circular cross section. There were about 20 posts per lineal cm (50 posts per lineal inch). The post diameter was about 100 micrometers (4 mils). The post height was about 76 micrometers (3 mils). The posts were slightly tapered with an angle of between about 15 to 20 degrees. The production tool was made in a manner similar to that of Pattern #2 using a photolithography process and casting a polypropylene material from the master tool.

Test Procedure I

This test procedure simulated the planarization process of a semiconductor wafer. The workpiece for this test procedure was a silicon base unit having a silicon dioxide layer (i.e., a "blanket" wafer). In general, this workpiece was less expensive than a conventional patterned semiconductor wafer.

The oxide layer on a blanket wafer is harder to remove than a conventional patterned semiconductor wafer. Generally, conventional patterned semiconductor wafers comprise a plurality of discrete metal interconnects covered with a metal oxide coating. These discrete metal interconnects essentially decrease the surface area and increase the effective pressure on the wafer surface. In a blanket wafer, there is a continuous coating of metal oxide and the load is spread over the entire surface area so that the effective pressure is less. Because the higher pressure tends to lead to higher cut rates, the high cut rates on the blanket wafers may in fact lead to even higher cut rates on conventional patterned semiconductor wafers.

The workpiece, i.e., blanket wafer, was made according to the following procedure. A single crystal silicon base unit having a diameter of 100 mm and a thickness of about 0.5 mm was purchased from Wafernet of San Jose, Calif. The silicon base unit was then placed in a furnace having a hydrogen and oxygen atmosphere and the temperature in the furnace increased to 1050° C. A uniform layer of silicon dioxide was thermally deposited over the silicon base, this process being known in the art as a thermal oxide process. The deposited silicon dioxide thickness was between about 7,000 to 20,000 Angstroms, as measured using a measuring device commercially available as machine model #RR/FTM Resist commercially available from Rudolph of Fairfield, N.J. The silicon dioxide thickness was measured five times at each of the following locations: the center, 24 mm directly below the center, 36 mm directly below the center, 24 mm directly above the center and 36 mm directly above the center.

The test machine was a modified Strausbaugh Lapping Machine, Model 6Y-1 similar to the apparatus depicted in FIG. 3. The workpiece was assembled into a retaining ring, commercially available from Rodel of Newark, Del. A pressure sensitive adhesive, "Scotch Brand Adhesive #7963MP" commercially available from 3M, St. Paul, Minn., was laminated to the back side of the abrasive article. This pressure sensitive adhesive enabled the abrasive article to be secured to a polyester film disc, 40.6 cm (16 inches) in diameter, between the abrasive sample disc and the first support pad. This polyester film prevented the fluid medium from penetrating into the support pads. The first support pad was a polyurethane pad was commercially available from Rodel of Newark, Del. under the trade designation "IC1000". The second support pad was a polyurethane impregnated polyester non-woven pad commercially available from Rodel of Newark, Del. under the trade designation "SUBA IV". A second support pad was then attached below the first support pad onto the platen of the lapping machine. Each support pad had a diameter of about 30.5 cm (12 inches).

Prior to testing, an aluminum metal ring was installed on the test equipment to condition the abrasive article. The aluminum metal ring installed in place of the workpiece was rotated at 100 rpm and then brought into contact with the abrasive article at a pressure of 21 Pa (3 psi) for 5 seconds to one minute. After conditioning, the abrasive article was rinsed with deionized water.

The head holding the workpiece was caused to rotate at about 100 rpm before it was brought into contact with the abrasive disc. The workpiece moved through a 31 mm arc starting 13 mm from the edge of the abrasive disc with a nine second periodicity. The abrasive disc was rotated at about 67 to 70 rpm. The workpiece and abrasive disc rotated in a clockwise manner relative to one another. The abrasive disc rotated over a sweep of 32 mm in a 0.9 second cycle. Both the abrasive disc and workpiece were rotated first and then brought into contact with one another at a pressure of about 21 Pa (3 psi). The gauge or line pressure was about 5.4 kg (12 lbs) and the downward load or force was about 16.2 kg (36 lbs). At the disc and the workpiece interface was pumped a potassium hydroxide solution (0.25% by wt. KOH in deionized water) which had a pH in the range of about 11.5 to 12.5. The flow rate of the potassium hydroxide solution was 80 mL/minute. The abrasive disc was used to treat the workpiece for a two minute cycle. After the treatment ended, the workpiece was rinsed with deionized water and dried.

Next, the workpiece was tested for cut rate and surface finish. The cut rate was measured by determining the oxide film thickness in the same locations, as measured prior to treatment, using the same machine. The difference between the workpiece thickness prior to treatment and the thickness after treatment is referred to in the following tables as the "cut." Between two and five readings were averaged to determine an average cut rate of Angstroms per minute.

In some instances, the test length was longer than two minutes. The length of the test is specified in each example. After every two minutes the test was stopped to measure the cut rate, to remove the treated test workpiece and to install a new workpiece for the next cycle.

Test Procedure II

Test Procedure II was essentially the same as Test Procedure I except that the gauge or line pressure was about 4.2 kg (9.3lbs) and the down load force was 10.4 kg (23 lbs).

Test Procedure III

Test Procedure III was essentially the same as Test Procedure II except that the abrasive article was not conditioned with the aluminum ring prior to use.

Test Procedure IV

The following simulated the test procedure for modifying the exposed surface of a semiconductor wafer. There were two parts to the test machine. The base unit which held the workpiece was an Ecomet 4 Variable Speed Grinder-Polisher commercially available from Buehler Ltd., Lake Bluff, Ill. The base unit held a 23 cm (9 inch) diameter abrasive disc. The abrasive disc was secured to the base unit by means of a pressure sensitive adhesive commercially available from 3M, St. Paul, Minn., under the trade designation "Scotch Brand Adhesive 7963MP". The abrasive disc was die cut from a larger disc or sheet for testing. The blanket wafer workpiece was prepared in the same manner as described in Test Procedure I. Prior to treatment, the workpiece thickness was measured using a FTM commercially available for Nanometrics, Sunnyvale, Calif. under the trade designation "Nanospec AFT". The head unit was an Automet 2 Power Head commercially available from Beuhler Ltd. The workpiece was secured to the rotating Automet 2 Power Head plate by a wafer template commercially available from Rodel, Newark, Del. The head unit containing the abrasive disc was brought into contact with the workpiece. Both the head unit and workpiece rotated in a counter motion relative to one another during treatment. The workpiece rotated about 500 rpm. The treatment was carried out wet, with tap water directed to the center of the workpiece. The treatment time ranged from two to 10 minutes, depending upon the particular example. The pressure between the abrasive disc and the workpiece was about 0.31 kg/cm$^2$. After the specified time, the workpiece was rinsed and wiped clean with a paper towel. Next, the workpiece final thickness was measured using the same instrument as measured the initial thickness. The difference between the initial and final thickness corresponded to the cut over the specified period of time.

Test Procedure V

Test Procedure V was essentially the same as Test Procedure IV except a lubricant comprising deionized water and ceria sol (20% solids, acetate stabilized, having a pH of about 3.0 and an average particle size of about 20 nanometers, available from Nyacol, Ashland, Mass.) was directed to the center of the workpiece during treatment. Additionally, the pressure was 0.062 kg/cm$^2$.

Test Procedure VI

Test Procedure VI was essentially the same as Test Procedure IV except that the lubricant was a sodium hydroxide solution that had a pH of about 10.3 (0.25% NaOH). Additionally, the pressure at the interface was about 0.188 kg/cm$^2$.

Test Procedure VII

Test Procedure VII was essentially the same as Test Procedure I except that the abrasive article was not conditioned with the aluminum ring prior to use. Additionally, the gauge or line pressure was about 91 Pa (13 psi) and the down load force was 17.25 kg (38 lbs).

Test Procedure VIII

Test Procedure VIII was essentially the same as Test Procedure I except that the abrasive article was conditioned with the aluminum ring for 15 seconds prior to use. Additionally, the gauge or line pressure was about 91 Pa (13 psi) and the down load force was 17.25 kg (3 8 lbs). The length of this test was four minutes and after every two minutes the test was stopped to measure the cut rate and to insert a new workpiece.

Test Procedure IX

Test Procedure IX was essentially the same as Test Procedure III except that the gauge or line pressure was about 91 Pa (13 psi) and the down load force was 17.25 kg (38 lbs). The test length was two minutes.

Test Procedure X

Test Procedure X was essentially the same as Test Procedure III except that the support pad was a polyurethane foam pad commercially available from Rodel under the trade designation "IC1000". Additionally there was a 76 micrometer (3 mil) polyester film between the support pad and the abrasive article being tested.

Test Procedure XI

Test Procedure XI was essentially the same as Test Procedure X except that the total treatment time was only one minute.

Test Procedure XII

Test Procedure XII was essentially the same as Test Procedure XI except that the pH of the KOH solution was closely controlled to 11.5.

Test Procedure XIII

Test Procedure XIII was essentially the same as Test Procedure X except that the pH of the KOH solution was closely controlled to 12.5.

Test Procedure XIV

Test Procedure XIV was essentially the same as Test Procedure IX except the gauge or line pressure was about 112 Pa (16 psi) and the down load force was about 22.7 kg (50 lbs).

Test Procedure XV

Test Procedure XV was essentially the same as Test Procedure I except that the abrasive article was not conditioned with the aluminum ring prior to use and the pressure was 26.6 Pa (3.8 psi) on the workpiece surface.

Test Procedure XVI

Test Procedure XVI was essentially the same as Test Procedure XV except that the treatment cycles were only one minute.

Test Procedure XVII

Test Procedure XVII was essentially the same as Test Procedure XVI except that a patterned workpiece was used instead of a blanket workpiece. The patterned test wafers were made by the following procedure. A single crystal silicon base substrate having a diameter of 100 mm and a thickness of about 0.5 mm was purchased from Wafernet of San Jose, Calif. Then patterned features were generated on each silicon base by lithography and reactive plasma etching. Next, a thin layer of silicon dioxide, typically having a thickness between 1.5 to 2 micrometers, was conformally deposited on the patterned wafer test workpiece using the technique of low pressure chemical vapor deposition (LPCVD). The abrasive article was used to treat this test workpiece for a cycle time between 30 to 60 seconds. After this cycle time, the test was stopped and the TIR (Total Indicated Runout) measured. If a desirable TIR was not attained, then the treatment was continued to further reduce the TIR. Typically, a TIR of less than 1500 Angstroms was considered desirable. The TIR of the patterned wafer workpiece was measured before and after treatment with the abrasive article of the particular example. The TIR was measured using a Tencor P-2 Long Scan Profilometer commercially available from Tencor of Mountain View, Calif. The TIR profiles were taken over four to five arrays. The assessment length of each array was between 500 to 5,000 micrometers.

Test Procedure XVIII

Test Procedure XVIII was essentially the same as Test Procedure III except that a loose abrasive slurry was also added to the wafer surface. The abrasive slurry was pumped over each wafer at a rate of 80 mL/minute. This loose abrasive slurry was in addition to the KOH-based fluid medium. The loose abrasive slurry contained approximately 30% by weight amorphous fumed silica in deionized water. This loose abrasive slurry was purchased from Cabot Corp., Tuscola, Ill., under the trade designation "SC 1", lot #2G69515.

Test Procedure XIX

Test Procedure XIX was essentially the same as Test Procedure XVI except that the pH of the KOH was closely controlled to 11.5 and the support pad was a polyurethane foam pad ("IC1000"). Additionally there was a 76 micrometer thick (3 mil) polyester film between the support pad and the abrasive article.

Test Procedure XX

Test Procedure XX was essentially the same as Test Procedure XIX except that the test length was two minutes.

Test Procedure XXI

Test Procedure XXI was essentially the same as Test Procedure XIX except that the test length was five minutes.

EXAMPLES 1 THROUGH 10

Examples 1 through 10 compare different formulations of an abrasive slurry that utilized a ceramer binder precursor. The abrasive slurry was prepared according to General Procedure I for Making an Abrasive Slurry Comprising a Ceramer Binder and Abrasive Particles. The materials forming the ceramer are listed in Table 2. The materials forming the abrasive slurry can be found in Table 3. The amounts listed in Tables 2 and 3 are in grams of material. The abrasive article for each example was made according to the General Procedure I for Making the Abrasive Article using Pattern #1. Each abrasive article was tested according to General Test Procedure III. The test results for Examples 1 through 10 are listed in Table 4. There were between two and five workpieces tested for each example. The actual cut rate per workpiece, along with an average cut rate are listed in Table 4 in Angstroms/minute.

TABLE 2

Amount of Materials Added Together to Form Ceramer Binder

| Examples | SISOL1 | HEA | CA1 | CA2 |
|---|---|---|---|---|
| 1–10 | 457.5 | 88.75 | 18.5 | 18.5 |

TABLE 3

Amount of Materials Added Together to Form The Abrasive Slurry

| Ex. | Ceramer | BP1 | CEO2 | TIO | PH1 | PH2 | CA1 | Extra TIO |
|---|---|---|---|---|---|---|---|---|
| 1 | 40 | 2.28 | 37.8 | 8.65 | 0.2 | 0.47 | 2 | 10.0 |
| 2 | 40 | 2.28 | 37.8 | 8.65 | 0.2 | 0.47 | 2 | 5.0 |
| 3 | 40 | 2.28 | 37.8 | 8.65 | 0.2 | 0.47 | 0 | 0 |
| 4 | 40 | 2.28 | 54.0 | 0 | 0.2 | 0.47 | 1.5 | 0 |
| 5 | 40 | 2.28 | 54.0 | 0 | 0.2 | 0 | 0 | 0 |
| 6 | 40 | 2.28 | 54.0 | 0 | 0.2 | 0.47 | 0 | 0 |
| 7 | 40 | 2.28 | 54.0 | 0 | 0.2 | 0.47 | 2 | 0 |
| 8 | 40 | 2.28 | 40.5 | 7.21 | 0.2 | 0.47 | 0 | 0 |
| 9 | 40 | 2.28 | 37.8 | 13.65 | 0.2 | 0.47 | 0 | 5.0 |
| 10 | 40 | 2.28 | 37.8 | 18.65 | 0.4 | 0 | 0 | 5.0 |

Note in Example 5, an additional 0.2 gram of PH1 was added after CA1. Note in Example 7, an additional 5 grams of CEO2 were added after CA1. Note in Example 7, an additional 0.2 gram of PH1 was added after TIO.

TABLE 4

Cut Rate

| Ex. | Cut Rate #1 | Cut Rate #2 | Cut Rate #3 | Cut Rate #4 | Cut Rate #5 | Average Cut Rate |
|---|---|---|---|---|---|---|
| 1 | 1220 | 1170 | 960 | 780 | 870 | 1,000 |
| 2 | 90 | 50 | 130 | 80 | | 90 |
| 3 | 300 | 150 | 200 | | | 220 |
| 4 | 60 | 40 | 40 | 40 | | 50 |
| 5 | 60 | 50 | 40 | 60 | | 50 |
| 6 | 620 | 470 | 230 | 390 | 150 | 370 |

TABLE 4-continued

Cut Rate

| Ex. | Cut Rate #1 | Cut Rate #2 | Cut Rate #3 | Cut Rate #4 | Cut Rate #5 | Average Cut Rate |
|---|---|---|---|---|---|---|
| 7 | 2140 | 2230 | 2150 | 740 | 1590 | 1770 |
| 8 | 1450 | 120 | 250 | 320 | | 540 |
| 9 | 300 | 150 | 200 | | | 220 |
| 10 | 210 | 120 | | | | 170 |

Examples 1 through 10 illustrated that different cut rates were achieved by the formulation of the abrasive slurry.

EXAMPLES 11 THROUGH 25

This set of examples compared various compositions of the abrasive slurry. The abrasive articles for this set of Examples were tested according to Test Procedure I, Test Procedure II and Test Procedure III and test results are listed in Tables 7, 8 and 9. In this set of examples, there were one to ten abrasive articles tested per example.

EXAMPLE 11

The abrasive slurry for Example 11 was made according to General Procedure II for Making an Abrasive Slurry Comprising a Ceramer Binder and Abrasive Particles. The abrasive article was made according to the General Procedure I for Making the Abrasive Article using Pattern #1.

Examples 12 through 19 compare different formulations of an abrasive slurry that utilized a plasticizer. The abrasive slurry was prepared by mixing, with an air stirrer, TMPTA, HDDA, PEG, DPP, ABP, CA3, PH3, PH4, PH2 AND PH1. Next, CEO1 was gradually added to this mixture. It took approximately 15 minutes to blend in the CEO1 into this mixture. Following this, the CA1 was added and the resulting blend was mixed for an additional five minutes. Next, any CACO, TNOX, SA1 or ZRO were added to this blend and mixed for about 10 minutes to make the abrasive slurry. The amount of the materials for the abrasive slurries is listed in Table 5. The abrasive article for each example was made according to the General Procedure I for Making the Abrasive Article using Pattern #1.

TABLE 5

Abrasive Slurry Formulations for Examples 12 through 19

| Material | 12 | 13 | 14 | 15 | 16 | 17 | 18 | 19 |
|---|---|---|---|---|---|---|---|---|
| TMPTA | 18 | 6 | 18 | 6 | 6 | 6 | 6 | 6 |
| HDDA | 78 | 66 | 78 | 66 | 66 | 66 | 66 | 66 |
| PEG | 0 | 0 | 0 | 48 | 48 | 48 | 48 | 48 |
| DPP | 24 | 48 | 0 | 0 | 0 | 0 | 0 | 0 |
| ABP | 0 | 0 | 24 | 0 | 0 | 0 | 0 | 0 |
| CA3 | 10 | 10 | 10 | 10 | 10 | 10 | 10 | 10 |
| PH3 | 1.5 | 1.5 | 1.5 | 1.5 | 0 | 1.5 | 1.5 | 1.5 |
| PH4 | 3 | 3 | 3 | 3 | 0 | 3 | 3 | 3 |
| PH2 | 3 | 3 | 3 | 3 | 3 | 3 | 3 | 3 |
| PH1 | 0 | 0 | 0 | 0 | 3 | 0 | 0 | 0 |
| CEO1 | 495 | 495 | 495 | 495 | 495 | 495 | 495 | 495 |
| CA1 | 30 | 30 | 30 | 30 | 30 | 30 | 30 | 30 |
| CACO | 45 | 45 | 45 | 0 | 45 | 0 | 0 | 0 |
| TNOX | 0 | 0 | 0 | 0 | 0 | 45 | 0 | 0 |
| SA1 | 0 | 0 | 0 | 0 | 0 | 0 | 10 | 0 |
| ZRO | 0 | 0 | 0 | 0 | 0 | 0 | 0 | 45 |

Examples 20 through 25 compare different levels of a plasticizer. The abrasive slurry was prepared by mixing, with an air stirrer, TMPTA, HDDA, CA3, PH3, PH4 and PH2. Next, CEO1 was gradually added to this mixture. It took approximately 15 minutes to blend in the CEO1 into this mixture. Following this, CA1 was added and the resulting blend was mixed for an additional five minutes. Next, CACO (when used) was added to this blend and mixed for about 10 minutes to make the abrasive slurry. The amount of the materials for the abrasive slurries is listed in Table 6. The abrasive article for each example was made according to the General Procedure I for Making the Abrasive Article using Pattern #1.

TABLE 6

Abrasive Slurry Formulations for Examples 20 through 25

| Material | 20 | 21 | 22 | 23 | 24 | 25 |
|---|---|---|---|---|---|---|
| TMPTA | 24 | 18 | 12 | 6 | 0 | 0 |
| HDDA | 84 | 78 | 72 | 66 | 60 | 48 |
| PEG | 12 | 24 | 36 | 48 | 60 | 72 |
| CA3 | 10 | 10 | 10 | 10 | 10 | 10 |
| PH3 | 1.5 | 1.5 | 1.5 | 1.5 | 1.5 | 1.5 |
| PH4 | 3 | 3 | 3 | 3 | 3 | 3 |
| PH2 | 3 | 3 | 3 | 3 | 3 | 3 |
| CBO | 495 | 495 | 495 | 495 | 495 | 495 |
| CA1 | 30 | 30 | 30 | 30 | 30 | 30 |
| CACO | 45 | 45 | 45 | 0 | 45 | 0 |

TABLE 7

Test Procedure II

| Ex. | Cut Rate #1 | Cut Rate #2 | Cut Rate #3 | Cut Rate #4 | Cut Rate #5 | Cut Rate #6 | Average Cut Rate |
|---|---|---|---|---|---|---|---|
| 11 | 420 | 440 | 340 | 510 | 710 | | 480 |
| 20 | 1010 | 1660 | 1390 | 1180 | 1350 | | 1320 |
| 20 | 1410 | 1410 | 1260 | 1340 | 1180 | | 1320 |
| 24 | 1120 | 1560 | 1460 | 990 | 690 | 660 | 1080 |
| 21 | 490 | 820 | 840 | 860 | | | 750 |
| 21 | 650 | 350 | 1110 | 1030 | 160 | 960 | 710 |
| 22 | 770 | 940 | 1070 | 750 | 720 | | 850 |
| 22 | 1110 | 1240 | 1140 | | | | 1160 |
| 23 | 1060 | 1150 | | | | | 1105 |

TABLE 8

Test Procedure III

| Ex. | Cut Rate #1 | Cut Rate #2 | Cut Rate #3 | Cut Rate #4 | Cut Rate #5 | Average Cut Rate |
|---|---|---|---|---|---|---|
| 25 | 90 | 50 | | | | 70 |
| 24 | 70 | 70 | | | | 70 |
| 12 | 0 | | | | | 0 |
| 13 | 290 | | | | | 290 |
| 14 | 1830 | 630 | | | | 1230 |
| 15 | 470 | | | | | 470 |
| 16 | 210 | | | | | 210 |
| 17 | 1240 | 1220 | | | | 1230 |
| 18 | 270 | | | | | 270 |

TABLE 9

| | | | Test Procedure I | | | | |
|---|---|---|---|---|---|---|---|
| Ex. | Cut Rate #1 | Cut Rate #2 | Cut Rate #3 | Cut Rate #4 | Cut Rate #5 | Cut Rate #6 | Average Cut Rate |
| 23 | 1370 | 1790 | 1770 | 1770 | 1700 | | 1680 |
| 23 | 1500 | 1490 | 1650 | | | | 1550 |
| 11 | 1320 | 1050 | 790 | | | | 1050 |
| 12 | 830 | 1020 | | | | | 930 |
| 13 | 830 | 840 | | | | | 840 |
| 19 | 430 | | | | | | 430 |
| 16 | 160 | | | | | | 160 |

Examples 11 through 25 illustrated that different cut rates were achieved by altering the formulation of the abrasive slurry.

EXAMPLES 26 AND 27

These examples compared two formulations of an abrasive slurry containing a ceramer binder. The resulting abrasive articles were tested according to Test Procedure I. The test results are listed in Table 10.

EXAMPLE 26

The abrasive slurry for Example 26 was made according to General Procedure II for Making an Abrasive Slurry Comprising a Ceramer Binder and Abrasive Particles. The abrasive article was made according to the General Procedure I for Making the Abrasive Article using Pattern #1.

EXAMPLE 27

The abrasive slurry for Example 27 was made according to General Procedure III for Making an Abrasive Slurry Comprising a Ceramer Binder and Abrasive Particles. The abrasive article was made according to the General Procedure I for Making the Abrasive Article using Pattern #1.

TABLE 10

| | Test Procedure I | | | |
|---|---|---|---|---|
| Ex. | Cut Rate #1 | Cut Rate #2 | Cut Rate #3 | Average Cut Rate |
| 26 | 1030 | 770 | 772 | 860 |
| 27 | 750 | 730 | 710 | 730 |

These two Examples illustrated that different cut rates were achieved by altering the formulation of the abrasive slurry.

EXAMPLE 28

The abrasive slurry for Example 28 was made according to General Procedure IV for Making an Abrasive Slurry Comprising a Ceramer Binder and Abrasive Particles. The abrasive article was made according to the General Procedure I for Making the Abrasive Article using Pattern #1. The resulting abrasive article was tested according to Test Procedure III except that the test length was 8 minutes. There was only one workpiece tested and the test was stopped every two minutes to calculate the cut rate. The test results are listed in Table 11.

TABLE 11

| Ex. | Cut Rate after 2 minutes of testing | Cut Rate after 4 minutes of testing | Cut Rate after 6 minutes of testing | Cut Rate after 8 minutes of testing |
|---|---|---|---|---|
| 28 | 1720 | 1630 | 1420 | 1330 |

This Example 28 illustrated that one form of the abrasive article of the invention provided a sustained cut rate of greater than 1000 Angstroms/minute.

EXAMPLES 29 AND 30

This set of examples compared various abrasive slurry formulations. The abrasive article for Examples 29 and 30 were made according to the General Procedure I for Making the Abrasive Article using Pattern #1. The abrasive article was tested according to Test Procedure IV.

EXAMPLE 29

The abrasive slurry of Example 29 was prepared as follows. Into a container was added: 20 grams of organic solvent (glycol ether solvent commercially available from Olin Chemicals, Stamford, Conn. under the trade designation "POLYSOLVE TPM"); 15.0 grams of TDP, 3.68 grams of TMPTA and 55 grams of HDDA. The resulting binder precursor was mixed using an air stirrer until the blend was essentially homogeneous. Next, 120 grams of CEO1 were gradually added into the blend and mixed until the blend was essentially homogeneous. Following this, 0.8 grams of PH2, 0.8 grams of PH6 and 0.8 grams of PH4 were added into the blend and mixed until the blend was essentially homogeneous. Next, 80 grams of ASP were gradually added into the blend and mixed until the blend was essentially homogeneous to form the abrasive slurry.

The abrasive article was tested according to Test Procedure IV and had a cut rate of 900 Angstroms/minute over a 10 minute test. This example illustrated that a relatively high cut rate was achieved with the use of a cerium oxide abrasive particles incorporated into the abrasive structure and in the absence of a potassium hydroxide based fluid medium. Additionally, this example illustrated an abrasive slurry that comprised a high boiling solvent and a photocurable binder precursor. Likewise, this example illustrated an abrasive slurry that comprised a plasticizer, coupling agent and filler.

The abrasive article of Example 29 was also tested according to Test Procedure V. For a two minute test, the abrasive article produced a cut rate of 3750 Angstroms/minute.

EXAMPLE 30

The abrasive slurry for Example 30 was prepared in the same manner as the abrasive slurry for Example 28 except that 0.47 grams of PH2 and 0.2 of PH1 were added instead of the PH5 and PH4 photoinitiators.

The abrasive article was tested according to Test Procedure IV and had a cut rate of 1600 Angstroms/minute after two minutes of testing and a cut rate of 1270 Angstroms/minute for the next two minutes of testing. This example illustrated that 2,4,6-trimethylbenzoyl-diphenyl-phosphine oxide was a useful initiator for the binder precursor.

EXAMPLE 31

The abrasive slurry of Example 31 was prepared as follows. Into a container was added: 44.05 grams of HDDA, 29.36 grams of ASP, 5.06 grams of TDP and 10.3 grams of SAB. The resulting binder precursor was mixed using an air stirrer until the blend was essentially homogeneous. Next, 44.04 grams of CEO1 were gradually added into the blend and mixed until the blend was essentially homogeneous. Following this, 0.36 gram of PH2, 0.19 gram of PH6 and 0.4 gram of PH4 were added into the blend and mixed until the blend was essentially homogeneous to form the abrasive slurry. The abrasive article for Example 31 was made according to the General Procedure I for Making the Abrasive Article using Pattern #1.

In this example, a void-producing material (SAB) was included into the abrasive coating. It was theorized that during treatment the SAB particles swelled out of the abrasive coating, which resulted in a more porous and erodible abrasive coating.

The abrasive article was tested according to Test Procedure VI and had a cut rate of 398 Angstroms/minute over a 10 minute test.

EXAMPLES 32 AND 33

This set of Examples compared two different patterns. The abrasive slurry for both examples was made according to General Procedure II for Making the Abrasive Slurry. The abrasive article for Example 32 was made according to General Procedure I for Making the Abrasive Article with Pattern #3. The abrasive article for Example 33 was made according to General Procedure I for Making the Abrasive Article with Pattern #2. Both abrasive articles were tested according to Test Procedure IV, except that the tap water was replaced with a potassium hydroxide solution that had a pH between 11.5 to 12.5. The flow rate was approximately 30 mL/minute. The cut rate was measured at five minutes and also at 10 minutes. The test results are listed in Table 12; the cut rates were measured in Angstroms/minute.

TABLE 12

| | Test Procedure IV | |
|---|---|---|
| Ex. | Cut Rate after 5 minutes | Cut Rate after 10 minutes |
| 32 | 776 | 794 |
| 33 | 200 | 132 |

This set of Examples illustrated the effect of different patterns on the cutting ability of the abrasive article.

EXAMPLES 34 THROUGH 44

This set of examples compared various percent solids of the ceramer binder precursor. The ceramer binder precursor was first prepared and after the ceramer binder precursor was prepared, the additional materials were added to the ceramer binder precursor to form the abrasive slurry. To prepare the ceramer binder, the SISOL1 was first charged into a round bottom flask, followed by HEA, CA1 and BP4. The amounts of these materials (in grams) are listed in Table 13. This order of addition was important to achieve a uniform ceramer binder precursor and prevent gellation of the ceramer binder precursor. These materials were mixed together to form a uniform dispersion. Then the flask containing these materials was placed on a rotary evaporator and heated for about 15 minutes at 55° C. and continuously stirred. A vacuum pump system operating at about 2.64–6.6 KPa (20 to 50 mm Hg) was installed to remove a portion of the water. The rotary evaporator temperature was still maintained at about 55° C. The flask containing the materials was subjected to these conditions until enough water was removed so that the resulting ceramer binder precursor had the percent solids listed for each example in Table 13.

TABLE 13

| % Solids and Starting Materials in the Ceramer Binder Precursor | | | | | |
|---|---|---|---|---|---|
| Example | % Solids | SISOL1 | HEA | CA1 | BP4 |
| 34 | 75 | 457.5 | 88.75 | 37.5 | 24.5 |
| 35 | 75 | 457.5 | 88.75 | 37.5 | 24.5 |
| 36 | 90 | 457.5 | 88.75 | 37.5 | 24.5 |
| 37 | 90 | 457.5 | 88.75 | 37.5 | 24.5 |
| 38 | 78.5 | 457.5 | 88.75 | 37.5 | 24.5 |
| 39 | 78.5 | 457.5 | 88.75 | 37.5 | 24.5 |
| 40 | 77 | 457.5 | 88.75 | 37.5 | 0 |
| 41 | 77 | 457.5 | 88.75 | 37.5 | 0 |
| 42 | 77 | 457.5 | 88.75 | 37.5 | 0 |
| 43 | 77 | 457.5 | 88.75 | 37.5 | 0 |

SISOL2 was acidified to a pH of 2.2 to 2.5 using nitric acid. The SISOL2 and CA4 were placed in a round bottomed flask and mixed for about 15 minutes. The amount of SISOL2 and the CA4 were listed in Table 14.

The abrasive slurry was prepared by mixing, using an air stirrer, the ceramer binder precursor for the given example with the CA4 pretreated SISOL2. Next, CEO2 was added and mixed into the resulting blend. Following this, PH2 and PH1 were mixed into the resulting blend. Next, any BP4 was added and mixed into the resulting blend. Following this, any additional deionized water was mixed in. Finally, any additional SISOL2 was mixed to form the abrasive slurry. The amounts of these materials, in grams, are listed in Table 14.

TABLE 14

| Amount of Materials in Abrasive Slurry For Examples 34 through 43 | | | | | | | | | |
|---|---|---|---|---|---|---|---|---|---|
| Ex. | Ceramer Binder Pre-cursor | SISOL2 | CA4 | CEO2 | PH2 | PH1 | BP4 | Water | SISOL2 |
| 34 | 38 | 10 | 0.875 | 21 | 1 | 0 | 0 | 0 | 0 |
| 35 | 38 | 10 | 0.875 | 16.8 | 1 | 0 | 0 | 0 | 0 |
| 36 | 38 | 18 | 1.6 | 14 | 1 | 0 | 0 | 0 | 0 |
| 37 | 38 | 20 | 1.75 | 12.0 | 1.37 | 0 | 0 | 0 | 0 |
| 38 | 38 | 12.54 | 0.55 | 16.8 | 1.0 | 0 | 0 | 0 | 0 |
| 39 | 35.6 | 12.54 | 1.1 | 16.8 | 0 | 1.17 | 0 | 0 | 0 |
| 40 | 35.6 | 12.54 | 1.1 | 16.8 | 0 | 1.19 | 2.4 | 0 | 0 |

TABLE 14-continued

Amount of Materials in Abrasive Slurry For Examples 34 through 43

| Ex. | Ceramer Binder Pre-cursor | SISOL2 | CA4 | CEO2 | PH2 | PH1 | BP4 | Water | SISOL2 |
|---|---|---|---|---|---|---|---|---|---|
| 41 | 35.6 | 10.54 | 0.92 | 20.16 | 0 | 1.19 | 2.4 | 1.0 | 0 |
| 42 | 35.6 | 8.13 | 0.71 | 24.19 | 0 | 1.19 | 2.4 | 0 | 2.21 |
| 43 | 35.6 | 8.13 | 0.71 | 24.19 | 0 | 1.19 | 2.4 | 0 | 2.21 |

The abrasive articles were made according to General Procedure I for Making the Abrasive Article using Pattern #1, and were tested according to Test Procedures VI and the test results are listed in Table 15. The cut rates were calculated as Angstroms/minute.

TABLE 15

Using one workpiece for a total time of 15 to 20 minutes

| Example | Cut Rate (Avg.) |
|---|---|
| 34 | 943.6 |
| 35 | 1000.1 |
| 36 | 1223 |
| 37 | 1478.7 |
| 38 | 437.3 |
| 39 | 13.2 |
| 40 | 80 |
| 41 | 27 |
| 42 | 37 |
| 43 | 942.3 |

Examples 34 through 43 illustrated that different cut rates were achieved by altering the formulation of the abrasive slurry.

COMPARATIVE EXAMPLE (LAPPING FILM)

This test made use of a standard abrasive lapping material commercially available from 3M, St. Paul, Minn., as Imperial Lapping Film Chrome Oxide product number 3M 031X. This abrasive lapping film is prepared by slurry coating 0.5 micrometer chrome oxide onto a polyester film backing. The material was used as a 30.5 cm (12 inch) disc by laminating it to a double adhesive sided pressure sensitive adhesive and using it as described in Test Procedure I. Result: no measurable amount of silicon dioxide was removed during a two minute test.

EXAMPLES 44 THROUGH 46

These Examples compared various levels of plasticizer. The abrasive slurry was prepared by mixing with an air stirrer: TMPTA, HDDA, ABP, CA3, and PH1. Next, CEO1 was gradually added. It took approximately 15 minutes to blend in the CEO1 into this mixture. Following this, either CACO2 or CACO was added and mixed in for an additional five minutes. The amount of the materials, in grams, for the abrasive slurries is listed in Table 16. The abrasive article for each example was made according to the General Procedure I for Making the Abrasive Article using Pattern #1.

TABLE 16

Abrasive Slurry Formulations for Examples 44 through 46

| Material | Example 44 | Example 45 | Example 46 |
|---|---|---|---|
| TMPTA | 11.25 | 9.38 | 7.50 |
| HDDA | 33.75 | 28.13 | 22.50 |
| ABP | 30.0 | 37.50 | 45.0 |
| CA3 | 4.95 | 4.95 | 4.95 |
| PH1 | 3.6 | 3.0 | 2.4 |
| CEO1 | 123.75 | 123.75 | 123.75 |
| CACO2 | 68.3 | 68.3 | 0.0 |
| CACO | 0.0 | 0.0 | 68.30 |

The resulting abrasive articles were tested according to Test Procedure VII. The test results are listed in Table 17. Note the cut rate was an average of readings and was measured in Angstroms/minute of material removed.

TABLE 17

| Cut Rate | Example 44 | Example 45 | Example 46 |
|---|---|---|---|
| after 2 minutes of testing* | 400 | 1010 | 1960 |
| after 4 minutes of testing* | 380 | 1130 | 2100 |
| after 2 minutes of testing** | Not Tested | Not Tested | 1810 |
| after 4 minutes of testing** | Not Tested | Not Tested | 1910 |
| after 6 minutes of testing** | Not Tested | Not Tested | 2360 |

*In this Test Procedure, the abrasive article was made and tested on the same day.
**In this Test Procedure, the abrasive article was made three days before it was tested.

The data in Table 17 indicated that there was essentially no difference in the cut rates if the abrasive article was tested the same day it was made or if the abrasive article was tested three days after it was made. Additionally, the data in Table 17 indicated differences in cut rates which was related to the amount of plasticizer present in the abrasive slurry.

EXAMPLES 47 AND 48

These Examples, prepared as described in Examples 44–46, compared various types of calcium carbonate filler. The amount of materials is listed in Table 18.

TABLE 18

Abrasive Slurry Formulations for Examples 47 and 48

| Material | Example 47 | Example 48 |
|---|---|---|
| TMPTA | 7.50 | 7.50 |
| HDDA | 22.50 | 22.52 |
| ABP | 45.0 | 0.0 |
| PP | 0.0 | 45.03 |
| CA3 | 4.95 | 4.94 |
| PH1 | 2.40 | 2.45 |
| CEO1 | 123.75 | 127.26 |

TABLE 18-continued

Abrasive Slurry Formulations for Examples 47 and 48

| Material | Example 47 | Example 48 |
|---|---|---|
| CACO2 | 68.3 | 10.18 |
| CACO | 0.0 | 0.0 |
| CACO3 | 0.0 | 100.01 |
| CACO4 | 0.0 | 14.03 |

The abrasive article for each example was made according to the General Procedure I for Making the Abrasive Article using Pattern #1 except for the following changes. For Example 47, a rubber roller was not used. Instead, the production tool/abrasive slurry/backing was subjected to a two roll coater to ensure that the abrasive slurry wetted the front surface of the backing and to remove any undesirable air bubbles. For Example 48, a quartz plate was placed over the production tool and the radiation energy was transmitted through the quartz plate and the production tool and into the abrasive slurry. The quartz plate aided in keeping the production tool flat during curing.

The resulting abrasive articles were tested according to Test Procedure VII except for the following changes. The abrasive article of Example 47 was tested for only two minutes. The abrasive article of Example 48 was tested for 26 minutes. The test results are listed in Table 19. Note the cut rate was an average of readings and was measured in Angstroms/minute of material removed.

TABLE 19

| Cut Rate after __minutes of testing | Example 47 | Example 48 |
|---|---|---|
| 2 | 2690 | 800 |
| 4 |  | 800 |
| 6 |  | 930 |
| 8 |  | 1360 |
| 10 |  | 1610 |
| 12 |  | 1800 |
| 14 |  | 1900 |
| 16 |  | 2200 |
| 18 |  | 2460 |
| 20 |  | 2530 |
| 22 |  | 2720 |
| 24 |  | 2370 |
| 26 |  | 2750 |

Relative to Example 48, it was concluded from the above data that there was a "break in" time for the abrasive article. It appeared that this "break in" time was about the first four minutes, where the abrasive article produced a lower cut rate. After this break in time, the abrasive article generated a higher cut rate. Although not wishing to be bound by any theory, it is speculated that this break in time may be associated with the time it took to remove any outer film of the binder on the abrasive coating.

EXAMPLES 49 AND 50

This set of examples compared various ways to make and to test the abrasive article. The abrasive slurry was prepared by mixing, with an air stirrer, the following: 7.5 grams of TMPTA, 22.50 grams of HDDA, 45.0 grams of ABP, 4.95 grams of CA3, and 2.40 grams PH1. Next, 123.75 grams of CEO1 were gradually added. It took approximately 15 minutes to blend in the CEO1. Following this, 68.30 grams of CACO were added and the resulting blend was mixed for an additional five minutes.

The abrasive article for each example was made according to the General Procedure I for Making the Abrasive Article using Pattern #1 except for the following changes. For both examples, a rubber roller was not used. For Example 50, the UV radiation was transmitted through the PPF backing.

The resulting abrasive articles were tested according to Test Procedures VII and VIII. The test results are listed in Table 20. Note the cut rate was an average of five readings and was measured in Angstroms/minute of material removed.

TABLE 20

Test Procedure VII and Test Procedure VIII

| Test Procedure/Cut Rate | Example 49 | Example 50 |
|---|---|---|
| VII/after 2 minutes of testing | 470 | 2450 |
| VII/after 4 minutes of testing | 550 | 2250 |
| VII/after 6 minutes of testing | 630 | Not Tested |
| VIII/after 1.5 minutes of testing | 2840 | Not Tested |
| VIII/after 1.9 minutes of testing | 2620 | Not Tested |

This data indicated that there were differences in cut rate if the abrasive article was conditioned prior to testing and how the abrasive article was made.

EXAMPLES 51 THROUGH 57

This set of examples, prepared as described for Examples 44–46, compared various abrasive slurry formulations. The amount of the materials is listed in Table 21.

TABLE 21

Abrasive Slurry Formulations for Examples 51 through 56

| Material | Ex. 51 | Ex. 52 | Ex. 53 | Ex. 54 | Ex. 55 | Ex. 56 |
|---|---|---|---|---|---|---|
| TMPTA | 13.5 | 13.5 | 14.25 | 12.75 | 12.75 | 12.75 |
| HDDA | 40.5 | 40.5 | 42.75 | 38.25 | 38.25 | 38.25 |
| ABP | 6 | 6 | 3 | 9 | 9 | 9 |
| CA3 | 5 | 5 | 5 | 5 | 5 | 5 |
| PH3 | 0.6 | 0.75 | 0.75 | 0.75 | 0.75 | 0.75 |
| PH4 | 1.2 | 1.5 | 1.5 | 1.5 | 1.5 | 1.5 |
| PH2 | 1.2 | 1.5 | 1.5 | 1.5 | 1.5 | 1.5 |
| CEO1 | 247.5 | 247.5 | 247.5 | 247.5 | 247.5 | 247.5 |
| CA1 | 0 | 15 | 15 | 15 | 15 | 15 |
| CACO | 22.5 | 22.5 | 22.5 | 22.5 | 22.5 | 22.5 |

The abrasive article for each example was made according to the General Procedure I for Making the Abrasive Article except for the following changes. Examples 51 through 54 used Pattern #1. Example 55 used Pattern #2. Example 56 used Pattern #3.

For Example 57, the abrasive article was made according to the following procedure. The ceramer binder precursor was first prepared and after the ceramer binder precursor was prepared, the additional materials were added to the ceramer binder precursor to form the abrasive slurry. To prepare the ceramer binder, 457.5 grams of SISOL1 were first charged into a round bottom flask, followed by 88.75 grams of HEA and 37.5 grams CA1. This order of addition was important to achieve a uniform ceramer binder precursor and prevent gellation of the ceramer binder precursor. These materials were mixed together to form a uniform dispersion. Then the flask containing these materials was placed on a rotary evaporator and heated for about 15 minutes at 55° C. and continuously stirred. Then a vacuum pump system operating at about 2.64–6.60 KPa (20 to 50 mm Hg) was installed to remove a portion of the water. The rotary evaporator temperature was still maintained at about 55° C. The abrasive slurry was prepared by mixing, using an air stirrer, 400 grams of the ceramer binder precursor, with 22.8 grams of BP4. Next, 540.0 grams of CEO2 were gradually added and mixed into the ceramer binder precursor. Then, 3.0 grams of 2.0 PH1 and 4.7 grams of PH2 were added to the abrasive slurry. The abrasive article for Example 57 was made according to the General Procedure I for Making the Abrasive Article using Pattern #1.

The resulting abrasive articles were tested according to Test Procedure VII. The test results are listed in Table 22. Note the cut rate was an average of five readings and was measured in Angstroms/minute of material removed.

TABLE 22

| Cut Rate | Ex. 51 | Ex. 52 | Ex. 53 | Ex. 54 | Ex. 55 | Ex. 56 | Ex. 57 |
|---|---|---|---|---|---|---|---|
| after 2 minutes of testing | 1060 | 630 | 240 | 1720 | 1555 | 1530 | 3000 |
| after 4 minutes of testing | 1130 | 620 | 280 | 1250 | 1530 | 1600 | 2770 |
| after 6 minutes of testing |  |  |  | 1200 | 1300 | 1440 | 2760 |
| after 8 minutes of testing |  |  |  | 1150 | 1170 | 1290 | 2590 |
| after 10 minutes of testing |  |  |  |  |  |  | 2640 |

EXAMPLES 58 THROUGH 64

This set of examples, prepared as described for Examples 44–46, compared various abrasive slurry formulations. The amount of the materials is listed in Table 23.

TABLE 23

Abrasive Slurry Formulations for Examples 58 through 64

| Material | Ex. 58 | Ex. 59 | Ex. 60 | Ex. 61 | Examples 62, 63 and 64 |
|---|---|---|---|---|---|
| TMPTA | 7.5 | 12.0 | 7.5 | 12 | 7.5 |
| HDDA | 22.50 | 0 | 22.50 | 72 | 22.5 |
| PEG | 0 | 0 | 0 | 36 | 0 |
| ABP | 45.00 | 12 | 45.00 | 0 | 45.0 |
| CA3 | 4.95 | 5 | 4.95 | 10 | 4.95 |
| PH1 | 2.40 | 0 | 2.40 | 0 | 2.40 |
| PH3 | 0 | 0.75 | 0 | 1.5 | 0 |
| PH4 | 0 | 1.5 | 0 | 3 | 0 |
| PH2 | 0 | 1.5 | 0 | 3 | 0 |
| CEO1 | 123.75 | 247.5 | 123.75 | 495 | 123.75 |
| HEMA | 0 | 15 | 0 | 0 | 0 |
| CA1 | 0 | 0 | 0 | 30 | 0 |
| CACO | 68.30 | 22.5 | 0.0 | 45 | 0 |
| CACO2 | 0.0 | 0.0 | 68.30 | 0 | 68.30 |

The abrasive article for Example 58 was made according to the General Procedure I for Making the Abrasive Article using Pattern #1. The abrasive article for Example 59 was made according to General Procedure III for Making the Abrasive Article using Pattern #1. The abrasive articles for Examples 60 through 64 were made according to General Procedure II for Making the Abrasive Article using Pattern #1 except for the following changes. In Example 62, the abrasive article was not heated. In Example 64, the abrasive article was conditioned for 20 seconds with the aluminum ring as described above in Test Procedure I.

The resulting abrasive articles were tested according to Test Procedure VII. The test results are listed in Table 24. Note the cut rate was an average of five readings and was measured in Angstroms/minute of material removed.

TABLE 24

| Cut Rate | Ex. 58 | Ex. 59 | Ex. 60 | Ex. 61 | Ex. 62 | Ex. 63 | Ex. 64 |
|---|---|---|---|---|---|---|---|
| after 2 minutes of testing | 1470 | 900 | 240 | 1720 | 170 | 440 | 1770 |
| after 4 minutes of testing | 1580 | 980 | 100 | 1660 | 160 |  | 1580 |
| after 6 minutes of testing | 1640 |  | 80 |  | 160 |  | 1470 |
| after 8 minutes of testing |  |  | 310 |  |  |  | 1370 |
| after 10 minutes of testing |  |  | 310 |  |  |  | 1520 |

This set of examples demonstrated the effect of different heating conditions during the fabrication of the abrasive article. This set of examples also demonstrated the cut rate of the abrasive article over a period of time.

EXAMPLES 65 THROUGH 70

This set of examples, prepared as described in Examples 44–46, compared various abrasive slurry formulations. The amount of the materials is listed in Table 25.

TABLE 25

Abrasive Slurry Formulations for Examples 65 through 70

| Material | Ex. 65 and 66 | Ex. 67 | Ex. 68 | Ex. 61 | Ex. 70 |
|---|---|---|---|---|---|
| TMPTA | 0 | 0 | 0 | 7.5 | 0 |
| HDDA | 32.0 | 32.0 | 32.0 | 22.50 | 35.0 |
| ABP | 48.0 | 25.45 | 0 | 0 | 0 |
| PP | 0 | 22.65 | 48.0 | 45.0 | 35.0 |
| CA3 | 4.08 | 4.08 | 4.08 | 2.48 | 3.84 |
| PH1 | 2.56 | 2.56 | 2.56 | 2.40 | 2.8 |
| CBO1 | 123.75 | 123.75 | 123.75 | 123.75 | 123.75 |
| CACO2 | 80.00 | 80.00 | 80.00 | 68.3 | 68.30 |

The abrasive article for Example 65 was made according to the General Procedure I for Making the Abrasive Article using Pattern #1 except for the following changes. A glass plate was installed over the production tool and the ultraviolet light was transmitted through the glass plate and through the production tool and into the abrasive slurry.

The abrasive article for Example 66 was made according to the General Procedure I for Making the Abrasive Article using Pattern #1 except for the following changes. The ultraviolet light was transmitted through the production tool and into the abrasive slurry. Also there was only one pass of the sample under the ultraviolet light.

The abrasive articles for Examples 67 through 70 were made according to the General Procedure I for Making the Abrasive Article using Pattern #1.

The abrasive articles for Examples 65 through 70 were tested according to Test Procedure IX except for the changes noted below. The test results are listed in Table 26. Note the cut rate was an average of five readings and was measured in Angstroms/minute of material removed.

TABLE 26

| Example | Cut Rate | Cut Rate* | Cut Rate** |
|---------|----------|-----------|------------|
| 65 | 2702 | | |
| 66 | 983 | | |
| 67 | 1640 | | |
| 68 | 2283 | 2285 | 2640 |
| 69 | 2318 | | |
| 70 | 1240 | | |

*In this test procedure the workpiece rotated at about 60 rpm and the abrasive article rotated at about 70 rpm.
**In this test procedure the workpiece rotated at about 45 rpm and the abrasive article rotated at about 100 rpm.

EXAMPLES 71 AND 72

An abrasive slurry for Example 72 was prepared by mixing, with an air stirrer, 7.5 grams of TMPTA, 22.50 grams of HDDA, 45.0 grams of PP, 4.95 grams of CA3 and 2.40 grams of PH1. Next, 123.75 grams of CEO1 were gradually added to this mixture. It took approximately 15 minutes to blend in the CEO1. Following this, 200.0 grams of CACO3 were added and the resulting blend was mixed for an additional five minutes.

An abrasive slurry for Example 72 was prepared by mixing, with an air stirrer, 30.0 grams of TMPTA, 90.0 grams of HDDA, 180.0 grams of PP, 19.8 grams of CA3 and 9.60 grams of PH1. Next, 495.0 grams of CEO1 were gradually added. It took about 15 minutes to blend in the CEO1 into this mixture. Following this, 320.0 grams of CACO3, 32.0 grams of CACO2 and 32.0 grams of CACO4 were gradually added and the resulting blend was mixed for an additional five minutes.

The abrasive articles for Examples 71 and 72 were made according to the General Procedure I for Making the Abrasive Article using Pattern #1 except for the following changes. A rubber roller was not used. Additionally, there was a quartz plate over the production tool and the ultraviolet light was transmitted through the quartz plate and the polymeric tooling. The abrasive articles for Examples 71 and 72 were tested according to Test Procedure VII. The test results are listed in Table 27. Note the cut rate was an average of five readings and was measured in Angstroms/minute of material removed.

TABLE 27

| Cut Rate | Example 71 | Example 72 |
|----------|------------|------------|
| after 2 minutes of testing | 1260 | 500 |
| after 4 minutes of testing | 1700 | 1300 |
| after 6 minutes of testing | 2080 | 1750 |
| after 8 minutes of testing | 2310 | 1990 |
| after 10 minutes of testing | | 2260 |
| after 12 minutes of testing | | 2120 |
| after 14 minutes of testing | | 2530 |

EXAMPLES 73 AND 74

An abrasive slurry for Example 73 was prepared by mixing, with an air stirrer, 7.5 grams of TMPTA, 22.50 grams of HDDA, 45.0 grams of DUP, 4.95 grams of CA3 and 2.40 grams of PH1. Next, 123.75 grams of CEO1 were gradually added. It took about 15 minutes to blend in the CEO1. Following this, 110. grams of CACO3, 20.0 grams of CACO2 and 10.0 grams of CACO4 were gradually added and the resulting blend was mixed for an additional five minutes.

An abrasive slurry for Example 74 was prepared by mixing, with an air stirrer, 7.5 grams of TMPTA, 22.50 grams of HDDA, 45.0 grams of PP, 4.95 grams of CA3 and 2.40 grams of PH1. Next, 123.75 grams of CEO1 were gradually added. It took about 15 minutes to blend in the CEO1. Following this, 200.0 grams of CACO3 were gradually added and the resulting blend was mixed for an additional five minutes.

The abrasive articles for Examples 73 and 74 were made according to the General Procedure I for Making the Abrasive Article using Pattern #1 except for the following changes. A rubber roller was not used. Additionally, there was a quartz plate over the production tool and the ultraviolet light was transmitted through the quartz plate and the polymeric tooling. The abrasive articles for Examples 73 and 74 were tested according to Test Procedure VII. The test results are listed in Table 28. Note the cut rate was an average of five readings and was measured in Angstroms/minute of material removed.

TABLE 28

| Cut Rate | Example 73* | Example 74 |
|----------|-------------|------------|
| after 2 minutes of testing | 1550 | 2160 |
| after 4 minutes of testing | 1450 | 2380 |

*Note that the first cycle was only 1.5 minutes and the second cycle was only 0.75 minutes for Example 73.

EXAMPLE 75

The abrasive article of Example 75 was made from an abrasive slurry that used a thermally cured binder precursor. The abrasive slurry for Example 75 was prepared by mixing, with an air stirrer 30.0 grams of EPR, 6.14 grams of EC and 72.29 grams of CEO2. The CEO2 was gradually added to this mixture of epoxy resin and curative. A production tool was provided that was made as described in Pattern #1. The production tool was secured to a metal carrier plate using a masking type pressure sensitive adhesive tape. The abrasive slurry was coated into the cavities of the production tool using a rubber squeegee such that the abrasive slurry completely filled the cavities. Next, a PPF backing was brought into contact with the abrasive slurry contained in the cavities of the production tool. A rubber roller was rolled across the back surface of the backing to ensure that the abrasive slurry wetted the front surface of the backing and to remove any undesired air bubbles. The article was cured by heating the sample for about one hour at 65.5° C. (150° F.). Next, the polyester film/abrasive composite construction was separated from the production tool to form an abrasive article. There was some distortion of the production tool during the thermal cure of the epoxy, which resulted in some distortion of the abrasive pattern.

The abrasive article was then heated for about 15 seconds to one minute at about 110 to 115.5° C. (230 to 240° F.) to activate the primer on the PPF backing.

To prepare the abrasive article for testing, two abrasive articles were joined together and laminated to a pressure sensitive adhesive tape commercially available from 3M, St. Paul, Minn., under the trade designation "Scotch 467MP Hi Performance Adhesive". Then, a 30.5 cm (12 inch) diameter circular test sample was die cut for testing.

The resulting abrasive article was tested according to Test Procedure VII.

After two minutes of testing, the cut rate was 1090 Angstroms/minute. After four minutes of testing, the cut rate was 1370 Angstroms/minute.

EXAMPLE 76

The abrasive article of Example 76 was made from an abrasive slurry that used a partially polymerized ethylenically unsaturated monomer made according to the following procedure. First, 209.5 grams of isooctyl acrylic acid and 0.81 grams of bensildimethyl-ketal photoinitiator were added into a vessel. The resulting mixture was first purged with nitrogen for 15 minutes. Then the vessel was exposed to a single Black Lamp that operated at 15 Watts for 30 seconds to partially polymerize the acrylate monomer. The resulting partially polymerized isooctyl acrylic acid had a viscosity of about 7800 centipoise.

An abrasive slurry for Example 76 was prepared by mixing, with an air stirrer, 1.18 parts CA3, 6.54 parts HDDA, 3.08 parts TMPTA, 16.15 parts PP, 1.0 part PH7 and 1.15 parts of the partially polymerized ethylenically unsaturated monomer. Next, 47.57 parts of CEO1 were gradually added. It took about 15 minutes to blend in the CEO1 into this mixture. Following this of 23.33 parts of CACO3 were gradually added and the resulting blend was mixed for an additional five minutes.

The abrasive article for Example 76 was made according to the General Procedure I for Making the Abrasive Article using Pattern #1 except for the following changes. A rubber roller was not used. Additionally, there was a quartz plate over the production tool and the ultraviolet light was transmitted through the quartz plate and the polymeric tooling. The abrasive article for Example 76 tested according to Test Procedure VII. The test results are listed in Table 29. Note the cut rate was an average of five readings and was measured in Angstroms/minute of material removed.

TABLE 29

| Cut Rate | Example 76 |
|---|---|
| after 2 minutes of testing | 570 |
| after 4 minutes of testing | 1090 |
| after 6 minutes of testing | 1250 |
| after 8 minutes of testing | 1220 |

EXAMPLES 77 THROUGH 80

This set of examples compared various levels of the ceria abrasive grain in the fixed abrasive article; the amount of materials is listed in Table 30. The abrasive slurry was prepared by mixing, with an air stirrer, TMPTA, HDDA, PP, CA3 and PH7. Next, CEO1 was gradually added to the abrasive slurry until it was substantially dispersed. Following this, CACO3, CACO2 and CACO4 were also gradually mixed into the abrasive slurry until the calcium carbonate particles were substantially dispersed.

TABLE 30

Abrasive Slurry Formulations for Examples 77 through 80

| Material | Ex. 77 | Ex. 78 | Ex. 79 | Ex. 80 |
|---|---|---|---|---|
| TMPTA | 8.44 | 8.44 | 8.44 | 8.44 |
| HDDA | 25.31 | 25.31 | 25.31 | 25.31 |
| PP | 41.25 | 41.25 | 41.25 | 41.25 |
| CA3 | 4.95 | 4.95 | 4.95 | 4.95 |
| PH7 | 2.40 | 2.40 | 2.40 | 2.40 |
| CEO1 | 30.94 | 61.88 | 92.81 | 123.75 |
| CACO3 | 71.91 | 68.07 | 64.25 | 60.42 |
| CACO2 | 17.05 | 13.21 | 9.39 | 5.56 |
| CACO4 | 12.88 | 9.04 | 5.22 | 1.39 |

The abrasive article for each example was made according to General Procedure IV for Making the Abrasive Article using Pattern #1. The resulting abrasive articles were tested according to Test Procedure XI. The test results can be found in Table 31. The cut rate was measured as Angstroms of silicon dioxide removed in the one minute interval.

TABLE 31

| Example | Cut Rate Angstroms/minute |
|---|---|
| 77 | 148 |
| 78 | 500 |
| 79 | 1311 |
| 80 | 1580 |

This data indicated that there were differences in how much silicon dioxide was removed by the abrasive article depending upon the amount of ceria present.

EXAMPLES 81 THROUGH 84

This set of examples, prepared and tested according to the procedure of Examples 77–80, compared various abrasive slurry formulations that were used to make the abrasive article. The amount of materials is listed in Table 32. Test results are shown in Table 33.

TABLE 32

Abrasive Slurry Formulations for Examples 81 through 84

| Material | Ex. 81 | Ex. 82 | Ex. 83 | Ex. 84 |
|---|---|---|---|---|
| TMPTA | 8.44 | 8.44 | 8.44 | 8.44 |
| HDDA | 25.31 | 25.31 | 25.31 | 25.31 |
| PP | 41.25 | 41.25 | 41.25 | 41.25 |
| CA3 | 0 | 0 | 4.95 | 0 |
| DA1 | 4.70 | 4.95 | 0.3 | 2.48 |
| PH7 | 2.40 | 2.40 | 2.40 | 2.40 |
| CE01 | 123.75 | 123.75 | 123.75 | 123.75 |
| CAC03 | 60.42 | 0 | 60.42 | 60.42 |
| CAC02 | 5.56 | 0 | 5.56 | 5.56 |
| CAC04 | 1.39 | 67.37 | 1.39 | 1.39 |

TABLE 33

Test Procedure XI

| Example | Cut Rate Angstroms/minute |
|---|---|
| 81 | 1393 |
| 82 | 1667 |
| 83 | 1348 |
| 84 | 1141 |

This data indicated that there were differences in how much silicon dioxide was removed by the abrasive article depending upon the materials and their respective amounts present in the abrasive coating.

EXAMPLES 85 THROUGH 87

This set of examples, prepared as described for Examples 77–80, compared various abrasive slurry formulations that contained different levels of plasticizer to make the abrasive article. The amount of materials is listed in Table 34.

TABLE 34

Abrasive Slurry Formulations for Examples 85 through 87

| Material | Ex. 85 | Ex. 86 | Ex. 87 |
|---|---|---|---|
| TMPTA | 11.25 | 9.38 | 8.44 |
| HDDA | 33.75 | 28.13 | 25.31 |
| PP | 30 | 37.5 | 41.25 |
| CA3 | 4.95 | 4.95 | 4.95 |
| PH7 | 3.6 | 3.0 | 2.7 |
| CE01 | 123.75 | 123.75 | 123.75 |
| CAC03 | 67.37 | 67.37 | 67.37 |

The abrasive article for each example was made according to General Procedure I for Making the Abrasive Article using Pattern #1. The resulting abrasive articles were tested according to Test Procedure X. The test results can be found in Table 35. The cut rate was measured as Angstroms of silicon dioxide removed in the one minute interval.

TABLE 35

| Example | Cut Rate Angstroms/minute |
|---|---|
| 85 | 497 |
| 86 | 1060 |
| 87 | 1382 |

This data indicated that there were differences in how much silicon dioxide was removed by the abrasive article depending upon the materials and their respective amounts present in the abrasive coating.

EXAMPLES 88 THROUGH 91

This set of examples, prepared as described in Examples 77–80, compared various abrasive slurry formulations that were used to make the abrasive article. The amount of materials is listed in Table 36.

TABLE 36

Abrasive Slurry Formulations for Examples 88 through 91

| Material | Ex. 88 | Ex. 89 | Ex. 90 | Ex. 91 |
|---|---|---|---|---|
| TMPTA | 180 | 285 | 320.63 | 180 |
| HDDA | 540 | 855 | 961.88 | 540 |
| PP | 1080 | 1710 | 1567.5 | 1080 |
| CA3 | 118.80 | 0 | 188.10 | 118.80 |
| PH7 | 57.60 | 91.20 | 91.20 | 57.60 |
| KD2 | 0 | 150.48 | 0 | 0 |
| CE01 | 2970 | 4702.5 | 4702.5 | 2970 |
| CAC03 | 1450 | 2296 | 2296 | 1450 |
| CAC02 | 133.33 | 211 | 211 | 133.33 |
| CAC04 | 33.33 | 52.7 | 52.8 | 33.33 |

The abrasive article for Example 88 was made according to General Procedure II for Making the Abrasive Article using Pattern #1. The abrasive article for Examples 89 through 91 were made according to General Procedure II for Making the Abrasive Article Using Pattern #1 except that the ultraviolet light was transmitted through the backing. The resulting abrasive articles were tested according to Test Procedures XII and XIII. The test results can be found in Table 37. The cut rate was measured as Angstroms of silicon dioxide removed in the one minute interval.

TABLE 37

Test Procedures XII and XIII

| Example | Test Procedure XII Cut Rate Angstroms/Minute | Test Procedure XIII Cut Rate Angstroms/Minute |
|---|---|---|
| 88 | 62 | 84 |
| 89 | 2113 | 2045 |
| 90 | 1462 | 916 |
| 91 | 1546 | 1220 |

This data indicated that there were differences in how much silicon dioxide was removed by the abrasive article depending upon the materials and their respective amounts present in the abrasive coating. Additionally, this data indicated that there were differences in the cut rate depending upon how the ultraviolet light was transmitted into the abrasive slurry to solidify the binder precursor. Likewise, this data indicated that there were differences in the cut rate depending upon the pH of the KOH solution.

EXAMPLES 92 AND 93

This set of examples, prepared as described in Examples 77–80, compared two different plasticizers in the abrasive slurry formulations that were used to make the abrasive article. The amount of materials is listed in Table 38.

TABLE 38

Abrasive Slurry Formulations for Examples 92 and 93

| Material | Ex. 92 | Ex. 93 |
|---|---|---|
| TMPTA | 7.50 | 7.50 |
| HDDA | 22.50 | 22.50 |
| PP | 45.00 | 0 |
| PEG | 0 | 45.00 |
| CA3 | 4.95 | 4.95 |
| PH1 | 2.40 | 2.40 |
| CE01 | 123.75 | 123.75 |
| CAC03 | 60.42 | 60.42 |
| CAC02 | 5.56 | 5.56 |
| CAC04 | 1.39 | 1.39 |

The abrasive article for Example 92 was made according to General Procedure IV for Making the Abrasive Article using Pattern #1. The abrasive article for Example 93 was made according to General Procedure IV for Making the Abrasive Article using Pattern #1, except that the sample was heated for one minute at 110° C. (230° F.) to activate the film primer prior to the abrasive article being removed from the production tool. The resulting abrasive articles were tested according to Test Procedure X. The test results can be found in Table 39. The cut rate was measured as Angstroms of silicon dioxide removed in the one minute interval.

TABLE 39

| Example | Cut Rate Angstroms/Minute |
|---|---|
| 92 | 2770 |
| 93 | 1860 |

It should be noted that, after testing, the abrasive article from Example 93 was severely damaged and unusable in the testing of any additional semiconductor wafers. This data indicated that there were differences in how much silicon dioxide was removed according to the plasticizer present in the abrasive coating.

EXAMPLES 94 AND 95

This set of examples, prepared as described in Examples 77–80, compared monofunctional acrylates in the abrasive slurry formulations that were used to make the abrasive article. The amount of materials is listed in Table 40.

TABLE 40

Abrasive Slurry Formulations for Examples 94 and 95

| Material | Example 94 | Example 95 |
|---|---|---|
| HDDA | 7.16 | 7.10 |
| MA1 | 63.91 | 0 |
| MA2 | 0 | 64.50 |
| CA3 | 0.76 | 0.74 |
| KD2 | 0.74 | 0.75 |
| PH7 | 2.28 | 2.27 |
| CE01 | 184.8 | 184.6 |
| CAC03 | 75.84 | 59.9 |
| CAC02 | 5.59 | 16.28 |
| CAC04 | 1.4 | 1.40 |

The abrasive articles for these examples were made according to the General Procedure VI for Making the Abrasive Article using Pattern #1. The resulting abrasive article was tested according to Test Procedure XIV. The test results are detailed in Table 41. Note the cut rates were averages of one to ten readings and were measured in Angstroms/minute of material removed.

TABLE 41

| Example | Cut Rate Angstroms/Minute |
|---|---|
| 94 | 1140 |
| 95 | 2240 |

These examples demonstrate the ability of a fixed abrasive article that did not contain any plasticizer in the abrasive coating to remove silicon dioxide from an semiconductor wafer test workpiece.

EXAMPLES 96 THROUGH 98

This set of examples, prepared and tested as described for Examples 94 and 95, compared various levels of plasticizer in the abrasive slurry formulations that were used to make the abrasive article. The amount of materials is listed in Table 42 and test results are shown in Table 43.

TABLE 42

Abrasive Slurry Formulations for Examples 96 through 98

| Material | Example 96 | Example 97 | Example 98 |
|---|---|---|---|
| TMPTA | 6.56 | 5.63 | 4.69 |
| HDDA | 19.69 | 16.87 | 14.06 |
| PP | 48.75 | 52.50 | 56.25 |
| CA3 | 4.95 | 4.95 | 4.95 |
| PH7 | 2.4 | 2.40 | 2.4 |
| CE01 | 123.75 | 123.75 | 123.75 |
| CAC03 | 60.4 | 60.4 | 60.40 |
| CAC02 | 5.6 | 5.6 | 5.6 |
| CAC04 | 1.4 | 1.4 | 1.4 |

TABLE 43

Test Procedure XIV

| Example | Cut Rate Angstroms/Minute |
|---|---|
| 96 | 2320 |
| 97 | 2840 |
| 98 | 2250 |

These examples demonstrate the utility of ceria-based abrasives containing a range of plasticizer to remove silicon dioxide from an semiconductor wafer test workpiece.

EXAMPLES 99 THROUGH 102

This set of examples demonstrated the use of an air corona post-treatment as means to dress the fixed abrasive article. The abrasive slurry was prepared by mixing, with an air stirrer, TMPTA, HDDA, PP, CA3, and PH7. Next, CE01 was gradually added to the mixture. Following this, calcium carbonate was gradually added. The amount of the materials, in grams, for the abrasive slurry is listed in Table 44.

TABLE 44

Abrasive Slurry Formulations for Examples 99 through 102

| Material | Abrasive Slurry Formulations for Examples 99 through 102 |
|---|---|
| TMPTA | 540 |
| HDDA | 1620 |
| PP | 3240 |
| CA3 | 356.4 |
| PH7 | 172.8 |
| CE01 | 8910 |
| CAC03 | 5760 |
| CAC05 | 176 |
| CAC02 | 400 |
| CAC04 | 100 |

The fixed abrasive articles for these examples were made according to the General Procedure II for Making the Abrasive Article using Pattern #1. The abrasive articles of Examples 99 through 101 were treated with an air corona using a Sherman corona treating unit (Sherman Treaters, Ltd., United Kingdom) in the bare ground role configuration. The abrasive article of Example 99 was treated with the air corona at an energy level 31.2 joules/cm$^2$. The abrasive article of Example 100 was treated with the air corona at an energy level 41.2 joules/cm$^2$. The abrasive article of Example 101 was treated with the air corona at an energy level 50 joules/cm$^2$. Additionally the abrasive articles of Examples 100 and 101 were treated twice at half the energy density to obtain the total energy level. The abrasive article of Example 102 was not air corona treated. This set of abrasive articles was tested according to Test Procedure XIV. Note the cut rate is an average of cut rates of one to five workpieces tested per example. The test results can be found in Table 45.

TABLE 45

| Example | Cut Rate Angstroms/Minute |
|---|---|
| 99 | 38 |
| 100 | 29 |

TABLE 45-continued

| Example | Cut Rate Angstroms/Minute |
|---|---|
| 101 | 105 |
| 102 | 22 |

It was evident from the above data table that use of the corona energy significantly affected the resulting cut rate of the abrasive article.

EXAMPLES 103 THROUGH 108

This set of examples compared different abrasive slurry formulations that contained various types of abrasive particles. The abrasive slurry was prepared by mixing, with an air stirrer, TMPTA, HDDA, PP, CA3 and PH1. Next, CEO1 was gradually added to the abrasive slurry until it was substantially dispersed into the abrasive slurry. Following this, the other abrasive particles were also gradually mixed into the abrasive slurry until they were substantially dispersed into the abrasive slurry. The amount of materials is listed in Table 46.

TABLE 46

Abrasive Slurry Formulations for Examples 103 through 108

| Material | Ex. 103 | Ex. 104 | Ex. 105 | Ex. 106 | Ex. 107 | Ex. 108 |
|---|---|---|---|---|---|---|
| TMPTA | 9.38 | 9.38 | 9.38 | 9.54 | 9.54 | 9.54 |
| HDDA | 28.13 | 28.13 | 28.13 | 28.61 | 28.61 | 28.13 |
| PP | 37.50 | 37.50 | 37.50 | 36.85 | 36.85 | 37.5 |
| CA3 | 4.95 | 4.95 | 4.95 | 4.95 | 4.95 | 4.95 |
| PH1 | 3.00 | 3.00 | 3.00 | 2.4 | 2.4 | 3.00 |
| CE01 | 123.75 | 123.75 | 123.75 | 120 | 120 | 120 |
| SIZR | 56.0 | 0 | 0 | 0 | 0 | 0 |
| SIN | 0 | 75 | 0 | 0 | 0 | 0 |
| YZR1 | 0 | 0 | 120 | 0 | 0 | 80 |
| ZR | 0 | 0 | 0 | 125 | 0 | 0 |
| YZR2 | 0 | 0 | 0 | 0 | 125 | 45 |

The abrasive articles for Examples 103 through 108 were made according to General Procedure IV for Making the Abrasive Article using Pattern #1. The resulting abrasive articles were tested according to Test Procedure XV. The test results can be found in Table 47. The cut rate was measured as Angstroms/minute of silicon dioxide removed. The test length varied.

TABLE 47

| Cut Rate after __minutes of testing | Ex. 103 | Ex. 104 | Ex. 105 | Ex. 106 | Ex. 107 | Ex. 108 |
|---|---|---|---|---|---|---|
| 2 | 210 | 780 | 2330 | 2070 | 1460 | 2720 |
| 4 | 280 | 630 | 1860 | 2100 | 2140 | 2610 |
| 6 | 340 | | 2470 | 1670 | 2090 | 2470 |
| 8 | | | 2290 | 1980 | 2310 | 2420 |
| 10 | | | 2560 | 1340 | 2360 | 2400 |
| 12 | | | 2540 | 950 | 2430 | 2320 |
| 14 | | | 2550 | | 2230 | 2440 |
| 16 | | | 2610 | | 2330 | 2510 |
| 18 | | | 2160 | | 2100 | 2470 |
| 20 | | | 2500 | | 1530 | 2340 |
| 22 | | | | | | 2310 |
| 24 | | | | | | 2420 |
| 26 | | | | | | 2380 |
| 28 | | | | | | 2350 |
| 30 | | | | | | 2430 |
| 32 | | | | | | 2410 |

TABLE 47-continued

| Cut Rate after __minutes of testing | Ex. 103 | Ex. 104 | Ex. 105 | Ex. 106 | Ex. 107 | Ex. 108 |
|---|---|---|---|---|---|---|
| 34 | | | | | | 2590 |
| 36 | | | | | | 2520 |
| 38 | | | | | | 2330 |
| 40 | | | | | | 2570 |

This data indicated that there were differences in how much silicon dioxide was removed depending upon the type and amount of abrasive particles in the abrasive coating.

For Example 108, after 40 minutes of testing (i.e., 20 wafers) the abrasive article was used to treat a wafer (the 21st test wafer) for 2.5 minutes. After this step, the test wafer was cleaned with distilled water and dried using a stream of clean air. The surface finish of the wafer was measured using a Wyko Interferometer, Model #RST Plus, Tucson, Ariz. The surface finish was measured in five different locations. The test results can be found in Table 48.

TABLE 48

Surface Finish Measurements of the 21st Test Wafer by Example 108

| Location | RMS* | Ra |
|---|---|---|
| 1 | 0.79 nm | 0.62 nm |
| 2 | 0.93 nm | 0.75 nm |
| 3 | 0.95 nm | 0.75 nm |
| 4 | 0.95 nm | 0.76 nm |
| 5 | 0.77 nm | 0.62 nm |

*RMS refers to the root mean square of the deviation from the reference plane.

EXAMPLE 109

The abrasive slurry for this example contained an ammonium salt. The abrasive slurry was prepared by mixing, with an air stirrer, TMPTA, HDDA, CA3 and PH1. Next, CEO1 was gradually added to the abrasive slurry until it was substantially dispersed. Following this, the other abrasive particles and NHC were also gradually mixed into the abrasive slurry until they were substantially dispersed. The amount of materials is listed in Table 49.

TABLE 49

Abrasive Slurry Formulation for Example 109

| Material | Ex. 109 |
|---|---|
| TMPTA | 18.75 |
| HDDA | 56.25 |
| CA3 | 4.95 |
| PH1 | 3.00 |
| CE01 | 80 |
| ZR | 147.2 |
| NHC | 10.4 |

The abrasive article for Example 109 was made according to General Procedure IV for Making the Abrasive Article using Pattern #1. The resulting abrasive article was tested according to Test Procedure XVI. The test results can be found in Table 50. The cut rate was measured as Angstroms/minute of silicon dioxide removed. The test length was five minutes and the cut rate was measured after one minute of treatment.

TABLE 50

| Cut Rate | Ex. 109 |
|---|---|
| after 1 minute of testing | 740 |
| after 2 minutes of testing | 640 |
| after 3 minutes of testing | 740 |
| after 4 minutes of testing | 680 |
| after 5 minutes of testing | 580 |

EXAMPLES 110 AND 111

This abrasive slurry for this set examples contained a complexing agent. The abrasive slurries were prepared by mixing, with an air stirrer, TMPTA, HDDA, PP, CA3 or KD2 and PH1. Next, the abrasive particles were gradually added to the abrasive slurry until it was substantially dispersed into the abrasive slurry. Following this, either TANA or SAA was gradually mixed into the abrasive slurry until they were substantially dispersed. The amount of materials for the abrasive slurries can be found in Table 51.

TABLE 51

Abrasive Slurry Formulations for Examples 110 and 111

| Material | Example 110 | Example 111 |
|---|---|---|
| TMPTA | 11.25 | 14.26 |
| HDDA | 33.75 | 42.77 |
| PP | 30 | 0 |
| CA3 | 4.95 | 0 |
| KD2 | 0 | 3.04 |
| PH1 | 3 | 1.82 |
| YZR1 | 87.47 | 0 |
| ZRO | 83.05 | 0 |
| YZR2 | 0 | 221.68 |
| TANA | 20 | 0 |
| SAA | 0 | 20 |

The abrasive articles for Example 110 and 111 were made according to General Procedure IV for Making the Abrasive Article using Pattern #1. The resulting abrasive articles were tested according to Test Procedures XVI. The test results can be found in Table 52. The cut rate was measured as Angstroms/minute of silicon dioxide removed. The test length was variable and the cut rate was measured after a single minute of treatment.

TABLE 52

| Cut Rate (Angstroms/minute) | Example 110 | Example 111 |
|---|---|---|
| after 1 minute of testing | 200 | 1270 |
| after 2 minutes of testing | 150 | 340 |
| after 3 minutes of testing |  | 230 |

It can be seen from the above data that different cut rates were achieved with abrasive articles that were made with different abrasive slurries.

The abrasive article of Example 111 was also tested according to Test Procedure XVII. The TIR was measured before testing to be 500 nanometers. The TIR after testing was 40 nanometers.

EXAMPLES 112 THROUGH 114

This set of examples compared various abrasive slurry formulations that were used to make the abrasive article. The abrasive slurry was prepared by mixing, with an air stirrer, TMPTA, HDDA, PP, CA3, KD2 and PH1. Next, CEO1 was gradually added to the abrasive slurry until it was substantially dispersed. Following this, zirconia and/or calcium carbonate were also gradually mixed into the abrasive slurry until these particles were substantially dispersed. The amount of materials, in grams, for the abrasive slurries can be found in Table 53.

TABLE 53

Abrasive Slurry Formulations for Examples 112 through 114

| Material | Example 112 | Example 113 | Example 114 |
|---|---|---|---|
| TMPTA | 8.44 | 10 | 18.01 |
| HDDA | 25.31 | 30 | 54.02 |
| PP | 41.25 | 35 | 0 |
| CA3 | 4.95 | 4.95 | 0 |
| KD2 | 0 | 0 | 3.84 |
| PH1 | 2.4 | 3 | 2.88 |
| CEO1 | 124 | 76.14 | 151.5 |
| ZRO | 0 | 178.96 | 354.11 |
| CACO3 | 69 | 0 | 0 |

The abrasive articles for Examples 112 through 114 were made according to General Procedure IV for Making the Abrasive Article using Pattern #1. The resulting abrasive articles were tested according to Test Procedures XVII. The test results can be found in Table 54.

TABLE 54

| Example | TIR Prior to Treatment | TIR After Treatment |
|---|---|---|
| 112 | 600 nm | 210 nm |
| 113 | 600 nm | 183 nm |
| 114 | 600 nm | 72 nm |

This data indicated that different abrasive coating formulations achieved different TIR levels.

EXAMPLES 115 AND 117

This set of examples compared various abrasive slurry formulations that were used to make the abrasive article. The abrasive slurry was prepared by mixing, with an air stirrer, HDDA, MA2, CA3 and PH7. Next, CEO1 was gradually added to the abrasive slurry until it was substantially dispersed. Following this, CACO3, CACO2 and CACO4 were also gradually mixed into the abrasive slurry until these particles were substantially dispersed. The amount of materials, in grams, for the abrasive slurries can be found in Table 55.

TABLE 55

Abrasive Slurry Formulations for Examples 115 through 117

| Material | Example 115 | Example 116 | Example 117 |
|---|---|---|---|
| HDDA | 7.50 | 9.00 | 10.51 |
| MA2 | 67.53 | 66.0 | 64.50 |
| CA3 | 4.95 | 4.97 | 4.95 |
| PH7 | 2.40 | 2.42 | 2.42 |
| CEO1 | 123.78 | 123.78 | 123.75 |
| CACO3 | 84.03 | 84.01 | 83.05 |
| CACO2 | 5.62 | 5.61 | 5.62 |
| CACO4 | 1.41 | 1.41 | 1.40 |

The abrasive article for Examples 115 through 117 were made according to General Procedure VI for Making the Abrasive Article using Pattern #1. The resulting abrasive articles were tested according to Test Procedure XX. The test results can be found in Table 56.

TABLE 56

| Example | Average Cut (Angstroms/minute) |
|---------|-------------------------------|
| 115 | 3400 |
| 116 | 400 |
| 117 | 100 |

It was evident from the above data that there were differences in cut rate depending upon the formulation of the abrasive coating.

EXAMPLES 118 THROUGH 122

This set of examples compared various cerium oxide abrasive particles. The abrasive slurry was prepared as described for Examples 77–80. The amount of materials is listed in Table 57.

TABLE 57

Abrasive Slurry Formulations for Examples 118 through 122

| Material | Ex. 118 | Ex. 119 | Ex. 120 | Ex. 121 | Ex. 122 |
|----------|---------|---------|---------|---------|---------|
| TMPTA | 8.47 | 8.46 | 8.46 | 8.44 | 8.44 |
| HDDA | 25.35 | 25.34 | 25.53 | 25.34 | 25.31 |
| PP | 41.29 | 41.3 | 41.27 | 41.28 | 41.25 |
| CA3 | 4.96 | 4.98 | 4.96 | 4.96 | 4.95 |
| PH7 | 2.40 | 2.44 | 2.41 | 2.42 | 2.42 |
| CEO1 | 123.77 | 0 | 0 | 0 | 0 |
| CEO3 | 0 | 123.80 | 0 | 0 | 0 |
| CEO4 | 0 | 0 | 0 | 123.76 | 0 |
| CEO5 | 0 | 0 | 123.76 | 0 | 0 |
| CEO6 | 0 | 0 | 0 | 0 | 123.75 |
| CACO3 | 60.41 | 60.41 | 60.43 | 60.41 | 60.40 |
| CACO2 | 5.64 | 3.62 | 5.63 | 5.61 | 5.60 |
| CACO4 | 1.42 | 1.43 | 1.40 | 1.41 | 1.40 |

The abrasive articles for Examples 118 through 122 were made according to General Procedure VI for Making the Abrasive Article using Pattern #1. The resulting abrasive articles were tested according to Test Procedure XIX. The test results can be found in Table 58.

TABLE 58

| Example | Average Cut (Angstroms/minute) |
|---------|-------------------------------|
| 118 | 1846 |
| 119 | 1651 |
| 120 | 859 |
| 121 | 1368 |
| 122 | 490 |

EXAMPLES 123 AND 124

This set of examples compared the cut rate of a fixed abrasive article with an external lubricant present in the fluid medium to the cut rate of the same fixed abrasive article without an external lubricant present in the fluid medium. The abrasive article was made according to General Procedure I for Making the Abrasive Article using Pattern #1. The abrasive slurry was prepared by mixing, with an air stirrer, 8.44 parts TMPTA, 25.31 parts HDDA, 41.25 parts PP, 4.95 parts CA3 and 2.40 parts PH7. Next, 123.75 parts of cerium oxide abrasive particles (CEO1) were gradually added to the abrasive slurry until it was substantially dispersed. Following this, 60.40 parts of CACO3, 5.60 parts of CACO2 and 1.40 parts of CACO4 were also gradually mixed into the abrasive slurry until these particles were substantially dispersed.

The abrasive article of Example 123 was tested according to Test Procedure III. The abrasive article of Example 124 was tested according to Test Procedure III except that the fluid medium contained 0.5% by weight of a water soluble polyethylene oxide polymer commercially available from Union Carbide of Danbury, Conn. under the trade designation "Polyox 1105". The test results are shown in Table 59.

TABLE 59

| Example | Average Cut (Angstroms/minute) |
|---------|-------------------------------|
| 123 | 1610 |
| 124 | 1420 |

EXAMPLES 125 THROUGH 129

This set of examples compared various abrasive slurry formulations that were used to make the abrasive articles. The abrasive slurry was prepared by mixing, with an air stirrer, MA3, HDDA, PP, CA3 and PH7. Next, the cerium oxide abrasive particles were gradually added to the abrasive slurry until it was substantially dispersed.. Following this, CACO3 and CACO4 were also gradually mixed into the abrasive slurry until these particles were substantially dispersed. The amount of materials, in grams, for the abrasive slurries can be found in Table 60.

TABLE 60

Abrasive Slurry Formulations for Examples 125 through 129

| Material | Ex. 125 | Ex. 126 | Ex. 127 | Ex. 128 | Ex. 129 |
|----------|---------|---------|---------|---------|---------|
| MA3 | 8.44 | 11.25 | 16.85 | 18.75 | 15.0 |
| HDDA | 25.32 | 33.75 | 50.55 | 56.25 | 45.0 |
| PP | 41.25 | 30.0 | 7.50 | 0 | 15.0 |
| CA3 | 4.95 | 4.95 | 4.95 | 4.95 | 4.95 |
| PH7 | 2.70 | 2.70 | 2.70 | 6.0 | 2.70 |
| CE01 | 123.75 | 123.75 | 123.75 | 123.75 | 123.75 |
| CAC03 | 67.36 | 67.36 | 67.36 | 67.36 | 67.36 |
| CAC04 | 8.0 | 8.0 | 13.0 | 15.0 | 13.0 |

The abrasive articles for Examples 125 through 129 were made according to General Procedure IV for Making the Abrasive Article using Pattern #1. The resulting abrasive articles were tested according to Test Procedure XII. The test results can be found in Table 61.

TABLE 61

| Example | Average Cut (Angstroms/minute) |
|---------|-------------------------------|
| 125 | 1996 |
| 126 | 1107.5 |
| 127 | 320.0 |
| 128 | 146.7 |
| 129 | 420.0 |

It was evident from the above data that there were differences in cut rate depending upon the formulation of the abrasive slurry.

EXAMPLES 130 AND 131

This set of examples compared various abrasive slurry formulations that were used to make the abrasive articles. The abrasive slurry was prepared by mixing, with an air stirrer, TMPTA, MA4, PP, CA3 and PH7. Next, the cerium oxide abrasive particles were gradually added to the abrasive slurry until it was substantially dispersed. Following this, CACO3 was gradually mixed into the abrasive slurry until these particles were substantially dispersed. The amount of materials, in grams, for the abrasive slurries can be found in Table 62.

TABLE 62

Abrasive Slurry Formulations for Examples 130 and 131

| Material | Ex. 130 | Ex. 131 |
|---|---|---|
| TMPTA | 11.25 | 8.44 |
| MA4 | 33.75 | 25.32 |
| PP | 30 | 41.25 |
| CA3 | 4.95 | 4.95 |
| PH7 | 2.4 | 2.4 |
| CE01 | 123.75 | 123.75 |
| CAC03 | 67.36 | 67.36 |

The abrasive articles for Examples 130 and 131 were made according to General Procedure IV for Making the Abrasive Article using Pattern #1. The resulting abrasive articles were tested according to Test Procedure XII. The test results are in Table 63.

TABLE 63

| Example | Average Cut (Angstroms/minute) |
|---|---|
| 130 | 466.7 |
| 131 | 1876.7 |

It was evident from the above data that there were differences in cut rate depending upon the formulation of the abrasive slurry.

EXAMPLES 132 THROUGH 134

This set of examples, prepared by the procedure described in Examples 77–80, compared various abrasive slurry formulations that were used to make the abrasive articles. The amount of materials is listed in Table 64.

TABLE 64

Abrasive Slurry Formulations for Examples 132 through 134

| Material | Ex. 132 | Ex. 133 | Ex. 134 |
|---|---|---|---|
| MA2 | 18.75 | 3.68 | 3.68 |
| HDDA | 56.25 | 11.03 | 11.03 |
| CA3 | 4.95 | 0.97 | 1.41 |
| PH7 | 6.0 | 1.18 | 1.18 |
| CE01 | 123.75 | 24.26 | 35.26 |
| CAC03 | 67.36 | 13.20 | 13.20 |
| CAC04 | 8 | 3.57 | 0 |

The abrasive article for Examples 132 through 134 were made according to General Procedure IV for Making the Abrasive Article using Pattern #1. The resulting abrasive articles were tested according to Test Procedure XII. The test results are in Table 65.

TABLE 65

| Example | Average Cut (Angstroms/minute) |
|---|---|
| 132 | 583.3 |
| 133 | 516.7 |
| 134 | 340.0 |

It was evident from the above data that there were differences in cut rate depending upon the formulation of the abrasive slurry.

EXAMPLES 135 AND 136

This set of examples compared the viscosity of an abrasive slurry that did not contain a dispersing agent to the viscosity of an abrasive slurry that did contain a dispersing agent. The abrasive slurry was prepared by mixing, with an air stirrer, TMPTA, HDDA, PP, KD2 and PH7. Next, the ceria abrasive particles were gradually added to the abrasive slurry until it was substantially dispersed. Next, DA2 was added to the abrasive slurry. Following this, CACO2 was gradually mixed into the abrasive slurry until these particles were substantially dispersed. The amount of materials for the abrasive slurries is listed in Table 66.

TABLE 66

Abrasive Slurry Formulations for Examples 135 and 136

| Material | Ex. 135 | Ex. 136 |
|---|---|---|
| TMPTA | 8.44 | 8.44 |
| HDDA | 25.31 | 25.31 |
| PP | 41.25 | 41.25 |
| KD2 | 2.40 | 2.40 |
| PH7 | 2.40 | 2.40 |
| CE01 | 123.75 | 123.75 |
| DA2 | 0 | 2.40 |
| CAC02 | 67.40 | 67.40 |

The abrasive slurry corresponding to Example 135 was a thick paste. It would be difficult to process such a thick abrasive slurry to form an abrasive article. The abrasive slurry corresponding to Example 135 had an estimated viscosity of less than about 50,000 centipoise. At this viscosity range, the abrasive slurry can be more easily processed to form an abrasive article. Additionally, it can be seen from this data that the addition of a small amount of a dispersing agent can lower the viscosity of the resulting abrasive slurry.

EXAMPLE 137

This example used a zircon opacified glass frit as the abrasive particle. The abrasive slurry was prepared by mixing, with an air stirrer, 3.75 grams of TMPTA, 11.25 grams of HDDA, 22.51 grams of PP, 0.96 gram of CA3 and 1.21 grams of PH7. Next, 47.50 grams of a zircon opacified glass frit was gradually added to the abrasive slurry until it was substantially dispersed. Following this, 20.02 grams of CACO3, 2.02 grams of CACO2 and 2.01 grams CACO4 were gradually mixed into the abrasive slurry until these particles were substantially dispersed. The zirconia opacified glass frit had an average particle size of 3.67 micrometers and contained 25 to 50% by weight silica, about 14% zirconia, 14% of a mixture of alumina, boron oxide and calcium oxide. This particle was commercially available from Ferro Corporation, Cleveland, Ohio under the trade designation "CZ-110". The abrasive article for Example 137 was made according to General Procedure VI for Making the Abrasive Article using Pattern #1. The resulting abrasive article was tested according to Test Procedure XII. After 33 seconds the wafer slipped from the retaining ring. The cut rate was extrapolated to 360 Angstroms/minute.

EXAMPLES 138 AND 139

This set of examples compared various processes for making the abrasive article and the cut performance of the resulting abrasive articles. The same abrasive slurry was used in both examples. The abrasive slurries were prepared by mixing, with an air stirrer, 8.44 parts TMPTA, 25.31 parts HDDA, 41.25 parts PP, 4.95 parts CA3 and 2.40 parts PH7. Next, 123.75 parts of cerium oxide abrasive particles (CEO1) were gradually added to the abrasive slurry until it was substantially dispersed. Following this, 60.40 parts of CACO3, 5.60 parts of CACO2 and 1.40 parts of CACO4 were also gradually mixed into the abrasive slurry until these particles were substantially dispersed.

The abrasive article for Example 138 was made according to General Procedure V for Making the Abrasive Article Using Pattern #1.

The abrasive article for Example 139 was made according to General Procedure V for Making the Abrasive Article Using Pattern #1, except for the following changes. The abrasive slurry was coated into the production tool using a rubber squeegee. Then PFF backing was placed over the top of the abrasive slurry and the resulting composite was sandwiched between two rubber rolls at about 840 Pa (40 psi). The polyester film backing/abrasive slurry was pulled from the production tool. Next, this construction was taped to an aluminum board face up and exposed to ultraviolet light. The sample was sent two times through two ultraviolet lamps set at 157.5 Watts/cm (400 Watts/inch) at 10.7 meters/minute (35 feet/minute). The time between which the abrasive slurry was removed from the production tool to the time that the abrasive slurry was exposed to ultraviolet light was on the order of minutes.

The resulting abrasive articles were tested according to Test Procedure XIX. The test results can be found in Table 67. The cut rates are given in Angstroms/minute.

TABLE 67

| Example | Test Procedure XIX |
| --- | --- |
| 138 | 1846 |
| 139 | 2044 |

EXAMPLE 140

This example demonstrated the effect of pH of the fluid medium on the amount of silicon dioxide removed by the abrasive article. The abrasive article was manufactured by first preparing an abrasive slurry. The following materials were mixed together with an air stirrer, 8.44 parts TMPTA, 25.31 parts HDDA, 41.25 parts PP, 4.95 parts CA3 and 2.4 parts PH7. Next, 123.75 parts of cerium oxide abrasive particles (CEO1) were gradually added to the abrasive slurry until it was substantially dispersed into the abrasive slurry. Following this, 60.42 parts of CACO3, 5.56 parts of CACO2 and 1.39 parts of CACO4 were also gradually mixed into the abrasive slurry until these particles were substantially dispersed into the abrasive slurry. The abrasive article for Example 142 was made according to General Procedure V for Making the Abrasive Article Using Pattern #1.

The resulting abrasive article was tested according to Test Procedure XIX, except that the pH level was varied. The test results can be found in Table 68.

TABLE 68

Different pH Levels

| pH | Cut Rate (Angstroms/minute) |
| --- | --- |
| 7 deionized water only | 1433 |
| 8.5 | 1530 |

TABLE 68-continued

Different pH Levels

| pH | Cut Rate (Angstroms/minute) |
| --- | --- |
| 9.5 | 1248 |
| 10.5 | 1550 |
| 11.5 | 1366 |
| 12.5 | 1316 |

EXAMPLES 141 THROUGH 144

This set of examples, prepared as described in Examples 77–80, compared various abrasive slurry formulations that were used to make the abrasive articles. The amount of materials is listed in Table 69.

TABLE 69

Abrasive Slurry Formulations for Examples 141 through 144

| Material | Ex. 141 | Ex. 142 | Ex. 143 | Ex. 144 |
| --- | --- | --- | --- | --- |
| TMPTA | 8.44 | 8.44 | 8.44 | 8.44 |
| HDDA | 25.31 | 25.31 | 25.31 | 25.31 |
| PP | 41.25 | 41.25 | 41.25 | 41.25 |
| DA3 | 1.0 | 2.0 | 3.18 | 4.0 |
| PH7 | 2.40 | 2.40 | 2.40 | 2.40 |
| CE01 | 123.75 | 123.75 | 123.75 | 123.75 |
| CAC03 | 60.42 | 60.42 | 60.42 | 60.42 |
| CAC02 | 5.56 | 5.56 | 5.56 | 5.56 |
| CAC04 | 1.39 | 1.39 | 1.39 | 1.39 |

The abrasive articles for Examples 141 through 144 were made according to General Procedure V for Making the Abrasive Article using Pattern #1. The resulting abrasive articles were tested according to Test Procedures XIX except that the pH was 10.5. The test results can be found in Table 70. The cut rates are listed in Angstroms/minute.

TABLE 70

| Example | Test Procedure XIX |
| --- | --- |
| 141 | 1746 |
| 142 | 1168 |
| 143 | 646 |
| 144 | 984 |

The above data indicated that the abrasive article generated different cut rates depending upon the formulation of the abrasive slurry.

EXAMPLE 145

This example demonstrated the effect of different retaining ring materials on the amount of silicon dioxide removed by the abrasive article. An abrasive slurry was prepared by mixing, with an air stirrer, 320.63 parts TMPTA, 961.88 parts HDDA, 1567.50 parts PP, 188.10 parts CA3 and 91.20 parts PH1. Next, 4702.50 parts of CEO1 were gradually added to the abrasive slurry until it was substantially dispersed into the abrasive slurry. Following this, 2296 parts of CACO3, 211 parts of CACO2 and 52.8 parts of CACO4 were also gradually mixed until the abrasive slurry until these particles were substantially dispersed into the abrasive slurry. The abrasive article for Example 145 was made according to General Procedure II for Making the Abrasive Article Using Pattern #1, except the ultraviolet light radiation was transmitted through the film backing.

The retaining ring was an annular ring, 10.2 cm (4 inch) inner diameter, 12.7 cm (5 inch) outer diameter, 0.95 cm (0.375 inch) thick, and was fabricated from various phenolic composite materials, as described below.

The material for the retaining rings was commercially available from Minnesota Plastics of Eden Prairie, Minn.

The abrasive article was tested according to Test Procedure XIV, substituting the different retaining rings for the Rodel retaining ring. The gauge or line pressure for the LE test holder was about 280 Pa (40 psi). The test results are in Table 71.

Retaining ring XXX was made from a paper/phenolic composite.

Retaining ring LE was made from a cotton cloth/phenolic composite.

Retaining ring NI was made from a nylon cloth/phenolic composite.

TABLE 71

Test Procedure I; Different Retaining Rings

| Test Holder | Cut Rate (Angstroms/minute) |
|---|---|
| XXX | 390 |
| LE | 380 |
| N1 | 1410 |

The data indicates that the abrasive article generated different cut rates depending upon the material used to make the retaining ring.

EXAMPLE 146

The abrasive article for this example contained polymeric filler particles.

The abrasive slurry was prepared by mixing together, with an air stirrer, 6.57 parts TMPTA, 19.75 parts HDDA, 48.77 parts PP, 2.50 parts DA1 and 26.0 parts PH7. Next, 123.8 parts of CEO1 were gradually added to the abrasive slurry until it was substantially dispersed into the abrasive slurry. Following this, 26.0 parts of PLFP were also gradually mixed into the abrasive slurry until these particles were substantially dispersed into the abrasive slurry. The abrasive article for Example 146 was made according to General Procedure V for Making the Abrasive Article Using Pattern #1 except that the abrasive article was exposed to only one pass under the ultraviolet lamp at 7.6 meters/minute (25 feet/minute) with a quartz plate over the abrasive article.

The resulting abrasive article was tested according to Test Procedure XIX and had an average cut rate of 1170 Angstroms/minute.

EXAMPLE 147

This example illustrates the use of hexagonal boron nitride in the abrasive slurry. The abrasive slurry was prepared by mixing, with an air stirrer, 18.75 g TMPTA, 56.45 g HDDA, 4.0 g. KD2, and 2.4 g PH1. Next, 173.45 g CEO1 was gradually added to the abrasive slurry until it was substantially dispersed. Following this, 79.04 g of hexagonal boron nitride (Grade A-01, particle size 3–5 micrometers, commercially available from H. C. Starck Inc. of Newton, Mass.), was gradually mixed in until substantially dispersed. The slurry was used to make an abrasive article as described in General Procedure I for Making the Abrasive Article using Pattern #1.

The abrasive article was tested according to Test Procedure XII. The average cut rate (average of 10 measurements) was 594 Angstroms/minute.

What is claimed is:

1. A method of modifying a processed semiconductor wafer containing topographical features comprising the steps of:

(a) contacting an exposed surface of the processed semiconductor wafer with a three-dimensional, textured, fixed abrasive article comprising a plurality of abrasive particles and a binder arranged in the form of a pattern; and (b) relatively moving said wafer and said fixed abrasive article in the presence of a liquid medium to chemically and mechanically modify said surface of said wafer.

2. A method according to claim 1 comprising contacting said surface with said fixed abrasive article at a pressure no greater than about 10 psi.

3. A method according to claim 1 comprising contacting said surface with said fixed abrasive article in the presence of a liquid.

4. A method according to claim 3 comprising contacting said surface with said fixed abrasive article in the presence of a liquid having a pH of at least about 5.

5. A method according to claim 3 comprising contacting said surface with said fixed abrasive article in the presence of a liquid having a pH of about 5 to about 8.

6. A method according to claim 3 comprising contacting said surface with said fixed abrasive article in the presence of a liquid having a pH of about 8 to about 13.

7. A method according to claim 3 wherein said liquid comprises water.

8. A method according to claim 1 wherein said exposed surface comprises a metal oxide.

9. A method according to claim 1 wherein said exposed surface comprises silicon dioxide.

10. A method according to claim 1 wherein the processed semiconductor wafer is a blanket wafer.

11. A method according to claim 1 comprising relatively moving said wafer and said fixed abrasive article to modify said surface of said wafer to create a surface having an Ra value of no greater than about 20 Angstroms.

12. A method according to claim 1 comprising relatively moving said wafer and said fixed abrasive article to modify said surface of said wafer to create a surface having an Ra value of no greater than about 15 Angstroms.

13. A method according to claim 1 comprising relatively moving said wafer and said fixed abrasive article to modify said surface of said wafer to create a surface having an Ra value of no greater than about 10 Angstroms.

14. A method according to claim 1 comprising relatively moving said wafer and said fixed abrasive article to achieve an average cut rate of at least about 500 Angstroms/minute to modify said surface of said wafer.

15. A method according to claim 1 comprising relatively moving said wafer and said fixed abrasive article to achieve an average cut rate of at least about 1,000 Angstroms/minute to modify said surface of said wafer.

16. A method according to claim 1 comprising relatively moving said wafer and said fixed abrasive article to achieve an average cut rate of at least about 1,500 Angstroms/minute to modify said surface of said wafer.

17. A method according to claim 1 comprising relatively moving said wafer and said fixed abrasive article to achieve an average cut rate of at least about 2,000 Angstroms/minute to modify said surface of said wafer.

18. A method according to claim 1 wherein said fixed abrasive article comprises a backing having a surface comprising said abrasive particles and said binder in the form of an abrasive coating.

19. A method according to claim 18 wherein said backing comprises a polymer film.

20. A method according to claim 18 wherein said backing further comprises a primer for enhancing adhesion between said abrasive coating and said backing.

21. A method according to claim 1 wherein said abrasive particles have an average particle size no greater than about 5 micrometers.

22. A method according to claim 1 wherein said abrasive particles have an average particle size no greater than about 1 micrometer.

23. A method according to claim 1 wherein said abrasive particles have an average particle size no greater than about 0.5 micrometer.

24. A method according to claim 1 wherein said abrasive particles have a Mohs hardness value no greater than about 8.

25. A method according to claim 1 wherein said abrasive particles comprise metal oxide particles.

26. A method according to claim 25 wherein said metal oxide particles comprise ceria.

27. A method according to claim 1 wherein said abrasive particles consist essentially of ceria particles.

28. A method according to claim 1 wherein said abrasive article further comprises filler particles.

29. A method according to claim 28 wherein said filler particles are selected from the group consisting of carbonates, silicates, and combinations thereof.

30. A method according to claim 28 wherein said filler particles are selected from the group consisting of magnesium silicates, aluminum silicates, calcium silicates, and combinations thereof.

31. A method according to claim 28 wherein said filler particles comprise calcium carbonate particles.

32. A method according to claim 28 wherein said filler particles comprise plastic filler particles.

33. A method according to claim 1 wherein said binder comprises a thermoset organic polymer resin.

34. A method according to claim 1 wherein said binder comprises an acrylate or methacrylate polymer resin.

35. A method according to claim 1 wherein said binder comprises a ceramer binder comprising colloidal metal oxide particles in an organic polymer resin.

36. A method according to claim 1 wherein said binder further comprises a plasticizer in an amount sufficient to increase the erodibility of said abrasive article relative to the same abrasive article in the absence of said plasticizer.

37. A method according to claim 36 wherein said binder comprises at least about 25% by weight of said plasticizer based upon the weight of plasticizer plus resin.

38. A method according to claim 36 wherein said binder comprises said plasticizer in an amount ranging from about 40% by weight to about 75% by weight based upon the weight of plasticizer plus resin.

39. A method according to claim 36 wherein said plasticizer comprises a phthalate ester or derivative thereof.

40. A method according to claim 1 wherein said fixed abrasive article is erodible.

41. A method according to claim 1 wherein said fixed abrasive article comprises a plurality of abrasive composites and a binder in the form of a predetermined pattern.

42. A method according to claim 41 wherein said abrasive composites comprise precisely shaped abrasive composites.

43. A method according to claim 41 wherein substantially all of said abrasive composites have substantially the same shape.

44. A method according to claim 41 wherein said abrasive composites have a shape selected from the group consisting of cubic, cylindrical, prismatic, rectangular, pyramidal, truncated pyramidal, conical, truncated conical, cross, post-like with a flat top surface, hemispherical, and combinations thereof.

45. A method according to claim 41 wherein said abrasive composites are in the form of truncated pyramids.

46. A method according to claim 41 wherein said abrasive composites are spaced apart from each other.

47. A method according to claim 41 wherein substantially all of said composites have substantially the same shape.

48. A method according to claim 41 wherein said abrasive composites have a height no greater than about 250 micrometers.

49. A method according to claim 41 wherein said abrasive surface comprises at least about 1,200 abrasive composites per square centimeter.

50. A method according to claim 41 wherein fixed abrasive article comprises a backing having a surface comprising said abrasive composites in the form of a coating, each of said abrasive composites having substantially the same orientation relative to said backing.

51. A method according to claim 1 wherein said abrasive article is secured to a sub pad.

52. A method of modifying an exposed surface of a semiconductor wafer comprising the steps of:
   (a) contacting said surface with a three-dimensional, textured, fixed abrasive article comprising a plurality of precisely shaped abrasive composites and a binder; and
   (b) relatively moving said wafer and said fixed abrasive article to modify said surface of said wafer.

53. A method of modifying an exposed surface of a semiconductor wafer comprising the steps of:
   (a) contacting said surface with a three-dimensional, textured, fixed abrasive article comprising a plurality of abrasive particles and a binder comprising a resin and a plasticizer in an amount sufficient to increase the erodibility of said abrasive article relative to the same abrasive article in the absence of said plasticizer; and
   (b) relatively moving said wafer and said fixed abrasive article to modify said surface of said wafer.

54. A method according to claim 52 comprising at least 25% by weight of said plasticizer based upon the combined weight of said plasticizer and said resin.

55. A method according to claim 52 comprising between about 40% and about 75% by weight of said plasticizer based upon the combined weight of said plasticizer and said resin.

56. A method of modifying an exposed surface of a semiconductor wafer comprising a metal oxide, said method comprising the steps of:
   (a) contacting said surface with a three-dimensional, textured, erodible, fixed abrasive article comprising a plurality of abrasive particles and a binder arranged in the form of a pre-determined pattern; and
   (b) relatively moving said wafer and said fixed abrasive article to modify said surface of said wafer.

57. A method according to claim 56 wherein said metal oxide comprises silicon dioxide.

58. A method according to claim 1 further comprising conditioning the three-dimensional, textured, fixed abrasive article either before, after or simultaneously with step (b).

59. A method according to claim 1 wherein the three-dimensional, textured, fixed abrasive article comprises abrasive composites.

60. A method according to claim 1 wherein the three-dimensional, textured, fixed abrasive article comprises precisely shaped abrasive composites.

* * * * *

UNITED STATES PATENT AND TRADEMARK OFFICE
CERTIFICATE OF CORRECTION

PATENT NO. : 5,958,794
DATED : September 28, 1999
INVENTOR(S) : Wesley J. Bruxvoort, Scott R. Culler, Kwok-Lun Ho, David A. Kaisaki, Carl R. Kessel, Thomas P. Klun, Heather K. Kranz, Robert P. Messner, Richard J. Webb, Julia P. Williams It is certified that error appears in the above-identified patent and that said Letters Patent is hereby corrected as shown below:

Column 16,
Line 27, after "about", add -- 25 --;

Column 19,
Line 26, "mono crystalline" should read -- monocrystalline --;
Line 27, "polycrystal line" should read -- polycrystalline --;

Column 25,
Line 58, "50071" should read -- 5007 --;

Column 26,
Line 1, "08/474,289" should read -- 08/174,289 --;

Column 45,
Line 47, "BC" should read -- EC --;

Column 47,
Line 13, "DB" should read -- DE --;
Lines 44 and 49, "Maffhey" should read -- Matthey --;

UNITED STATES PATENT AND TRADEMARK OFFICE
CERTIFICATE OF CORRECTION

PATENT NO.    : 5,958,794
DATED         : September 28, 1999
INVENTOR(S)   : Wesley J. Bruxvoort, Scott R. Culler, Kwok-Lun Ho, David A. Kaisaki, Carl R. Kessel, Thomas P. Klun, Heather K. Kranz, Rober P. Messner, Richard J. Webb, Julia P. Williams It is certified that error appears in the above-identified patent and that said Letters Patent is hereby corrected as shown below:

Column 58,
Line 29, "CBO" should read -- CEO -- ;

Column 68,
Line 41, "CBO" should read -- CEO --; and

Column 87,
Line 16, "NI" should read -- NI --.

Signed and Sealed this

Twenty-seventh Day of November, 2001

*Attest:*

*Attesting Officer*

NICHOLAS P. GODICI
*Acting Director of the United States Patent and Trademark Office*